United States Patent
Lysejko et al.

(10) Patent No.: US 9,973,943 B2
(45) Date of Patent: May 15, 2018

(54) WIRELESS NETWORK CONFIGURATION USING PATH LOSS DETERMINATION BETWEEN NODES

(71) Applicant: Airspan Networks Inc., Boca Raton, FL (US)

(72) Inventors: Martin Lysejko, Bagshot (GB); Andrew Logothetis, High Wycombe (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 39 days.

(21) Appl. No.: 15/187,616

(22) Filed: Jun. 20, 2016

(65) Prior Publication Data

US 2016/0381591 A1    Dec. 29, 2016

(30) Foreign Application Priority Data

Jun. 25, 2015   (GB) .................................. 1511200.6
Oct. 30, 2015   (GB) .................................. 1519273.5

(51) Int. Cl.
*H04W 24/02*    (2009.01)
*G01S 19/53*    (2010.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC .................................................. H04W 24/02
See application file for complete search history.

(56) References Cited

U.S. PATENT DOCUMENTS 4,599,620 A    7/1986   Evans
4,633,256 A   12/1986   Chadwick
(Continued)

FOREIGN PATENT DOCUMENTS

CN       1284794 A    2/2001
CN     104635203 A    5/2015
(Continued)

OTHER PUBLICATIONS

Office Action in related U.S. Appl. No. 15/187,680 dated Nov. 3, 2017, 8 pages.
(Continued)

*Primary Examiner* — Gerald A Smarth
(74) *Attorney, Agent, or Firm* — Haynes Beffel & Wolfeld LLP

(57) ABSTRACT

A method and corresponding apparatus are provided for network configuration selection in a wireless network comprising a plurality of nodes. A subset of the nodes are configured to simultaneously participate in a sounding process, in which a node of the subset omni-directionally transmits a predetermined signal and in which other nodes of the subset of nodes sample the predetermined signal as received by an omni-directional antenna array of that node. Measurement reports are received from the subset of nodes, each measurement report comprising a signal source angle and a received signal strength. A path loss is determined in dependence on each measurement report to generate a set of path losses covering a plurality of transmitter node receiver node pairs. Then a directional configuration is selected for a directional antenna of each node of the subset of nodes for data transmission in dependence on the set of path losses.

13 Claims, 39 Drawing Sheets

(51) Int. Cl.
| | |
|---|---|
| G01S 3/14 | (2006.01) |
| G01S 5/02 | (2010.01) |
| H01Q 1/02 | (2006.01) |
| H01Q 3/04 | (2006.01) |
| H01Q 3/24 | (2006.01) |
| H01Q 3/26 | (2006.01) |
| H01Q 21/06 | (2006.01) |
| H01Q 21/08 | (2006.01) |
| H01Q 21/20 | (2006.01) |
| H01Q 21/28 | (2006.01) |
| H01Q 25/00 | (2006.01) |
| H04B 7/06 | (2006.01) |
| H04B 7/08 | (2006.01) |
| H04W 28/02 | (2009.01) |
| H04W 88/04 | (2009.01) |
| H05K 7/20 | (2006.01) |
| H04L 12/24 | (2006.01) |
| H04L 29/08 | (2006.01) |
| H04W 4/00 | (2018.01) |
| H04W 16/28 | (2009.01) |
| H04W 40/22 | (2009.01) |
| H04W 72/08 | (2009.01) |
| H04W 24/10 | (2009.01) |
| H01Q 1/24 | (2006.01) |
| H01Q 1/50 | (2006.01) |
| H01Q 3/10 | (2006.01) |
| H04W 72/04 | (2009.01) |
| G01S 3/04 | (2006.01) |
| G01S 19/24 | (2010.01) |
| H01Q 1/36 | (2006.01) |
| H01Q 1/42 | (2006.01) |
| H01Q 3/12 | (2006.01) |
| H01Q 21/00 | (2006.01) |
| H01Q 1/12 | (2006.01) |
| H01Q 3/02 | (2006.01) |
| H01Q 3/36 | (2006.01) |
| H01Q 21/24 | (2006.01) |
| H04B 7/0456 | (2017.01) |
| F16M 11/06 | (2006.01) |
| H04L 12/26 | (2006.01) |
| H04W 24/08 | (2009.01) |
| H04W 28/24 | (2009.01) |
| H04W 48/06 | (2009.01) |
| H04W 84/04 | (2009.01) |
| H04W 84/02 | (2009.01) |
| H04W 88/08 | (2009.01) |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/001* (2013.01); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H04B 7/0817* (2013.01); *H04W 84/02* (2013.01); *H04W 84/045* (2013.01); *H04W 88/08* (2013.01)

(56) References Cited

U.S. PATENT DOCUMENTS

| | | | |
|---|---|---|---|
| 4,959,653 | A | 9/1990 | Ganz |
| 5,125,008 | A | 6/1992 | Trawick et al. |
| 6,124,832 | A | 9/2000 | Jeon et al. |
| 6,404,385 | B1 | 6/2002 | Croq et al. |
| 6,486,832 | B1 | 11/2002 | Abramov et al. |
| 6,522,898 | B1 | 2/2003 | Kohno et al. |
| 6,621,454 | B1 | 9/2003 | Reudink et al. |
| 6,934,511 | B1 | 8/2005 | Lovinggood et al. |
| 7,062,294 | B1 | 6/2006 | Rogard et al. |
| 7,403,748 | B1 | 7/2008 | Keskitalo et al. |
| 7,515,916 | B1 * | 4/2009 | Alexander ............ H04W 24/08 345/582 |
| 7,593,693 | B1 | 9/2009 | Kasapi et al. |
| 7,697,626 | B2 | 4/2010 | Wang et al. |
| 8,509,724 | B2 | 8/2013 | D'Amico et al. |
| 8,577,416 | B2 | 11/2013 | Nandagopalan et al. |
| 8,630,267 | B1 | 1/2014 | Jin |
| 9,692,124 | B2 * | 6/2017 | Caimi ..................... H01Q 3/24 |
| 9,698,891 | B2 | 7/2017 | Larsson |
| 9,706,419 | B2 | 7/2017 | Bozier et al. |
| 2002/0042274 | A1 | 4/2002 | Ades |
| 2003/0195017 | A1 | 10/2003 | Chen et al. |
| 2003/0228857 | A1 | 12/2003 | Maeki |
| 2004/0106436 | A1 | 6/2004 | Ochi et al. |
| 2004/0233103 | A1 | 11/2004 | Toshev |
| 2004/0242274 | A1 | 12/2004 | Corbett et al. |
| 2005/0048921 | A1 | 3/2005 | Chung |
| 2005/0063340 | A1 | 3/2005 | Hoffmann et al. |
| 2005/0157684 | A1 | 7/2005 | Ylitalo et al. |
| 2005/0285784 | A1 | 12/2005 | Chiang et al. |
| 2006/0292991 | A1 | 12/2006 | Abramov et al. |
| 2008/0005121 | A1 | 1/2008 | Lam et al. |
| 2009/0005121 | A1 | 1/2009 | Wong et al. |
| 2009/0046638 | A1 | 2/2009 | Rappaport et al. |
| 2009/0207077 | A1 | 8/2009 | Hwang et al. |
| 2010/0071049 | A1 | 3/2010 | Bahr et al. |
| 2010/0130150 | A1 | 5/2010 | D'Amico et al. |
| 2011/0003554 | A1 | 1/2011 | Sekiya |
| 2011/0163905 | A1 * | 7/2011 | Denis ..................... G01S 7/412 342/21 |
| 2011/0235569 | A1 | 9/2011 | Huang et al. |
| 2011/0244808 | A1 | 10/2011 | Shiotsuki et al. |
| 2011/0312269 | A1 | 12/2011 | Judd et al. |
| 2012/0119951 | A1 | 5/2012 | Vollath |
| 2012/0329511 | A1 | 12/2012 | Keisu |
| 2013/0203401 | A1 | 8/2013 | Ryan et al. |
| 2013/0215844 | A1 | 8/2013 | Seal et al. |
| 2014/0256376 | A1 | 9/2014 | Weissman et al. |
| 2014/0313080 | A1 | 10/2014 | Smith et al. |
| 2015/0078191 | A1 | 3/2015 | Jongren et al. |
| 2016/0037550 | A1 * | 2/2016 | Barabell ............ H04B 17/318 455/450 |
| 2016/0255667 | A1 | 9/2016 | Schwartz |

(56) References Cited

U.S. PATENT DOCUMENTS

| | | | |
|---|---|---|---|
| 2016/0277087 | A1 | 9/2016 | Jo et al. |
| 2016/0377695 | A1 | 12/2016 | Lysejko et al. |
| 2016/0380353 | A1 | 12/2016 | Lysejko et al. |
| 2016/0380354 | A1 | 12/2016 | Bozier et al. |
| 2016/0380355 | A1 | 12/2016 | Lysejko et al. |
| 2016/0380363 | A1 | 12/2016 | Logothetis |
| 2016/0381570 | A1 | 12/2016 | Lysejko et al. |
| 2016/0381574 | A1 | 12/2016 | Dudzinski et al. |
| 2016/0381585 | A1 | 12/2016 | Dudzinski et al. |
| 2016/0381590 | A1 | 12/2016 | Lysejko et al. |

FOREIGN PATENT DOCUMENTS

| | | | |
|---|---|---|---|
| EP | 0654915 | A2 | 5/1995 |
| EP | 1903348 | A1 | 3/2008 |
| EP | 2113145 | A1 | 11/2009 |
| EP | 2207267 | A2 | 7/2010 |
| EP | 2391157 | A2 | 11/2011 |
| EP | 2448144 | A1 | 5/2012 |
| EP | 2506625 | A1 | 10/2012 |
| EP | 2538712 | A1 | 12/2012 |
| GB | 2318914 | A | 5/1998 |
| GB | 2484377 | A | 4/2012 |
| JP | H05188128 | A | 7/1993 |
| JP | H06188802 | A | 7/1994 |
| KR | 101346062 | B1 | 12/2013 |
| WO | 9426001 | A1 | 11/1994 |
| WO | 199965105 | A1 | 12/1999 |
| WO | 0152447 | A2 | 7/2001 |
| WO | 0231908 | A2 | 4/2002 |
| WO | 03096560 | A1 | 11/2003 |
| WO | 2004095764 | A2 | 11/2004 |
| WO | 2004114546 | A1 | 12/2004 |
| WO | 2005064967 | A1 | 7/2005 |
| WO | 2007010274 | A1 | 1/2007 |
| WO | 2007069809 | A1 | 6/2007 |
| WO | 2008/064696 | A1 | 6/2008 |
| WO | 2008111882 | A1 | 9/2008 |
| WO | 2008151057 | A2 | 12/2008 |
| WO | 2010077790 | A1 | 7/2010 |
| WO | 2011044947 | A1 | 4/2011 |
| WO | 2011060058 | A1 | 5/2011 |
| WO | 2014106539 | A1 | 7/2014 |

OTHER PUBLICATIONS

PCT Search Report from PCT/GB2016/051195, dated Jul. 25, 2016, 13 pgs.
PCT Search Report from PCT/GB2016/051205, dated Jul. 25, 2016, 13 pgs.
UK Search Report from GB 1514938.8, dated Apr. 18, 2016, 4 pgs.
UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.
UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.
PCT Search Report from PCT/GB2016/051428 (corresponding to U.S. Appl. No. 15/187,188), dated Dec. 13, 2016, 19 pgs.
Office Action in related U.S. Appl. No. 15/186,134 dated Nov. 22, 2016, 18 pages.
U.S. Notice of Allowance from U.S. Appl. No. 15/186,134 dated Mar. 14, 2017, 8 pages.
U.S. Office Action in U.S. Appl. No. 15/182,209 dated Apr. 13, 2017, 17 pages.
PCT Search Report from PCT/GB2016/051285, dated Jul. 13, 2016, 12 pgs.
UK Search Report from GB 1519237.0, dated JUN. APR. 10, 2016, 3 pgs.
Doi et al., "Low-Cost Antenna Array Via Antenna Switching for High Resolution 2-D DOA Estimation," SIPS 2013 Proc. IEEE, Oct. 16, 2013, pp. 83-88.
Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), dated Aug. 5, 2016, 13 pgs.
PCT Search Report from PCT/GB2016/051360 (corresponding to U.S. Appl. No. 15/187,900), dated Aug. 19, 2016, 12 pgs.
PCT Search Report from PCT/GB2016/051615 (corresponding to U.S. Appl. No. 15/187,515), dated Aug. 12, 2016, 13 pgs.
PCT Search Report from PCT/GB2016/051617 (corresponding to U.S. Appl. No. 15/187,616), dated Aug. 23, 2016, 11 pgs.
PCT Search Report from PCT/GB2016/051618 (corresponding to U.S. Appl. No. 15/187,602), dated Aug. 12, 2016, 12 pgs.
PCT Search Report from PCT/GB2016/051759 (corresponding to U.S. Appl. No. 15/187,680), dated Sep. 14, 2016, 15 pgs.
PCT Written Opinion from PCT/GB2016/051195, dated May 17, 2017, 5 pgs.
PCT Written Opinion from PCT/GB2016/051205, dated May 16, 2017, 5 pgs.
PCT Written Opinion from PCT/GB2016/051234, dated May 17, 2017, 10 pgs.
PCT Written Opinion from PCT/GB2016/051285, dated May 10, 2017, 5 pgs.
PCT Written Opinion from PCT/GB2016/051360, dated Jun. 1, 2017, 6 pgs.
PCT Written Opinion from PCT/GB2016/051428, dated Jun. 2, 2017, 12 pgs.
PCT Written Opinion from PCT/GB2016/051615, dated May 17, 2017, 5 pgs.
PCT Written Opinion from PCT/GB2016/051759, dated May 18, 2017, 6 pgs.
Office Action in related U.S. Appl. No. 15/187,515 dated Dec. 7, 2017, 9 pages.
U.S. Notice of Allowance from U.S. Appl. No. 15/182,209 dated Nov. 22, 2017, 13 pages.
U.S. Notice of Allowance from U.S. Appl. No. 15/187,574 dated Dec. 15, 2017, 14 pages.

\* cited by examiner

Steps in an evolutionary algorithm

WIRELESS NETWORK CONFIGURATION USING PATH LOSS DETERMINATION BETWEEN NODES

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1519273.5, filed 30 Oct. 2015 and entitled "WIRELESS NETWORK CONFIGURATION USING PATH LOSS DETERMINATION BETWEEN NODES". Both applications are incorporated by reference herein.

TECHNICAL FIELD

The present disclosure relates to a wireless network. More particularly it relates to path losses encountered between nodes in a wireless network.

BACKGROUND

A wireless network may be provided to serve a range of different functions, but one use of a wireless network is to perform backhaul in a communications network where user equipment devices (e.g. mobile telephones) communicate with nodes of the wireless network and the wireless network then enables these nodes to communicate with other nodes of the wireless network, which then connect (typically in a wired manner) to a physical communications infrastructure and then on to a wired communications network such as the internet. There are a number of different use cases and different types of backhaul technologies available to mobile network operators, but in this context there are a number of reasons why it would be desirable to provide terminal nodes of a wireless backhaul network (also referred to herein as feeder terminals) which only communicate with user equipment within a relatively small cell. Small cell deployment can be useful to provide the enhanced quality of service demanded by the ever increasing number of mobile data consumers. Small cells have a number of advantages such as: they allow capacity hot-spots to be targeted to ease congestion, they are appropriate for deploying in a dense outdoor urban environment, for example on street furniture, they can be deployed in specific known "not-spots" where macrocell coverage is poor or within indoor not-spots which experience steady daily traffic with occasional significant peaks, such as dense urban indoor environments like stadiums, shopping malls, and so on. Further, small cells may also be appropriate for mobile deployment, such as in trains, or other moving transport.

In the wireless backhaul use case discussed above, a feeder terminal (FT), i.e. the backhaul node nearest to an access point (AP), which may for example be an eNodeB (eNB) in the context of LTE, may typically be mounted on street furniture or a building façade perhaps 3-6 meters above street level. Conversely, a feeder base (FB), i.e. the backhaul node nearest to the core network, utilises the same infrastructure as the access macro network.

In view of the above usage context, it is inevitable that some degree of outage will occur when the backhaul connectivity is unavailable. Outage may for example occur when there is equipment failure, or a persistent or temporary physical obstruction such as heavy rain or vehicles in the line of sight of the backhaul link. Although the use of small cells may enable the target availability of the connectivity to be relaxed, it would advantageous if the nodes of the wireless network were able to reconfigure themselves to provide different communications paths when such outage does occur. Moreover, given the greater number of FTs which need to be deployed when smaller cells are used, in order to facilitate fast, large scale deployment with little engineering required at a new installation site, the ability for the nodes (both FTs and FBs) to self-organise and self-configure is very desirable.

In the context of wireless networks, a further consideration which may need to be allowed for is the carrier frequency in which the wireless network operates, both in terms of the corresponding propagation which the carrier frequency allows, but also in terms of the regulatory licencing regimes which apply to a given carrier frequency. Whilst it would be advantageous to provide a wireless network which operates in a license-exempt frequency band, due to its free availability, the lack of official regulation in such an unlicensed band means that the wireless network must be able to cope with co-channel and adjacent channel interference from unsolicited and uncoordinated wireless sources and furthermore despite any initial well planned deployment, if the wireless network is to be durable (in time) it must be able to adapt rapidly to static or dynamic, fixed or mobile radio traffic from other sources. One possible approach to the provision of a wireless backhaul network in such an environment would be the use of a contention-based protocol such as IEEE802.11 (WiFi), but then care must be exercised to ensure that the access does not interfere with the backhaul by separating the two air interfaces into separate bands, yet nonetheless other mobile devices or operators may still use the same spectrum causing significant interference. Although the widespread availability of WiFi may represent a cheaper approach, WiFi cannot quickly address rapid spatial and temporal interference pattern variations, making it in practice less suitable for the stringent requirements of real time backhaul services. Moreover the use of WiFi can be expected to require careful engineering and to be used in narrow point-to-point modes, which limits its deployment possibilities.

SUMMARY

In example embodiments a method is provided of network configuration selection in a wireless network comprising a plurality of nodes, the method comprising the steps of: configuring a subset of nodes of the plurality of nodes to simultaneously participate in a sounding process, in which a node of the subset omni-directionally transmits a predetermined signal and in which other nodes of the subset of nodes sample the predetermined signal as received by an antenna array of that node; receiving measurement reports from the subset of nodes, wherein each measurement report comprises a signal source angle and a received signal strength; determining a path loss in dependence on each measurement report to generate a set of path losses covering a plurality of transmitter node receiver node pairs; and selecting a directional configuration for a directional antenna of each node of the subset of nodes to use in data transmission in dependence on the set of path losses.

The present techniques recognise that the performance of a wireless network can strongly depend on the particular configuration adopted for the network in terms of the transmitter node receiver node pairs which are used for communicating data through the network. Moreover, it is recognised that even when the nodes of the network are individually well known, for example in terms of their location, their beam patterns, their orientation, their transmission power, and so on, when deployed in a real and complex environment such as a busy urban situation using the above described unlicensed frequency bands, it is insufficient when seeking to select a wireless network configuration to rely on known individual characteristics of the nodes, and an improved network configuration may be achieved by assessing the ability of transmitter node receiver node pairs to communicate. In particular, the present techniques recognise that a critical parameter in such assessment is the path loss between the transmitter node and any receiver nodes. Accordingly the present techniques provide a method which enables a set of path losses to be determined for the nodes of the wireless network, such that these may be taken into account when selecting a wireless network configuration. The method begins by configuring a subset of nodes of the plurality of nodes in the wireless network to participate in a sounding process. It should be noted here that in this context the term "subset" should be understood in its mathematical sense, i.e. this could be all nodes of the wireless network, but in may also be a strict subset (i.e. less than of all nodes of network, for example only those in a given geographical area). This subset of the nodes then participates in the sounding process in order to allow the determination of this set of path losses. The sounding process is also referred to herein as an "active" sounding process, since at each step of the sounding a selected node of the subset omni-directionally transmits a predetermined signal—to be contrasted with a "passive" sounding process in which all participating nodes of the wireless network may simultaneously listen, with the aim of identifying an external interference source.

Control over the sounding process is typically maintained by a wireless network controller, which forms a centralised device within the wireless network, although other configurations are also contemplated here, such as one of the nodes of the wireless network also being responsible for the configuration of the wireless network or the function of the wireless network controller being physically distributed across several network components e.g. feeder base stations.

The other nodes of the subset of nodes sample the predetermined signal which the sounding node is (omni-directionally) transmitting, and this sampling is taken from the signal received by an antenna array of that receiving node. To support this omni-directional transmission and reception, the nodes participating in the transmission or reception of sounding signals employ an omni-directional antenna provided to support this function. The participating nodes each transmit their own measurement reports based on their own sampled signals, in particular communicating a signal source angle and a received signal strength to the recipient of the measurement report. The set of path losses is determined using this information and covers multiple transmitter node receiver node pairs. On the basis of this calculated set of path losses a configuration for the network can be selected, in which the current "in-situ" possible data throughput for each transmitter node receiver node pair (which for each possible node-node link in the network is dependent on the path loss calculated for that node-node link) is taken into account. Selection of this network configuration may for example be performed using an evolutionary algorithm. Each node (antenna) of the subset of nodes comprises a directional antenna (i.e. distinct from the omni-directional antenna used in the sounding process) and the network configuration includes a directional configuration for the directional antenna of each node of the subset, wherein the directional antenna is used for data transmission. Accordingly, antenna nodes of the network can advantageously fully determine their ability to communicate data with other antenna nodes of the network, and then on the basis of the selected direction of a selected partner node (with which the node should communicate), having regard to (own) co-channel interference, strong communication in this direction (for the transmission of data) is then enabled by appropriate directional configuration of a directional antenna.

The sounding process may be organised in a variety of ways, but in some embodiments the sounding process is a multiple step sounding process, wherein at each step of the multiple step sounding process only one node of the subset of nodes transmits the predetermined signal. Ensuring that only one node of the subset of nodes transmits the predetermined signal at a time (at a given step), supports a "clean" sounding environment, in which it can be guaranteed that when the predetermined signal as received it can only have one (known) source.

This one-at-a-time sounding arrangement is however not essential, as long as the source of a given predetermined signal can be identified in some other way, and thus in some embodiments the predetermined signal transmitted by each node of the subset of nodes is unique to that node and the subset of nodes transmit their unique predetermined signals concurrently.

The directional configuration which is applied to the antenna nodes of the network on the basis of the determined set of path losses may take a variety of forms in that the "directionality" may in principle be achieved in a number of ways. For example the directional configuration may be electronic or physical or both. In some embodiments in which the directional antenna is configured to be rotationally positioned, the directional configuration comprises a rotational position for the directional antenna. Such a directional antenna can thus be physically rotated, and the degree of physical rotation may then be determined in order to support the selected network configuration.

In some embodiments the method further comprises selecting at least one transmitter node receiver node pair to use in data transmission in dependence on the set of path losses. The transmitter node receiver node pairs used may therefore in some cases remain the same, for example with only the directional configuration of one or more antenna nodes being adjusted, but in other cases the transmitter node receiver node pairings may also be varied, if this is determined to result in an improved network configuration.

As mentioned above the directional configuration may take a variety of forms. In some embodiments the directional configuration comprises a beam pattern for the directional antenna. This beam pattern may be implemented by a number of known techniques.

In some embodiments the method further comprises calculating a predicted received signal strength at a receiver node when using a first beam pattern for the directional antenna of a transmitter node and a second beam pattern for the directional antenna of the receiver node, and selecting the directional configuration for the directional antenna of each node of the subset of nodes to use in data transmission is performed in further dependence the predicted received signal strength. Thus, typically, the directional configuration the directional antenna of each node will be selected in order to improve (where possible) the predicted received signal strength at each node, and the data throughput from the transmitter node to the receiver node is similarly improved (where possible).

The estimated path loss may be determined for all possible combinations of pairs of nodes, and thus in some embodiments generating the set of path losses generates an estimated path loss between all pairs of nodes in the subset of nodes.

In some embodiments determining the path loss is performed in dependence on a transmission power and antenna gain of the transmitting node and a reception antenna gain of the receiving node. Each path loss can thus be more accurately determined.

The particular manner in which the sounding process is arranged to occur may take a variety of forms, in particular in that the sounding process may be initiated in a number of different ways. However in some embodiments configuring the subset of nodes to simultaneously participate in the sounding process comprises defining a trigger type for initiation of the sounding process. The requirements of the wireless network may determine different trigger types which are appropriate for initiating the sounding process, but may comprise the arrival of a predetermined start time such that the nodes will coordinate to participate in the sounding process for example at an appropriate expected low data throughput time during the day.

In example embodiments an apparatus is provided for configuration selection in a wireless network comprising a plurality of nodes, the apparatus comprising: transmission circuitry to transmit a sounding configuration to a subset of nodes of the plurality of nodes to cause the subset to simultaneously participate in a sounding process, in which a node of the subset omni-directionally transmits a predetermined signal and in which other nodes of the subset of nodes sample the predetermined signal as received by an omni-directional antenna array of that node; reception circuitry to receive measurement reports from the subset of nodes, wherein each measurement report comprises a signal source angle and a received signal strength; calculation circuitry to calculate a path loss in dependence on each measurement report to generate a set of path losses covering a plurality of transmitter node receiver node pairs; and selection circuitry to select a directional configuration for a directional antenna of each node of the subset of nodes to use in data transmission in dependence on the set of path losses.

In example embodiments an apparatus is provided for configuration selection in a wireless network comprising a plurality of nodes, the apparatus comprising: means for transmitting a sounding configuration to a subset of nodes of the plurality of nodes to cause the subset to simultaneously participate in a sounding process, in which a node of the subset omni-directionally transmits a predetermined signal and in which other nodes of the subset of nodes sample the predetermined signal as received by an omni-directional antenna array of that node; means for receiving measurement reports from the subset of nodes, wherein each measurement report comprises a signal source angle and a received signal strength; means for calculating a path loss in dependence on each measurement report to generate a set of path losses covering a plurality of transmitter node receiver node pairs; and means for selecting a directional configuration for a directional antenna of each node of the subset of nodes to use in data transmission in dependence on the set of path losses.

BRIEF DESCRIPTION OF THE DRAWINGS

The present techniques will be described further, by way of example only, with reference to embodiments thereof as illustrated in the accompanying drawings, in which.

DESCRIPTION OF EMBODIMENTS

Figure 1:
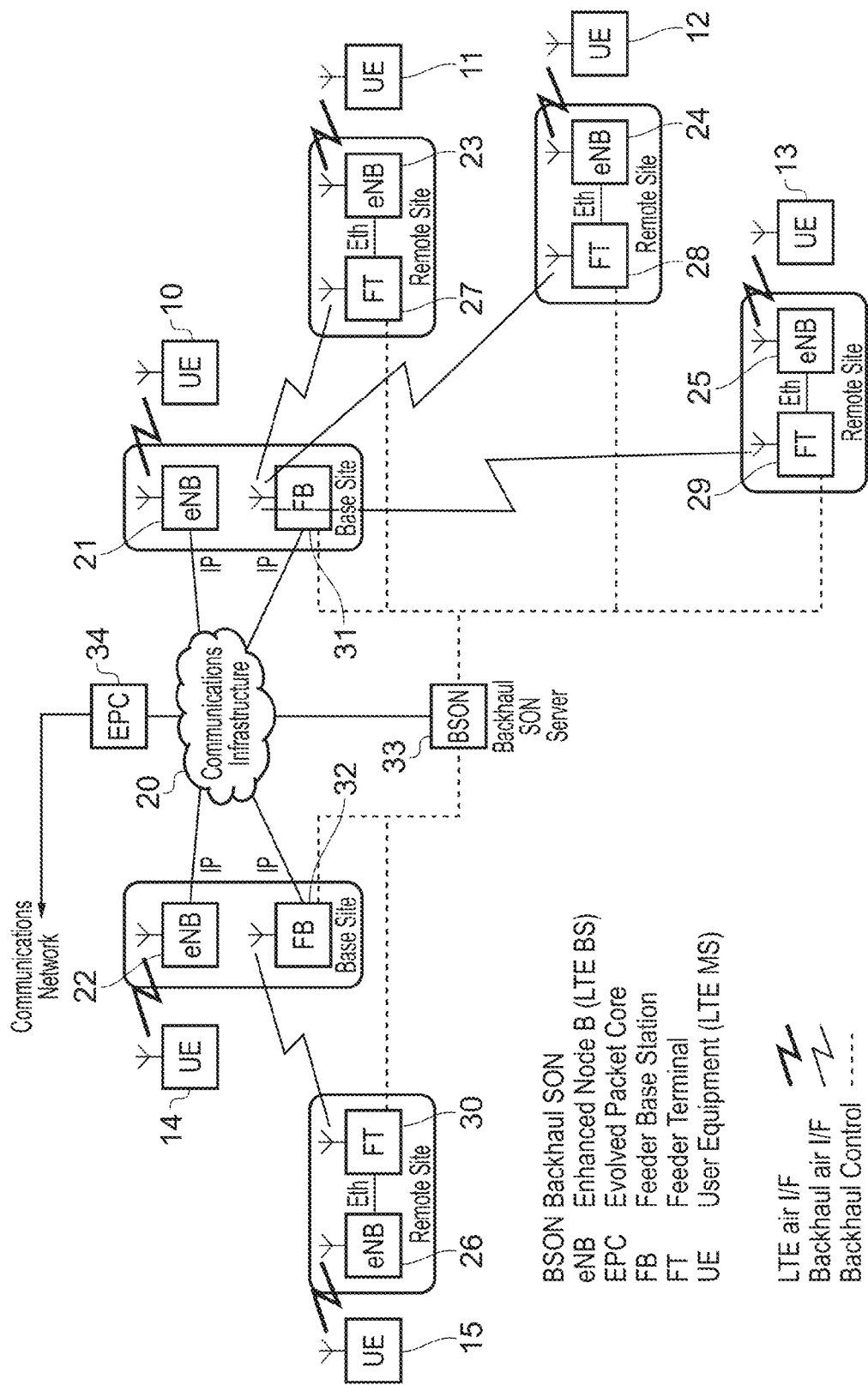
FIG. 1 schematically illustrates a communications network providing connectivity for end user equipment which employs a wireless backhaul network in which antenna apparatuses may be deployed to provide backhaul nodes.

Some particular embodiments are now described with reference to the figures. FIG. 1 schematically illustrates a multi-component network which provides connectivity for user equipment (UE) to a communications network such as the internet. The items of user equipment 10-15 of this example communicate wirelessly with LTE base stations— enhanced node B's (eNBs). Note that the LTE air interface represented in FIG. 1 is only an example and the present techniques are equally applicable to other suitable non-LTE air interfaces. Also, whilst for simplicity each access base station is shown as communicating with a single item of end user equipment, it will be appreciated that in practice such access base stations form point-to-multipoint devices enabling a plurality of items of end-user equipment to communicate with an individual access base station. These eNB access stations then either have a direct wired connection (via IP protocol) with the communications infrastructure 20 in the case of 21 and 22, or are connected to an associated feeder terminal (FT) in the case of eNBs 23-26. Each FT is in wireless communication with a feeder base (FB), shown as 31 and 32 in this figure. These FBs are then provided with a wired connection (via IP protocol) to the communications infrastructure 20. However, it should be noted that the FBs can also be coupled to the communications infrastructure via a further level of wireless backhaul network.

Also shown in FIG. 1 is a backhaul self-organising network (BSON) server (controller) 33, which is shown to be in communication via the dashed line labelled "backhaul control" with the FTs and FBs of the wireless backhaul network. It should be appreciated that this connection shown is logical and in fact will typically be provided via the wired connection to the communications infrastructure and the wired and/or wireless connection discussed above leading to these FBs and FTs. The communications infrastructure 20 is connected to a communications network (e.g. the internet) via the evolved packet core (EPC) 34. In the particular example of the wireless backhaul network shown in FIG. 1, the nodes (FBs and FTs) are intended to support the provision of relatively small cells, to be easily and rapidly deployable, to operate well in an unlicensed region frequency band, such that they must be able to cope with co-channel and adjacent channel interference from unsolicited and uncoordinated wireless sources and furthermore be adaptable when the conditions in which they are operating change.

Figure 2:
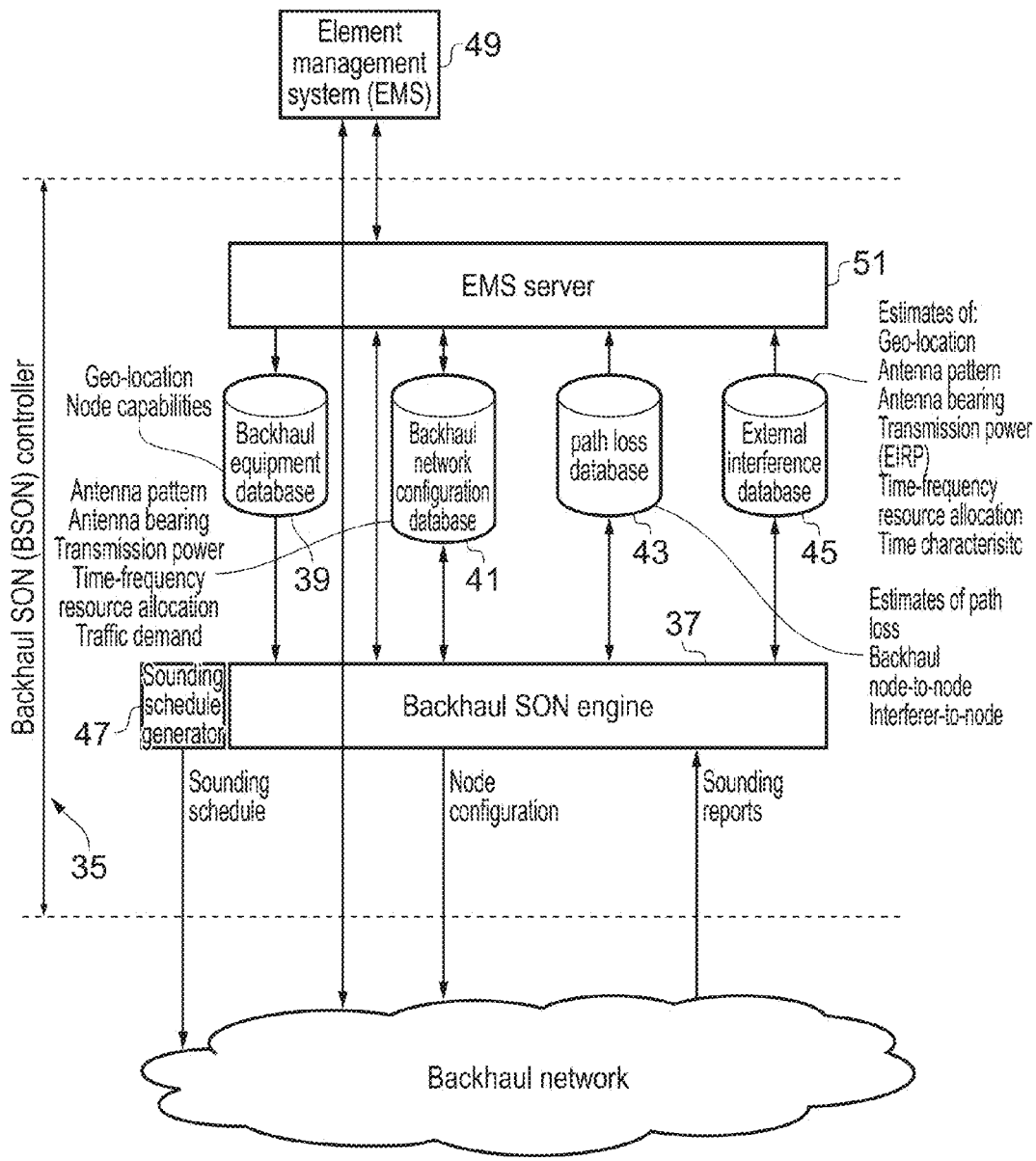
FIG. 2 schematically illustrates an apparatus for controlling a wireless network, referred to in this embodiment as a backhaul self-organising network controller.

FIG. 2 schematically illustrates a wireless network controller 35 (also referred to here as a backhaul self-organising network (BSON) controller in one embodiment). The wireless network controller 35 is shown in FIG. 2 as being communication with a "backhaul network", which in the present context will be understood to comprise at least one feeder base and a feeder terminal forming nodes of the wireless network. It will be understood however, for example with reference to FIG. 1, that the BSON controller 35 will typically be in communication with (and in control of) more feeder bases and feeder terminals than this, and references to just one node pair like this, where made, are merely to illustrate a principle. Conversely, note that in a full wireless network more than one wireless network controller may be provided, with a group of feeder bases and figure terminals, for example grouped together by geographical location, under the control of a given single wireless network controller. The wireless network controller 35 in FIG. 2 comprises circuitry which provides a backhaul SON (self-organising network) engine 37, which forms the main processing component of the wireless network controller and is where the various calculations described herein are performed. It should be noted that there is no need for the BSON engine 37 to be exclusively located within a dedicated physical device, and the data processing capability which this BSON engine 37 provides may in fact be distributed between multiple physical devices which may be somewhat remote from each other and indeed this capability could be distributed across suitable nodes of the wireless network, for example such as some or all of the feeder base stations.

The wireless network controller shown further comprises a backhaul equipment database 39, a backhaul network configuration database 41, a path loss data base 43, and an external interference database 45. The backhaul equipment database 39 is used by the wireless network controller to store information relating to the geographical location of each of the antenna apparatuses (nodes) under its control, as well as their particular individual capabilities. This information for a given antenna apparatus is populated in the database when that antenna apparatus is first deployed. The backhaul network configuration database 41 stores configuration information for the antenna apparatuses, such as antenna beam pattern information, antenna bearing information, transmission power information, time-frequency resource allocation information, and traffic demand information. The external interference database 45 is used by the BSON engine 37 to store characterisations of external interference sources which it has detected and characterised, for example in terms of geographical location, antenna beam pattern, antenna bearing, transmission power (e.g. equivalent isotropic radiated power—EIRP), time-frequency resource allocation and other time characteristics (such as an observed time pattern of an external interference source—continuous, intermittent, only between certain hours, etc.). Associated with the BSON engine 37 is the sounding schedule generation circuitry, which generates sounding schedules which are distributed to the relevant nodes of the wireless network, and may include an active sounding schedule, according to which a node transmits a known sounding signal whilst another node listen for that signal to thus determine characteristics such as the path loss between those two nodes. Node-to-node path losses can be stored in the backhaul network configuration database 41. The sounding schedules may also include a passive sounding schedule, namely one which is used to listen for external interference source(s). As described elsewhere herein, implementation of either a passive or an active sounding schedule comprises a measurement (sounding) report being transmitted from a wireless network node, which in the example of FIG. 2 is received by the backhaul SON engine 37. The result of an external interference source characterisation is stored in the external interference database 45. FIG. 2 also shows circuitry providing an element management system (EMS) 49 and EMS server circuitry 51. These are generally provided to support the management of one or more types of element of the wireless network on the network element-management layer (NEL) of the Telecommunications Management Network (TMN) model, with which one of ordinary skill in the art will be familiar and further description is not provided here. These EMS components 49 and 51 also populate top-level data into the respective databases at initialisation.

Figure 3:
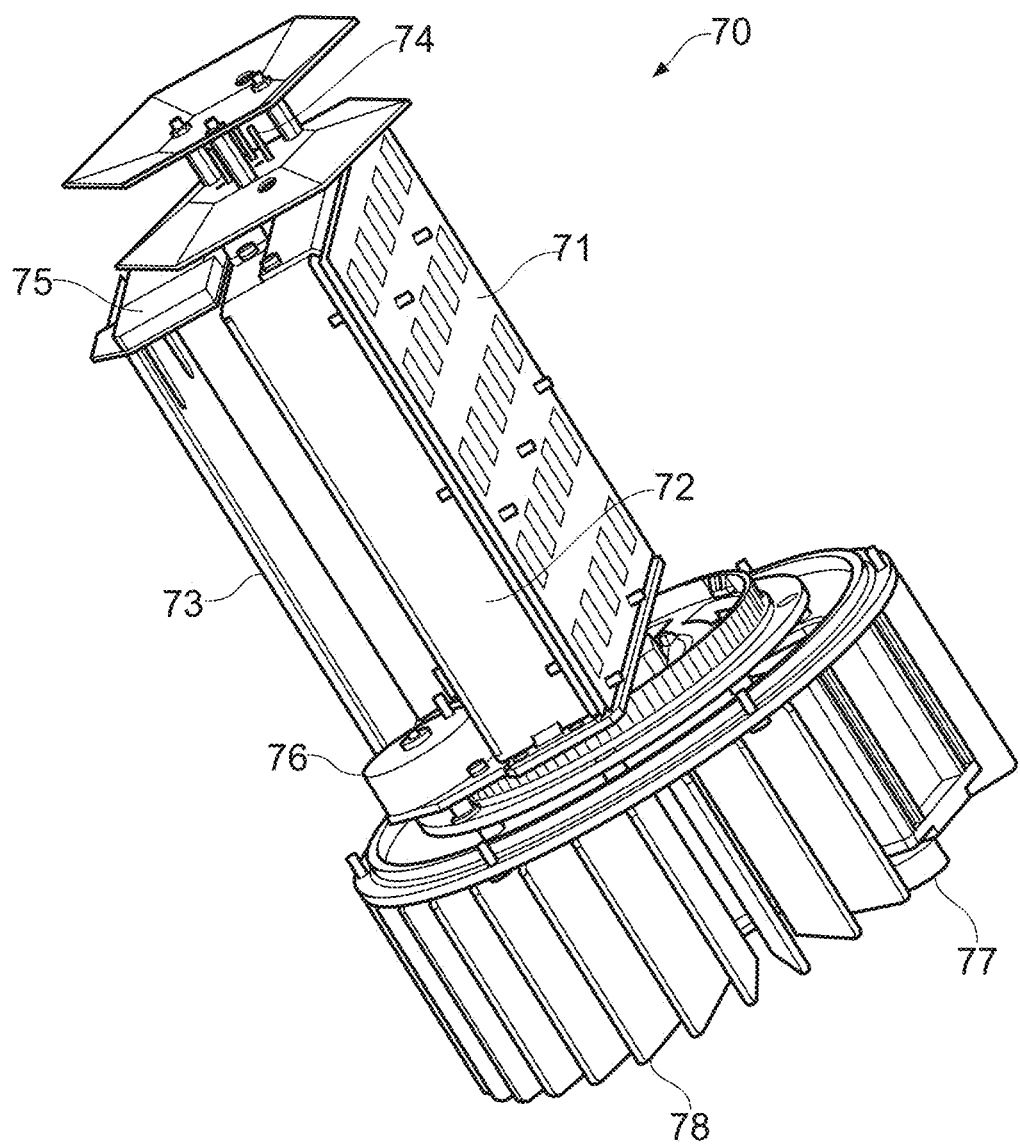
FIG. 3 schematically illustrates an antenna apparatus which is subject to configuration by a controller such as that shown in FIG. 2 in one embodiment.

The ability of the wireless network controller to adapt and improve the configuration of the wireless network is enhanced, the greater the configurability of the nodes of the wireless network. FIG. 3 schematically illustrates the components of an antenna apparatus 70 which is provided as a node of the wireless network in one example, which has a high degree of configurability. A protective radome cover of the antenna apparatus has been removed, merely to assist the description of its covered components. In this embodiment, the directional antenna 71 can be seen to comprise 25 antenna array components (darker squares) arranged in a 5×5 grid. RF and base band electronics (i.e. essentially the RF chains) and other control circuitry 72 are provided behind the main directional antenna assembly. These are not directly visible in the illustration of FIG. 3 due to the casing. The antenna 70 further comprises a rear-firing antenna 73 which is orientated in the opposite direction to the front firing main antenna 71. Although not visible in FIG. 3, the rear firing antenna 73 comprises a single column of antenna array elements forming a single antenna array component, which is physically very similar to a single column within the 5×5 array of antenna array elements of the front antenna 71. A circular (omnidirectional) antenna 74 is mounted on top of the front-firing main antenna 71 and is configured as a triple-monopole antenna which is used, as described herein, on the one hand when assessing the environment in which the antenna 70 finds itself, i.e. when detecting external interference sources, and on the other hand when participating in an active sounding schedule to support the determination, in coordination with other antennas in the network, of a full set of path losses. A further GPS antenna 75 is also provided in the antenna apparatus 70, which is used for node location, orientation and precise time synchronisation. A motorised steering mechanism 76 enables the antenna apparatus to be orientated in any direction in azimuth, and a gigabit Ethernet network interface 77 is provided to connect the antenna further. The fins 78 are for heat dissipation. Note also that the RF/base band electronics and control circuitry 72 mounted behind the front firing main antenna 71 are also connected to the circular antenna 74 and the rear firing antenna 73, as will be discussed in more detail below.

Figure 4:
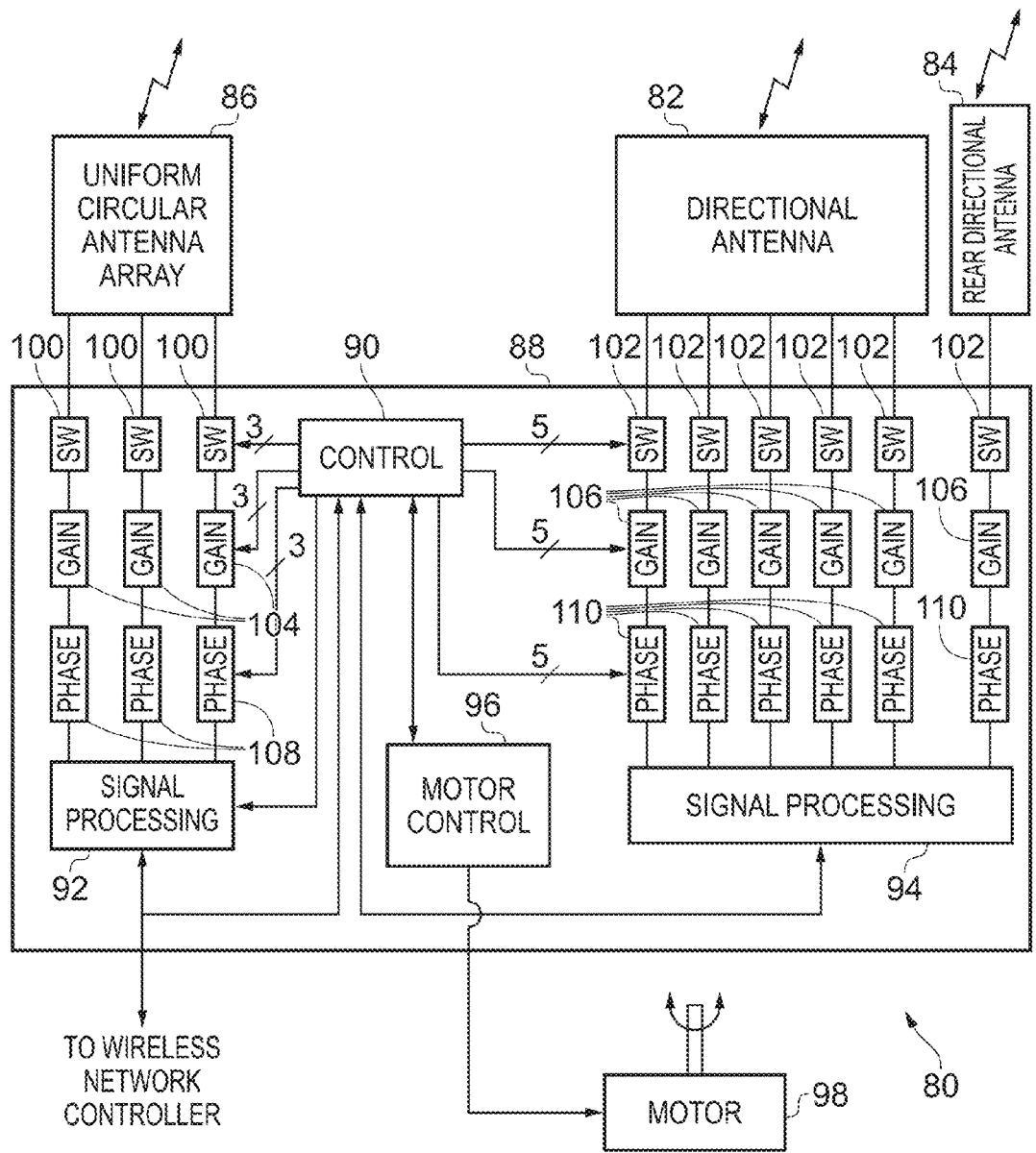
FIG. 4 schematically illustrates the control electronics of an antenna apparatus such as that shown in FIG. 3 in one embodiment.

FIG. 4 schematically illustrates some components of an antenna apparatus 80, such as the antenna apparatus 70 of FIG. 3. As illustrated in the figure the antenna apparatus 80 can be seen to comprise a directional antenna 82, a rear directional antenna 84, and a uniform circular antenna array 86. The individual antenna components of these three different types of antenna are connected to RF chains which are shown in FIG. 4 as forming part of the control circuitry 88. The control circuitry 88 comprises control device 90 which, in particular, configures the components of the RF chains, controls the operation of two signal processing devices 92 and 94, and controls the operation of the motor control device 96. The motor control device 96 controls the motor 98 which can cause the rotatable part of the antenna apparatus to be rotatably positioned with respect to a fixed non-rotatable part of the antenna apparatus by which the antenna apparatus is fixed with respect to its physical location.

Considering first the configuration of the three antennas of the antenna apparatus, the control circuitry 90 determines the settings of the set of switches 100, the gain circuitry 104, and the phase circuitry 108 in the RF chains for the uniform circular antenna array 86. Similarly the control circuitry 90 determines the settings of the set of switches 102, the gain circuitry 106, and the phase circuitry 110 in the RF chains of the directional antenna 82 and rear directional antenna 84. Although not explicitly shown in the illustration of FIG. 4, at least some of the components of the RF chains for the antennas may also be shared, for example amongst the phase circuitry 108 and 110. Phase shifters can be costly and large, and such sharing therefore enables the antenna apparatus to be provided in a cost-effective and physically compact manner.

Thus, when the antenna apparatus is either (active sounding) transmitting/listening for a known sounding signal, or (passive sounding) listening for an external interference source, by means of the uniform circular antenna array 86 and the RF chains 100, 104, 108, the signal processing circuitry 92 (comprising a transceiver) processes the signals in order to determine signal strength information and direction information for the signals received. The signal strength information and direction information determined by processing the signals can then be stored in the control device 90, for example so that this information can be gathered into a single bundled transmission—a measurement report—to a wireless network controller during an expected non-busy period for the network, such as at 3 am. However, under control of the control circuitry 90, the signal processing device 92 is also able to directly communicate this signal strength information and direction information to the wireless network controller, essentially as soon as it has been determined.

In accordance with the present techniques, the antenna apparatus is instructed to participate in either the active sounding process or the external interference sampling (passive) process, the control over this being provided by the wireless network controller, as is also described above with reference to FIG. 2 and below with reference to FIG. 6. When the antenna apparatus participates in one version of the external interference sampling process, only its uniform circular antenna array is active (in reception mode), so that the antenna apparatus can gather information relating to other sources of wireless signals in its environment. Similarly, when the antenna apparatus participates in one version of the active sounding process, only its uniform circular antenna array is active (in transmission/reception mode as appropriate), to allow an omni-directional transmission and reception of the sounding signal.

Once the wireless network controller has determined a set of path losses or characterised the external interference source, and has determined that some adaptation of the configuration of at least one antenna apparatus would improve the performance of the wireless network, a new configuration is transmitted to the control circuitry 90. This new configuration can adapt any configurable aspect of the antenna apparatus 80, for example an azimuthal position for the antenna apparatus, which is then implemented by the motor control circuitry 96 controlling the motor 98. Moreover, as well as the azimuthal position determined for the antenna apparatus, a beam pattern configuration for use during data communication for the antenna apparatus can also be determined and the control circuitry 90 can then configure any of the directional antenna 82, the rear directional antenna 84 and the uniform circular antenna array 86 in order to implement that beam pattern configuration, by appropriate setting of the switches 100, 102, the gain circuitry 104, 106 and the phase circuitry 108, 110. At least some of the switches 100, 102, the gain circuitry 104, 106 and the phase circuitry 108, 110 may be shared between the antenna (front, rear and circular) components, enabling a reduced size of RF electronics and cost thereof, in particular when phase shifting circuitry is shared, such that not only is an antenna apparatus which is cheaper is provided, but also one in which the readout electronics can be easily comprised within the portion of the antenna which rotates, and thus in close proximity to the antenna array components, thus improving signal fidelity, yet also allowing the rotation of the directional antennas.

Figure 5:
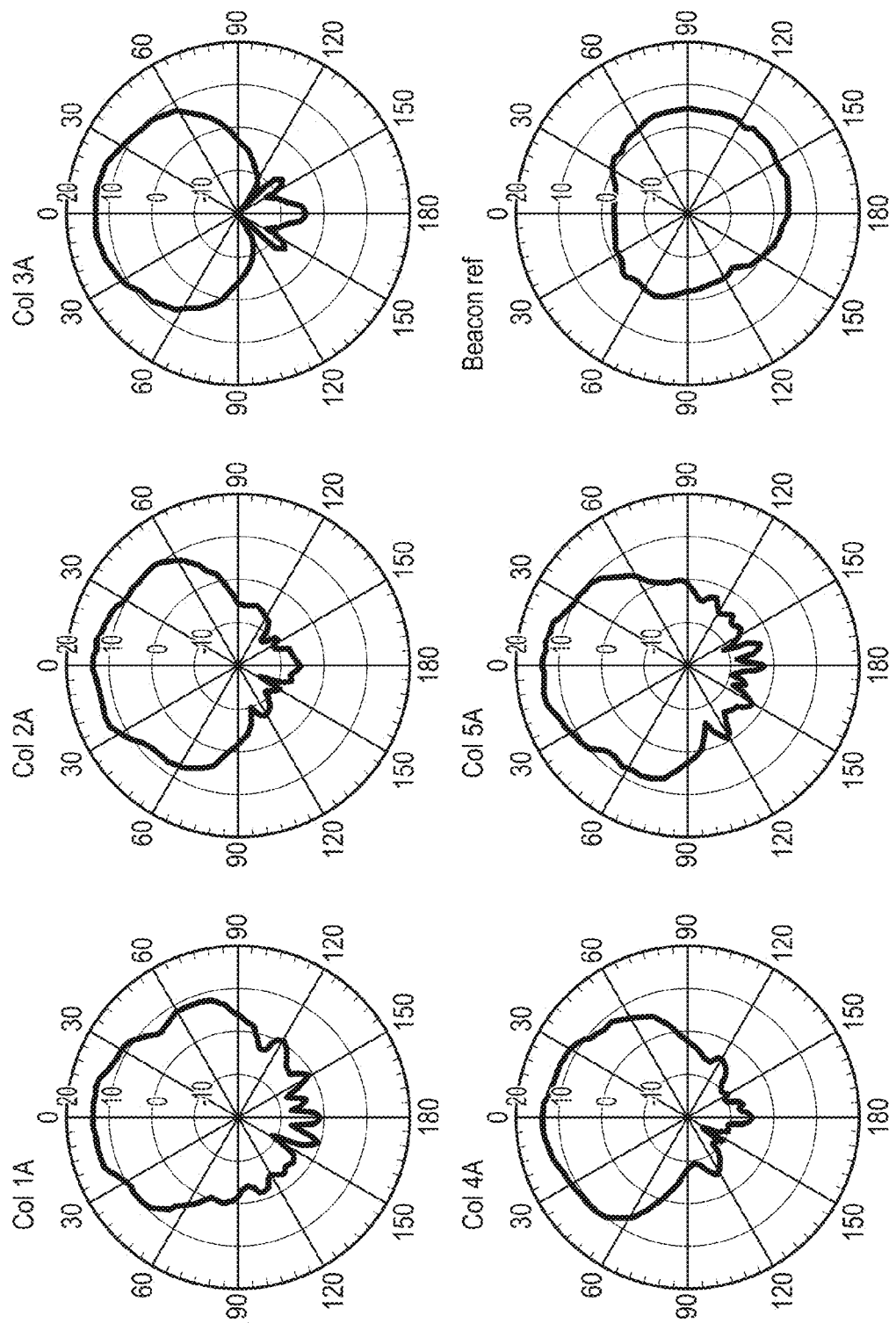
FIG. 5 shows a subset of the beam patterns which are available to an antenna apparatus in one embodiment.
Figure 5:
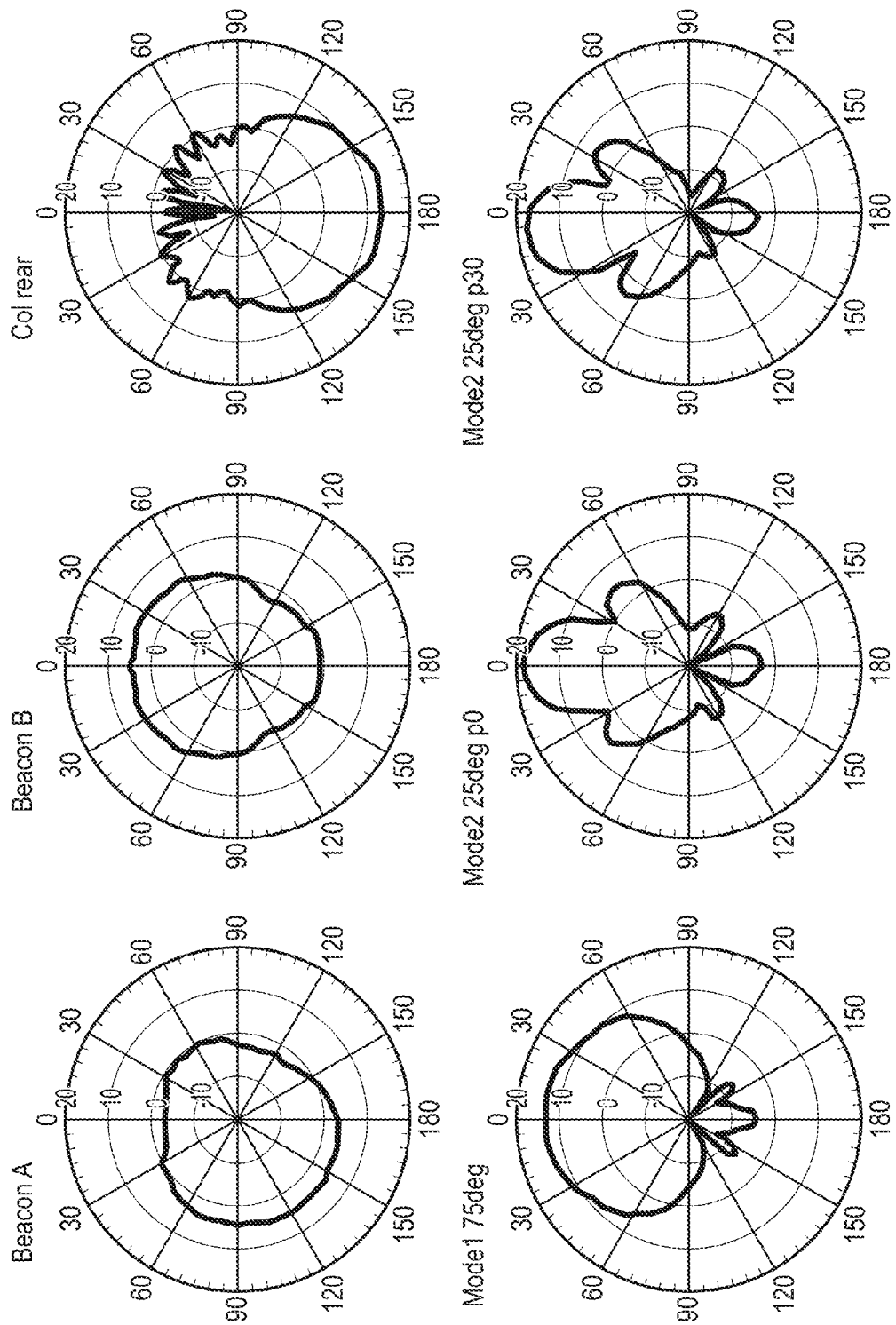
Figure 5:
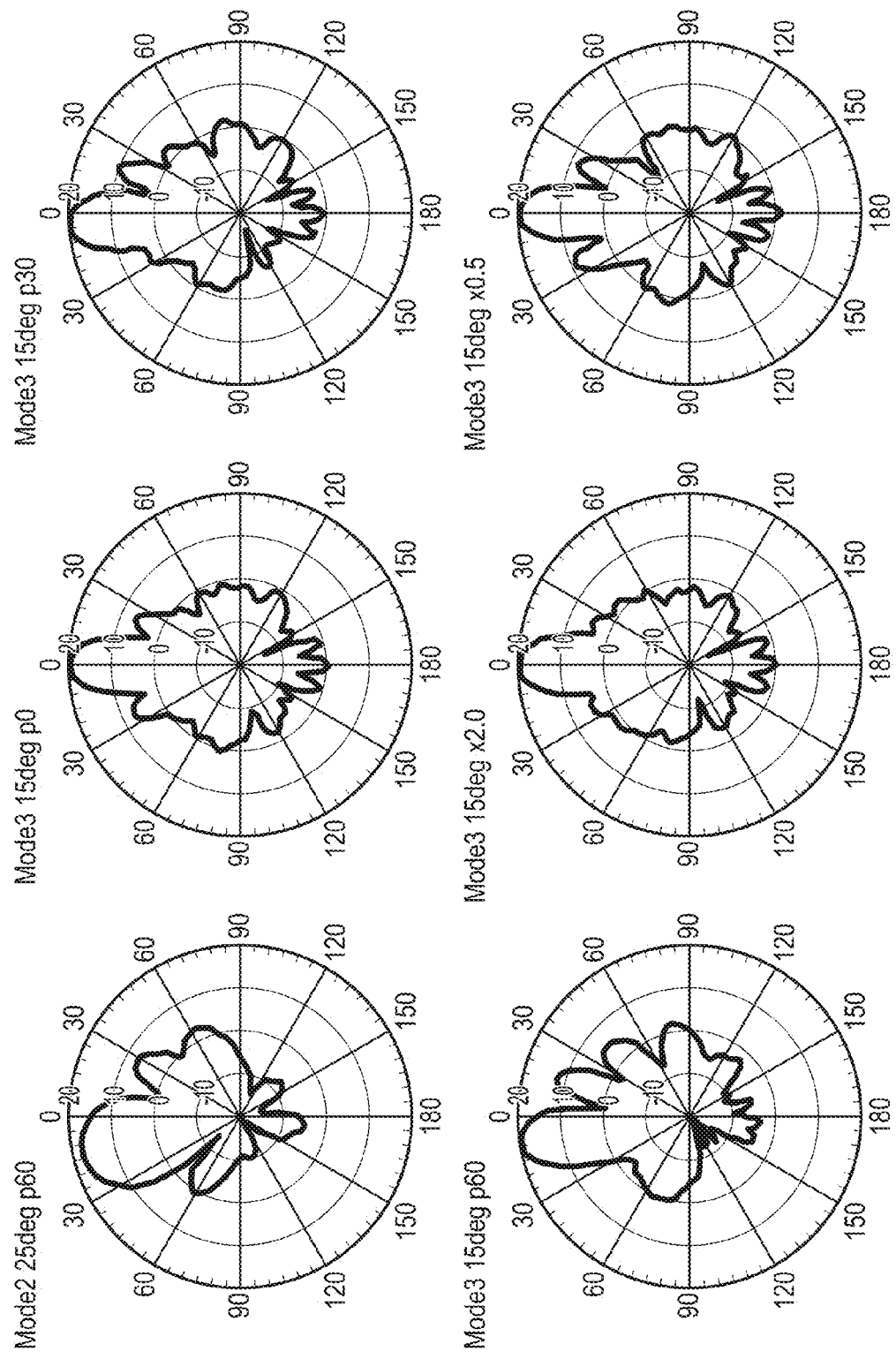
Figure 5:
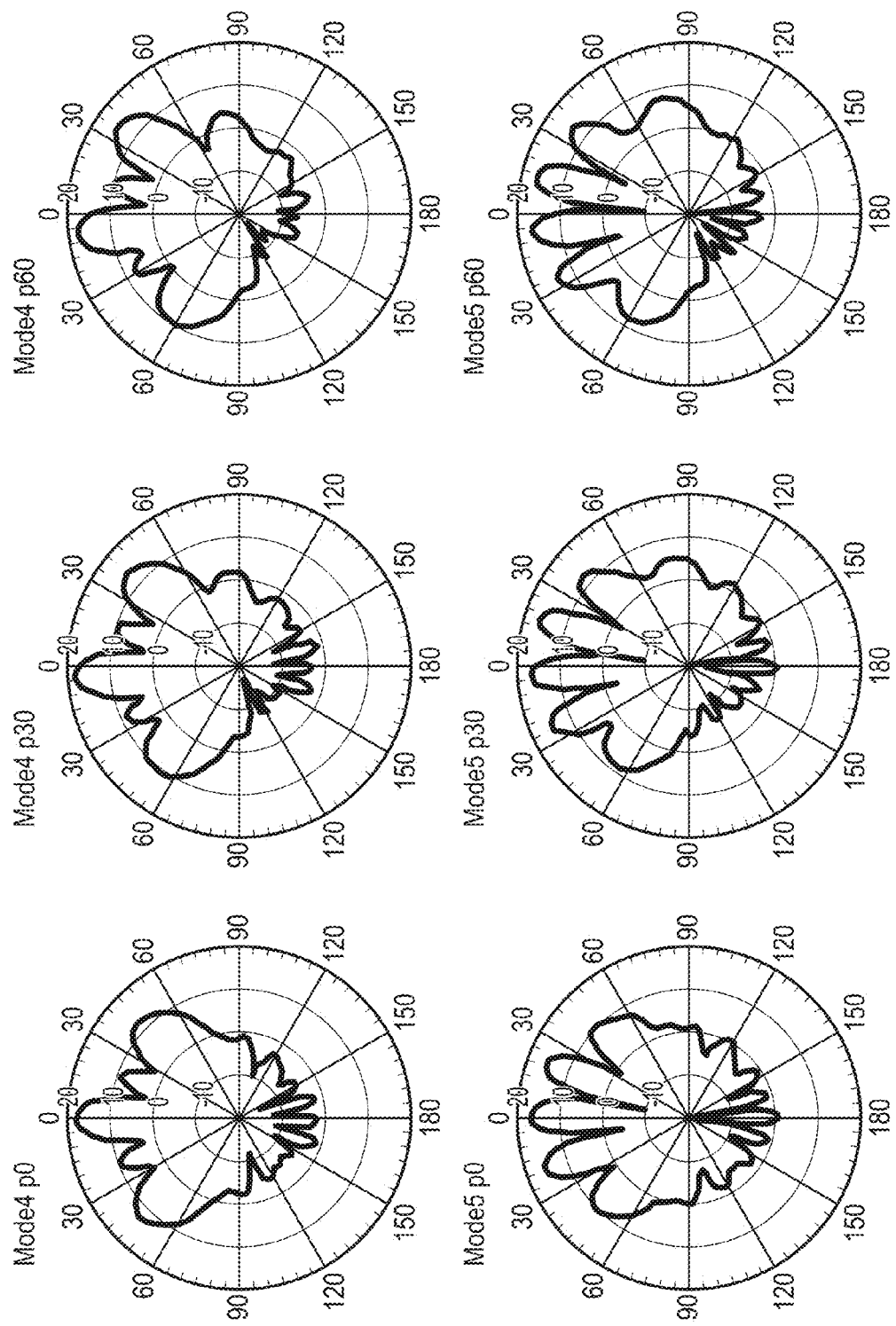
Figure 5:
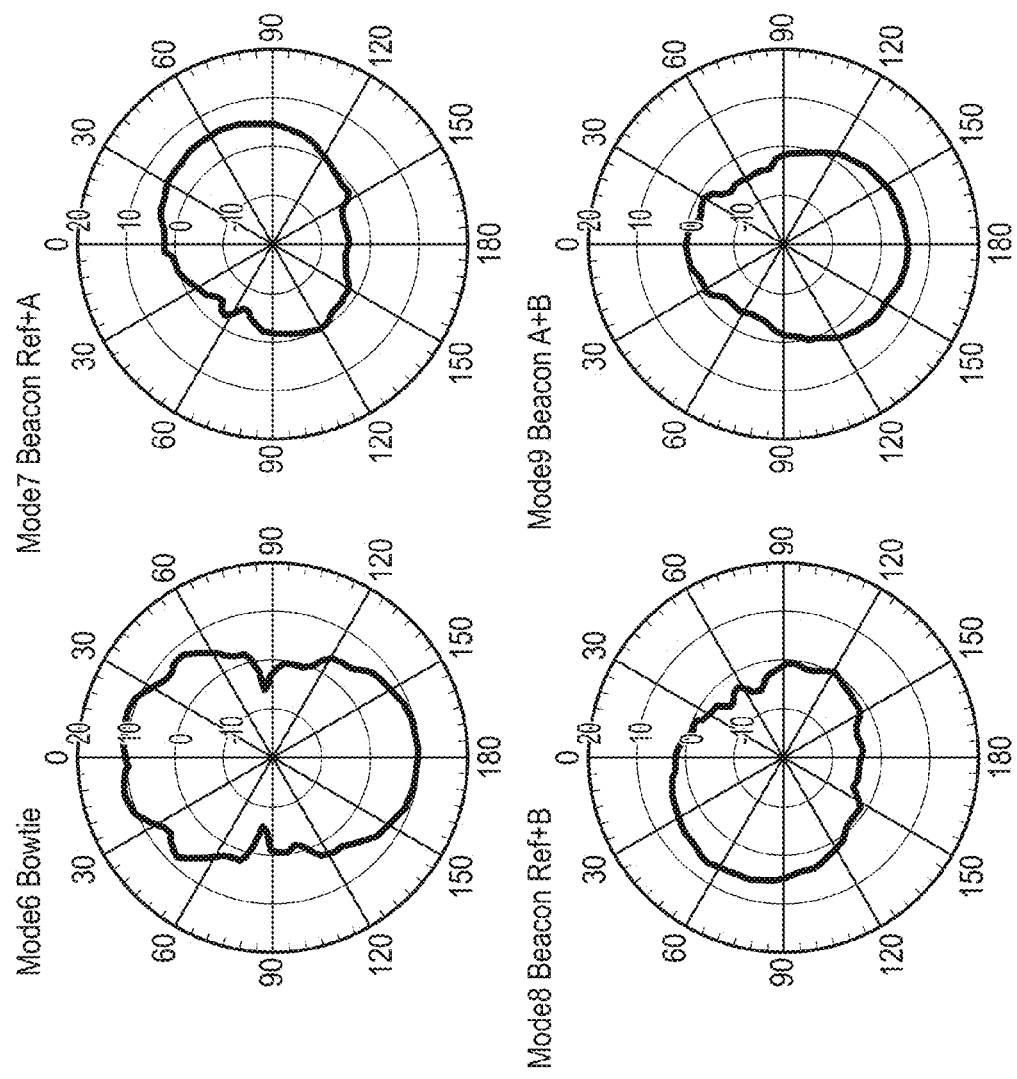

FIG. 5 shows a subset of the beam patterns which can be generated by an antenna array configured such as is illustrated in FIGS. 3 and 4, showing the useful range of beam patterns available. In FIG. 6 the following classes of beam patterns can be identified:•Narrow beams with a single main lobe and of various beam widths, where side lobes are significantly reduced relative to the main lobe;

Electronically steered beams that combine signals at RF, enabling antenna directivity to the left or right of the bore sight of the array;

Beams with grating lobes, where the array pattern has equally strong peaks in multiple directions and deep nulls with significant attenuation (gain <1) in other directions;

A bowtie configuration;

Three 'beacon' omni-directional patterns.

Combined with the above discussed rotating mechanism, the antenna apparatus thus provided, using a fixed set of beam patterns, improves over traditional uniform linear arrays, by being able to maintain a peak gain in any direction. For uniform linear arrays, it is known that the array gain decreases as the angle from the bore sight increases. In addition, the antenna apparatus provided is economically more attractive than more complex circular arrays. For example, ten complete transceiver chains with an aperture of 6.08λ, would generate an antenna pattern with 25° beam width. Embodiments of the antenna apparatus described herein have an aperture which is 4λ and use only two transceiver chains (note that the RF chains shown in FIG. 5 can be shared to reduce down to two connections in the receiver direction and two connections in the transmitter direction) and the narrowest beam that can be generated is 15°. Overall therefore the antenna apparatus provided by the present techniques enables the maximum gain to be orientated in any direction in 360°, whilst improving diversity reception and conversely interference nulling from any direction using a rich set of multiple transmitter and receiver beams.

Figure 6:
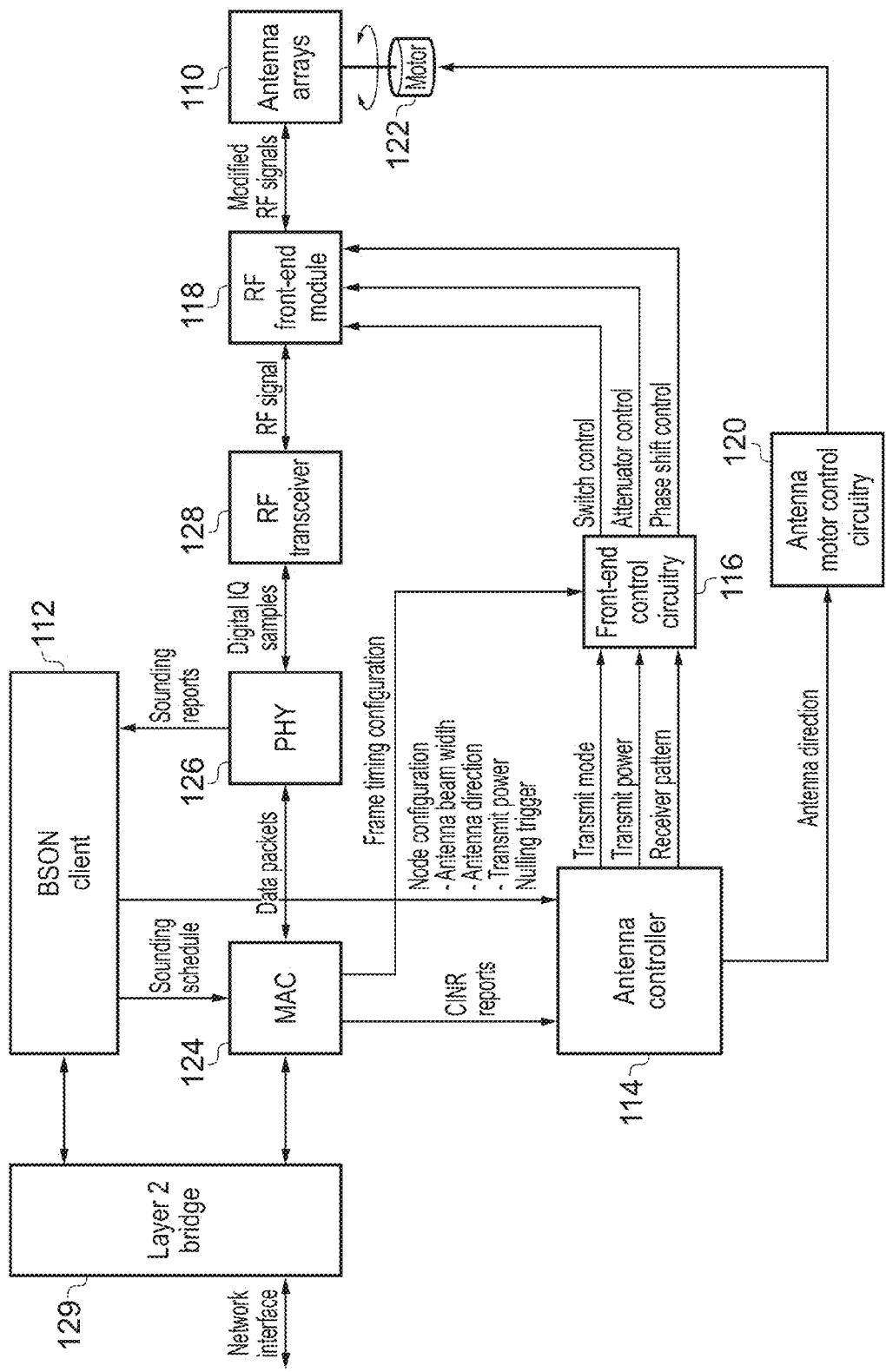
FIG. 6 schematically illustrates one embodiment of control circuitry and signal processing circuitry which are connected to the antenna arrays of a node, both within the antenna apparatus itself and in other network components to which it is connected.

FIG. 6 schematically illustrates the connections of the antenna arrays (front, rear and circular) 110 in one embodiment. The antenna arrays 110 are controlled by some of the other components shown in FIG. 6. A backhaul self-organising network (BSON) client 112 (software running in the same housing the antenna apparatus) provides node configuration including antenna beam width and direction, and transmit power and a nulling trigger to an antenna controller 114. This BSON client communicates with an external BSON server (not shown in this figure). However, additionally the antenna controller 114 may autonomously select the receiver pattern which maximises throughput based on carrier to interface and noise ratio (CINR) measurements. The antenna controller 114 controls the antenna arrays by passing configuration information for the transmit mode, the transmit power and the receiver pattern to the front end circuitry 116. The front end control circuitry 116 converts these into the required switch control signals, gain control signals and phase shift control signals which are passed to the RF front end module 118. The RF front end module 118 represents the components of FIG. 6 in which the components other than the antenna array components in FIG. 4 are to be found. The antenna controller 114 also indicates an antenna direction to the antenna motor control circuitry 120, which controls the motor 122 in order to orientate the antenna arrays 110 in azimuth. A modem data path is provided comprising the MAC 124, the PHY 126 and the RF transceiver 128, which then couples to the RF front end module 118 in order to provide this with the RF signals which the RF chains modify before passing them to the antenna arrays 110. In other words, data packets are sent between the MAC 124 and the PHY 126, digital IQ samples are passed between the PHY 126 and the RF transceiver 128, and RF signals are exchanged between the RF transceiver 128 and the RF front end module 118. The BSON client 112 (BSON controller) also generates sounding schedules to be implemented by the antenna apparatus which are received by the MAC 124. The MAC 124, like the BSON client 112 communicates with a Layer 2 bridge 129 which is coupled to the network interface.

Figure 7:
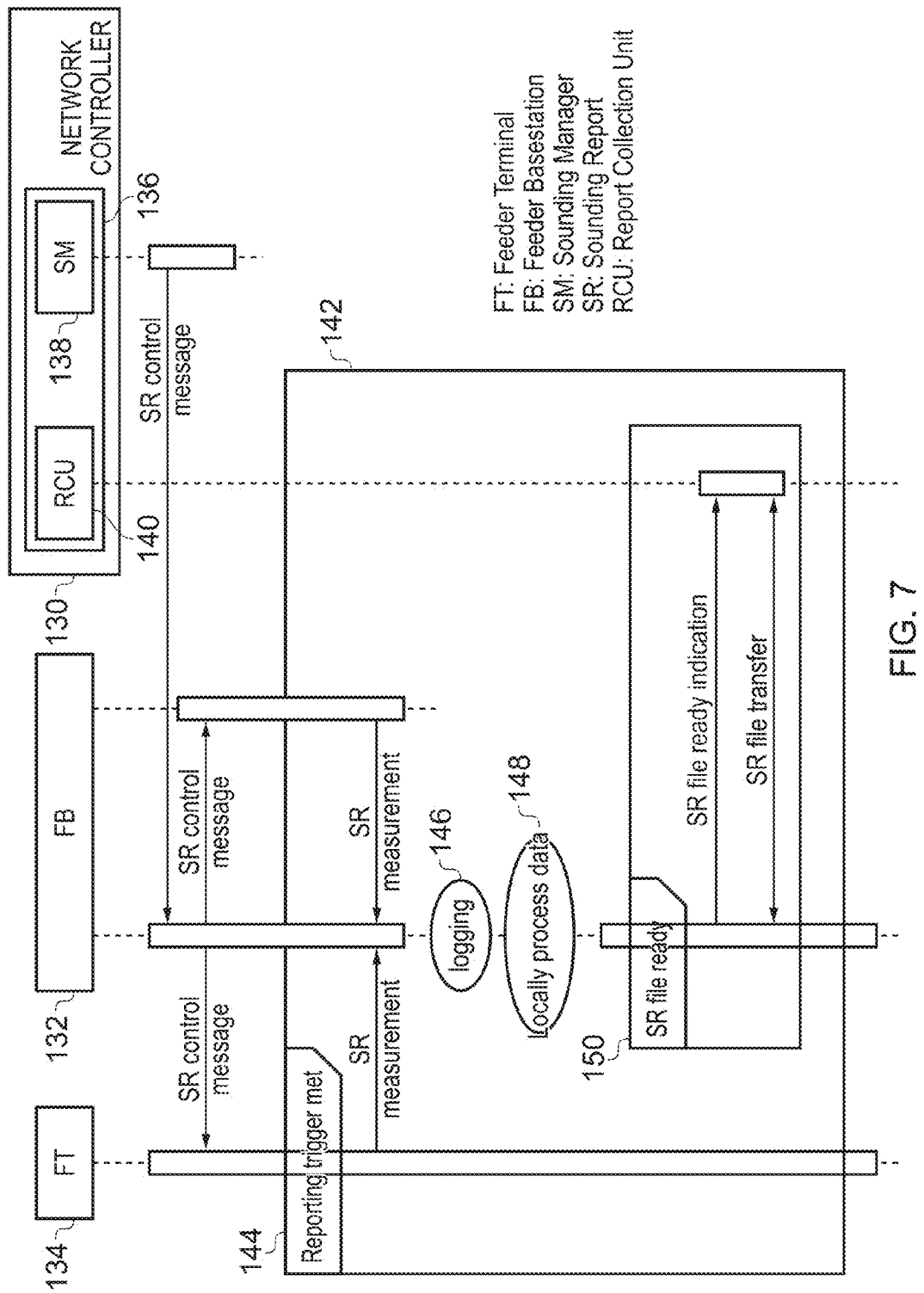
FIG. 7 schematically illustrates the interaction of a feeder terminal and a feeder base station with a network controller in one embodiment.

FIG. 7 schematically illustrates some components and processing stages related to the sounding process. This sounding process may be the external interference sampling process in one example and may be the active (path-loss assessing) sounding process in another example. It should be appreciated that in the passive sounding case (external interference measurement) the characteristics of the interference sources (for example beamwidth and direction) are measured, whereas in the active sounding case angle-of-arrival (AOA) and a received signal strength indication (RSSI) are measured for the network's own nodes which participate in the active sounding process. A network controller 130, a feeder base station 132 and a feeder terminal 134 are shown. The network controller 130 comprises sounding manager 138 and a report collection unit 140, which form part of a backhaul SON engine 136. When a sounding process (either an external interference sampling process or an active sounding process) is to be carried out, the network controller 130 transmits a sounding report (SR) control message detailing the parameters of the sounding process to the feeder base station 132. The SR control message of this example comprises at least some of:

Sounding type: active or passive;
Node ID: a list of the nodes (FTs and FBs) that shall carry out the sounding/interference measurements;
Measurement type: Received signal power, angle of arrival, time domain samples;
Trigger type: Periodic or event based;
Report interval: Length of time of reporting when the trigger type is periodic;
Number of reports: number of measurement reports to be generated during the reporting interval; and
Event trigger type: Throughput range, SNR range.

The portion of the feeder base station 132 which receives this SR control message then communicates it further to the feeder terminal 134, as well as to the portion of the feeder base station 132 itself which administers its part of the sounding process. The box 142 in FIG. 7 then illustrates the processing steps by which the sounding process is carried out and the resulting sounding reports are returned to the network controller 130. For an external interference sampling process the SR control message defines the conditions (event trigger type) which must be met for the external interference sampling process to be carried out. This trigger may be purely time based in that the external interference sampling process is carried out at a specific time following receipt of the SR control message, or is carried out at a specific time intervals following receipt of the SR control message, and so on. However the trigger may also be event related, such that the external interference sampling process is carried out when a defined event occurs in at least one of the feeder terminal 130 and the feeder base station 132. Such trigger events may for example to be defined as when the data throughput of the feeder terminal or feeder base station departs from a predetermined range, in particular when the data throughput falls below a predetermined threshold. Alternatively or in addition a trigger event may be defined as when the signal-to-noise ratio for the feeder terminal or feeder base station departs from a predetermined range, in particular when the signal-to-noise ratio falls below a predetermined threshold. Where a time varying external interference source causes a reduction in wireless network performance because of the effect it is now having on the data throughput or signal-to-noise ratio of a feeder terminal feeder base station, the wireless network can adapt its configuration in response by first performing the external interference sampling process to assess or reassess relevant characteristics of the external interference source.

Conversely, in the case of an active sounding process event based triggers (e.g. triggered by recording lower than anticipated SNR values) cannot be used. The active sounding requires a known sounding signal to be transmitted from a cooperating source and hence both transmission and reception are coordinated by the BSON.

A sounding report (SR measurement) is then transmitted from the feeder terminal 134 to the feeder base station 132, and from the portion of the feeder base station 132 which administers its part of the sounding process to the portion of the feeder base station 132 which handles data processing, storage and transmission. The SR measurement reports are then logged (146) within the feeder base station 132 and then some local processing of the data (148) may also be carried out. For example, the feeder base station may carry out time-difference-of-arrival measurements by computing the cross-correlation between signals received from two backhaul nodes. However it should be noted that it is not necessary for the feeder base station to perform the computation of cross-correlations between the signals in order to calculate at least one time-difference-of-arrival, and this data processing may be left to the backhaul SON engine 136, although it is recognised that doing this will almost inevitably increase the size of the SR file transfer. The decision as to where this processing should occur can therefore made on the one hand in dependence on where the required processing capability is available and on the other hand in dependence on whether the size of the SR file is a significant factor in maintaining good wireless network performance.

For the external interference sampling process with multiple uncoordinated nodes, the circuitry of the base station which supports this "locally process data" step 148 may also include successive interference cancellation (SIC) circuitry to enhance the quality of the signal of the weakest interferer by subtracting the signal from the strongest interferer.

Following the logging and local processing, and when the sounding report (SR file) is ready (150), the feeder base station 132 indicates to the report collection unit 140 that a sounding report is ready for transmission. The sounding report is then transferred to the report collection 140 such that the backhaul SON engine 136 can then process this sounding report, most likely with further sounding reports from other feeder terminals or feeder base stations. It should be noted that typically, although an active sounding process or external interference sampling processes may be carried out at various times and indeed may be carried out repeatedly throughout a 24-hour period, transmission of one or more sounding reports to the backhaul SON engine and reconfiguration of the wireless network may be restricted to a particular short period, for example around 3 am, when data transmission usage of the wireless network is expected to be low and therefore minimally disrupted.

Figure 8:
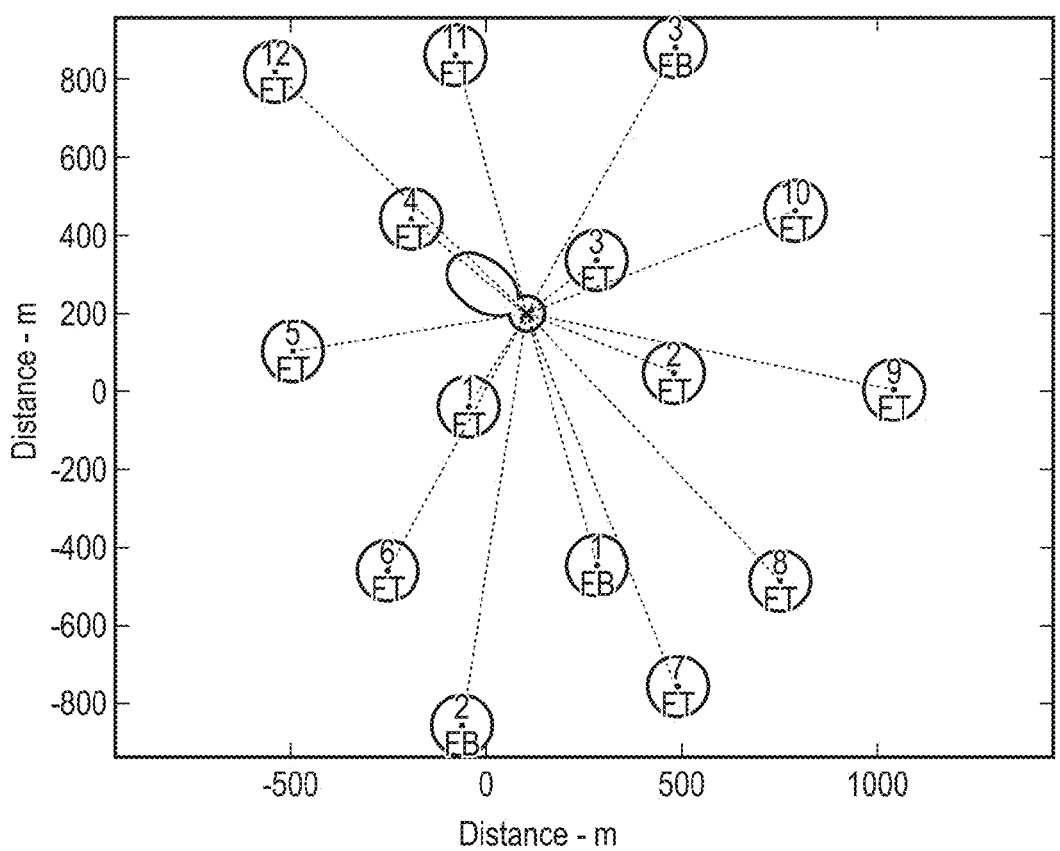
FIG. 8 schematically illustrates an uncoordinated (external) interference source and a set of nodes of a wireless network in its vicinity.

Returning to a consideration of the two part process of characterising an external interference source, namely firstly by estimating a location of the external interference source using at least one received measurement report and then by using the estimated location of the external interference source and the received signal strength to calculate at least one of: a source power; a beam width; an antenna bearing; and a front-to-back transmission ratio, FIG. 8 shows an example situation in which three feeder bases (FBs) and twelve feeder terminals (FTs) encounter an external interference source X. In the example of FIG. 8, the feeder bases and feeder terminals are at distances from the external interference source X which range from approximately 100 m to approximately 1 km. The circles which surround the FBs and FTs indicate that for the external interference sampling of this example, the FBs and FTs are configured to use their circular (omnidirectional) antennas having circular beam patterns, whilst the beam pattern of the external interference source X is notably asymmetric (a fact which of course cannot be known within the wireless network before the external interference sampling, location estimation and characterisation has been carried out). It will therefore be clear that node X can be thought of as an uncoordinated interferer (i.e. not belonging to the wireless network) and is utilising a narrow beam shape to communicate with another uncoordinated interfering node (not shown in the figure).

Figure 9:
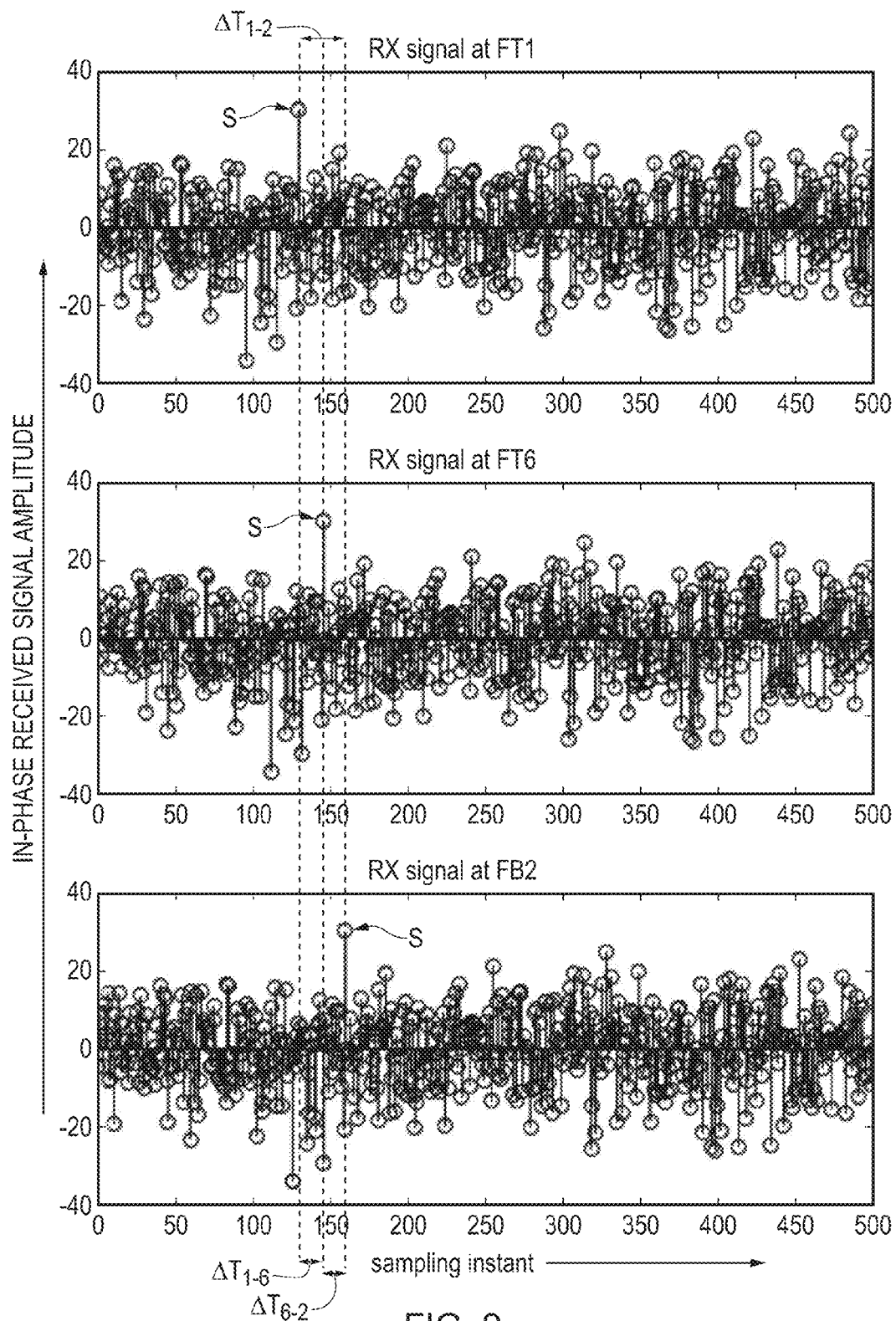
FIG. 9 shows an example set of signals sampled by three nodes in a wireless network, from which time-difference-of-arrival measurements are made in one embodiment.

FIG. 9 shows an example of time-domain signal samples made at three nodes (FT1, FT6 and FB2) in a wireless network, and the manner in which time-difference-of-arrival information is derived therefrom. Where the time-domain signal samples made by different nodes are to be expected to be correlated, but with a time offset, a given signal sample which can be identified across the three different nodes can be used to determine the required time-difference-of-arrival information. A cross-correlation process between two sets of time-domain samples identifies the required time differences. For the identified sample S, the time differences $\Delta t_{1-2}$, $\Delta t_{1-6}$, and $\Delta t_{6-2}$, i.e. between FT1 and FB2, between FT1 and FT6, and between FT6 and FB2 are shown. In the example of FIG. 9, an approximately 10 m resolution from the resulting time differences is achieved.

Some specific details of the how sources are parameterised in a backhaul SON engine in one example embodiment in order either: to estimate the location of an external interference source on the basis of interference measurement reports and further to characterise the interference source; or to calculate path losses between participant sources using active sounding process, are now described.

Path Loss

For a number of WINNER2 path loss models, the path loss PL (measured in dB) is assumed to be a function of the distance d (measured in meters) and the frequency f (measured in MHz) and parameterised by the constants $p_a$, $p_b$, $p_c$, such that:

$$PL(d,f;p_a,p_b,p_c) = p_a \log_{10}(d) + p_b + p_c \log_{10}(f/5000)$$

where, for example:
for free space: $p_a=20$, $p_b=46.4$, $p_c=20$;
and for the "b5a" urban feeder line-of-sight (LOS) rooftop model: $p_a=23.5$, $p_b=42.5$, $p_c=20$ Shadow fading may also be included, for non-line-of-sight (NLOS) links, modelled as a log normal fading. For example in the "c2b" urban macro path loss model the standard deviation of shadow fading is 4 dB.

Antenna Pattern

The antenna pattern (in the passive sounding case) in dB, at an angle θ is given by $$AP(\theta; \theta_0, \bar{\theta}_0, b_0) = -\min\left(12\left(\frac{\angle e^{j(\theta-\theta_0)}}{\bar{\theta}_0}\right)^2, b_0\right)$$

where ∠r, denotes the angle of the complex number r. $\theta_0$ is the antenna bearing, $\bar{\theta}_0$ is the antenna 3 dB beamwidth and $b_0$ is the front-to-back ratio. The angles are in radians and the front-to-back ratio is in dB.

In the active sounding case the process is carried out by the beacon (omnidirectional) antennas and the antenna patterns (both transmission and reception antenna gains) are assumed to be 0 dB in all directions.

EIRP

For the passive sounding case, the equivalent isotropic radiated power (EIRP) is equal to the peak power in the direction of the maximum antenna gain, denoted by $e_0$.

For the active sounding case, given the above-mentioned assumed 0 dB gain, the EIRP is taken to be equal to the peak power P, which is assumed to be known, or indeed explicitly communicated by the BSON.

RSSI

A received signal strength indicator RSSI or more simply r represents the received power at sensor m in the log domain, and for the passive sounding case is given by the sum of the transmitted power, the antenna gain at the transmitter, the path loss and the antenna gain of the receiver:

$$RSSI = TX\text{power} + TX\text{antennaGain} - PL + RX\text{antennaGain}$$

where TX and RX refer to transmission and reception respectively.

For the active sounding case the RSSI is simply (in the log domain) equal to TXpower−PathLoss.

TDOA

In the example of passive sounding (external interference measuring) and concerning time difference of arrival, let $q_0(t)$ denote the transmitted interference signal located at $x_0$, $y_0$, for t=0, 1, ..., T−1. The received signal at sensor (node) n located at $x_n, y_n$ is given by $$q_n(t) = a_n q_0(t - \tau_n) + w_n$$

where $w_n$ denotes the Additive White Gaussian noise (AWGN) term and $a_n$ denotes the signal attenuation and includes the effects of TX power, the TX antenna gain, the radio propagation losses and the RX antenna gain. $\tau_n$ denotes the propagation delay from sensor 0 to sensor n. If c is the speed of light, then the distance between sensors m and 0 is given by $$c\tau_n = \sqrt{(x_n - x_0)^2 + (y_n - y_0)^2}$$

In one example of the gathering of the time-domain samples described above, in accordance with the configuration defined in the SR control message, more than one FT transmits the RX samples to their connected FBs, where pairwise cross-correlations take place to compute Time Difference of Arrival (TDOA) measurements. The cross-correlation between signals $q_m(t)$ and $q_n(t)$, corresponding to sensors m and n, respectively, is given by $$c_{m,n}(\tau) = \sum_{t=-T+1}^{T-1} q_m^*(t) q_n(t+\tau)$$

The estimate of the time difference of arrival $\Delta\tau_{m,n}(=\tau_m - \tau_n)$ is derived by seeking to find the peak of cross-correlation function. Specifically, $$\Delta\tau_{m,n} = T - \arg\max_\tau |c_{m,n}(\tau)|$$

Finally the TDOA estimate is a function of the sensor locations, given by $$\Delta\tau_{m,n} = c^{-1}\sqrt{(x_m - x_0)^2 + (y_m - y_0)^2} - c^{-1}\sqrt{(x_n - x_0)^2 + (y_n - y_0)^2} + v_\tau$$

where $v_\tau$ is a non-Gaussian observation error term.

Bearing

The bearing, or angle of arrival (AOA) of sensor 0 at sensor m is given by $$\theta_m = a\tan\left(\frac{y_0 - y_m}{x_0 - x_m}\right) + v_\theta$$

where $v_\theta$ is a non-Gaussian observation error term.

Figure 10:
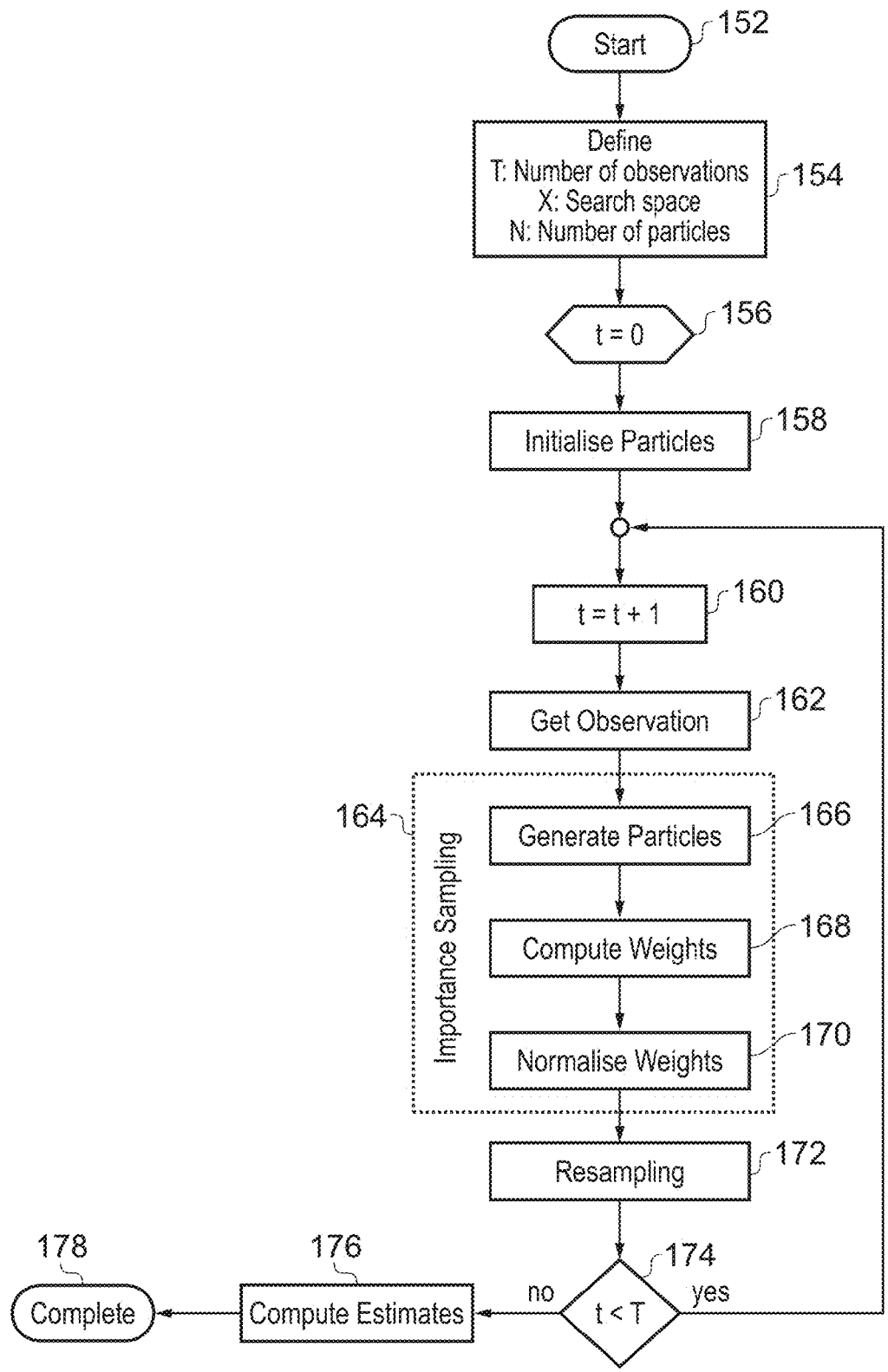
FIG. 10 shows a sequence of steps which are taken when using a Particle Filter algorithm in one example embodiment.

Turning now to the evaluation of estimates of some of these quantities, a particle filter is a powerful tool for computing optimal estimates for non-linear and non-Gaussian optimisation problems. A sampling importance resampling particle filter algorithm is shown in FIG. 10, with reference to the example of characterising external interference sources. The algorithm begins at the start step 152 and a number of definitions are made at step 154, such as the number of observations to be made, T, a definition of the search space, X, and the number of particles, N, to be used in the algorithm. It should be noted that the number of particles chosen may vary significantly depending on the problem to be solved, for example in the present context an example number of particles used for the source location estimation without time distance of arrival (TDOA) information is approximately 50, whilst an example number of particles used when including time difference of arrival information is approximately 500. In general the number of particles used will typically depend on the number of measurements being used. For example it has been found in simulation studies of the present techniques that satisfactory results are achieved when 500 particles are used for 2 TDOA measurements, and with 100 particles or less when three or more TDOA measurements are used. An iteration parameter, t, is set to 0 at step 156.

The core steps of the algorithm are now described:
A. (step 158) Initialise Particles:
  a. For n=1, . . . , N, sample $s^{(n)}[0] \sim f(s\,[0])$, where f[0] is the prior probability distribution function of the state x at time t=0
B. Get a new measurement:
  a. (step 160) Increment time index: t:=t+1
  b. (step 162) Get new observation: $z_t$
C. (box 164) Importance Sampling
  a. (step 166) Generate Particles: for n=1, . . . , N, sample $s^{(n)}[t] \sim f(s[t]|s^{(n)}[t-1])$
  b. (step 168) Compute Weights: for n=1, . . . , N, sample $w^{(n)}[t] \sim f(z[t]|s^{(n)}[t])$
  c. (step 170) Normalise Weights: $c = \Sigma_{n=1}^{N} w^{(n)}[t]$, $w^{(n)}[t] := c^{-1} w^{(n)}[t]$
D. (step 172) Resampling
  a. Resample with replacement N particles according to weights $w_t^{(n)}$
E. Termination Steps
  a. (step 174) If t<T then go to step 160
  b. (step 176) Compute Estimates:
    i. Conditional Mean ($\mu = E\{s[T]\}$): $\hat{s}[T] = N^{-1} \Sigma_{n=1}^{N} s^{(n)}[T]$
    ii. Covariance Matrix ($P = E\{[T] - \mu)(s[T] - \mu)^H\}$): $\hat{P}_T = N^{-1} \Sigma_{n=1}^{N} (s^{(n)}[T] - \hat{s}[T])(s^{(n)}[T] - \hat{s}[T])^H$
    iii. Algorithm complete (step 178).

Note firstly that the aim of the resampling step is to replicate particles with high weights and ignore particles with low weights. Note also that s [t] denotes the state at time instant t. In context of the external interference measurement process (passive sounding) s[t] comprises six variables, $$s[t] = \begin{bmatrix} x_0[t] \\ y_0[t] \\ \theta_0[t] \\ \overline{\theta}_0[t] \\ e_0[t] \\ b_0[t] \end{bmatrix}$$

where $x_0[t]$, $y_0[t]$, $\theta_0[t]$, $\overline{\theta}_0[t]$, $e_0[t]$, and $b_0[t]$ denote the location of the unknown source in x, in y, the bearing, the beamwidth, the EIRP and front-to-back ratio, respectively, at time index t. The time evolution of the state is modelled as a random walk, that is $$s[t+1] = s[t] + A[t]v[t]$$

where the process noise $v[t] \sim N(0_{6 \times 1}, I_{6 \times 6})$ are independent and identically distributed AWGN terms, with zero mean and variance given by the 6×6 identity matrix. The matrix A is given by $$A[t] = \begin{bmatrix} \sigma_x[t] & 0 & 0 & 0 & 0 & 0 \\ 0 & \sigma_y[t] & 0 & 0 & 0 & 0 \\ 0 & 0 & \sigma_\theta[t] & 0 & 0 & 0 \\ 0 & 0 & 0 & \sigma_{\overline{\theta}}[t] & 0 & 0 \\ 0 & 0 & 0 & 0 & \sigma_e[t] & 0 \\ 0 & 0 & 0 & 0 & 0 & \sigma_b[t] \end{bmatrix}$$

where for example $\sigma_x[t]$ denotes the standard deviation of the position noise process at t. While here the model has been generalised to include time varying aspects of the interferer, in practice the interferer state may remain static during the entire measurement process.

Note also that z[t] is the measurement vector at t. In the present context the measurement may include the bearing $z_{\theta_m}[t]$ and RSSI measurements $z_{r_m}[t]$ at sensor m, or time difference of arrival $z_{\tau_{m,n}}[t]$ measured at m and n.

$$z_{\theta_m}[t] = \operatorname{atan}\left(\frac{y_0[t] - y_m}{x_0[t] - x_m}\right) + v_\theta[t]$$

$$z_{r_m}[t] = e_0[t] - \min\left(12\left(\frac{Le^{j(\theta_m - \theta_0)}}{\overline{\theta}_0}\right)^2, b_0\right) -$$

$$\frac{p_a}{2}\log_{10}((x_m - x_0[t])^2 + (y_m - y_0[t])^2) - p_b - p_c \log_{10}(f/5000) + v_r[t]$$

$$z_{\tau_{m,n}}[t] = c^{-1}\sqrt{(x_m - x_0[t])^2 + (y_m - y_0[t])^2} - c^{-1}\sqrt{(x_n - x_0[t])^2 + (y_n - y_0[t])^2} + v_\tau[t]$$

where $\theta_m$ in $z_{r_m}[t]$ denotes the angle of departure (AOD) from node 0 to node m, i.e.

$$\theta_m = \operatorname{atan}\left(\frac{y_m - y_0[t]}{x_m - x_{0[t]}}\right).$$

Figure 11:
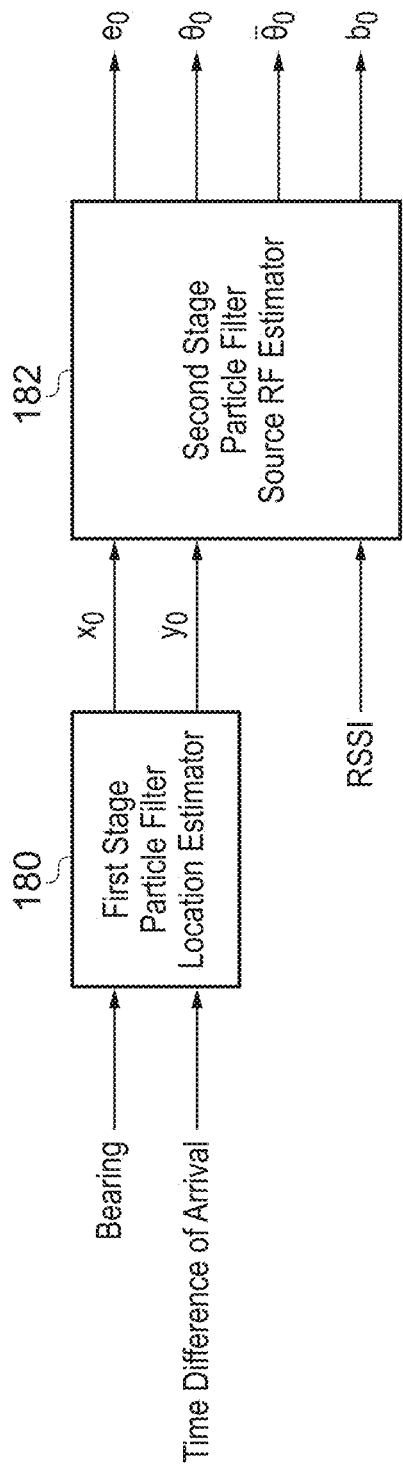
FIG. 11 schematically illustrates the use of a first particle filter algorithm to estimate the location of an external interference source and the use of a second particle filter algorithm to estimate, on the basis of the output of the first particle filter algorithm and a received signal strength indication, up to four characterising parameters of the external interference source.

FIG. 11 schematically illustrates the use of a two stage particle filter state estimator. As shown a first stage particle filter 180 is utilised to extract an external interference source's x, y co-ordinates from bearing and time difference of arrival measurements. The RSSI measurements together with the x, y external interference source location estimates are input to the second stage particle filter 182 that computes (listed from top to bottom) the EIRP, the bearing, the 3 dB beamwidth, and the front-to-back ratio of the source. A notable feature of this arrangement is the replacement of a 6 dimensional search space into two smaller sub-problems. In the first sub-problem location estimates ($\hat{x}_0, \hat{y}_0$) are computed. The location estimates are used in the direction of departure and path loss terms of the RSSI measurement instead of the unknown source location ($x_0, y_0$). Thus the RSSI measurement is approximated by $$z_{\hat{r}_m} = e_0[t] - \min\left(12\left(\frac{Le^{j(\hat{\theta}_m - \theta_0)}}{\overline{\theta}_0}\right)^2, b_0\right) -$$

$$\frac{p_a}{2}\log_{10}\left((x_m - \hat{x}_0[t])^2 + (y_m - \hat{y}_0[t])^2\right) - p_b - p_c\log_{10}(f/5000) + v_r[t]$$

$$\text{where } \hat{\theta}_m = \operatorname{atan}\left(\frac{y_m - \hat{y}_0[t]}{x_m - \hat{x}_0[t]}\right)$$

Figure 12:
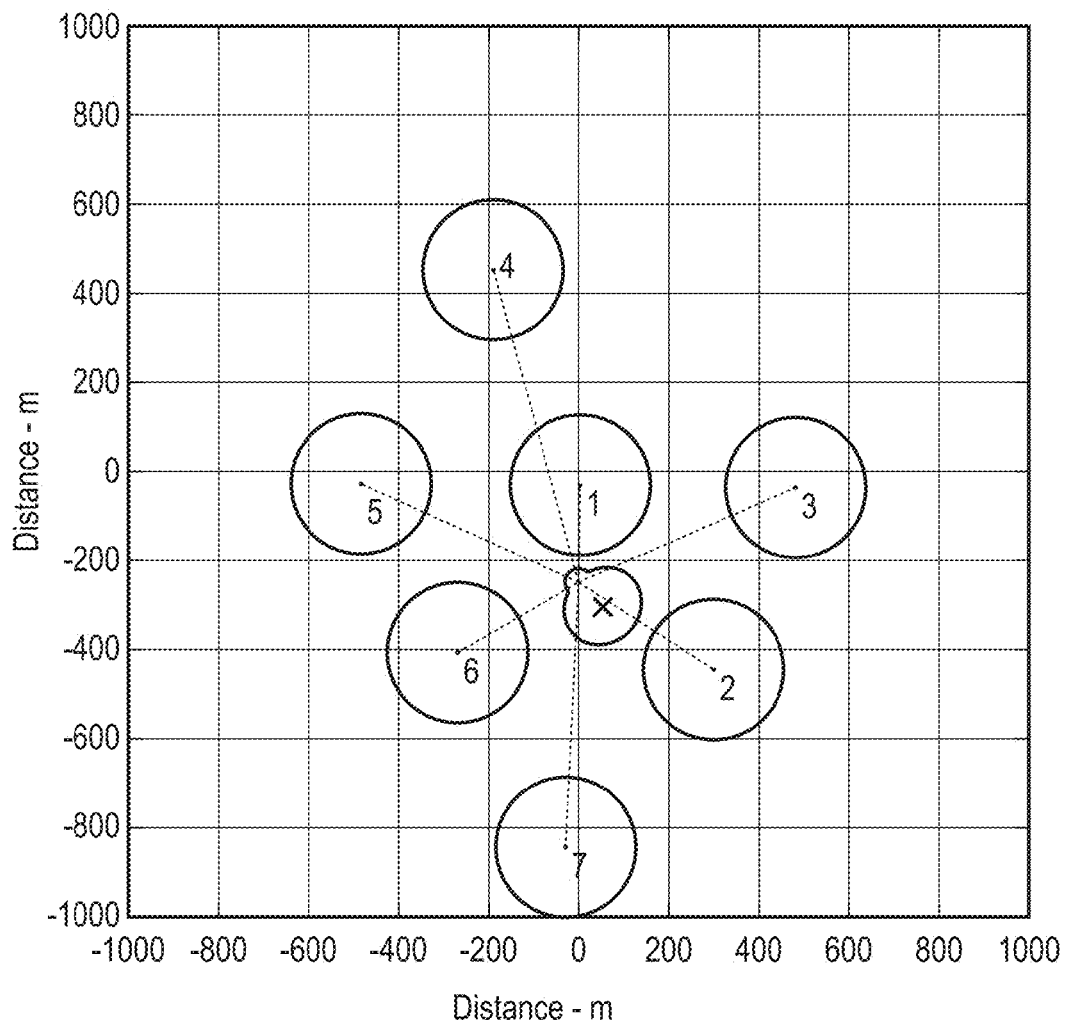
FIG. 12 illustrates the initial location and configurations of an external interference source and seven nodes of a wireless network in a simulation.
Figure 13:
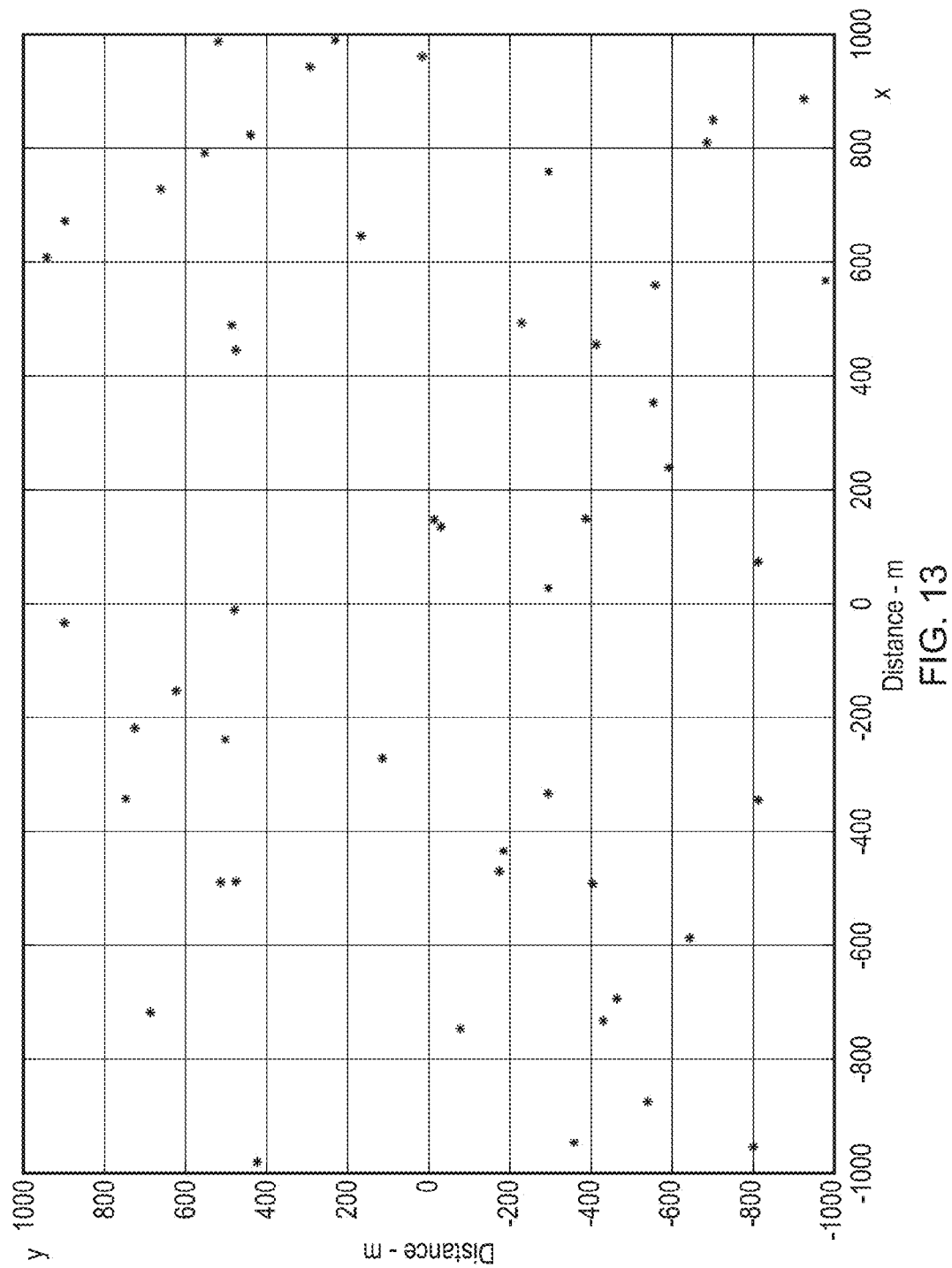
FIG. 13 shows a simulation of the initial locations of a set of particles used in a particle filter algorithm for locating the external interference source shown in FIG. 12.
Figure 14:
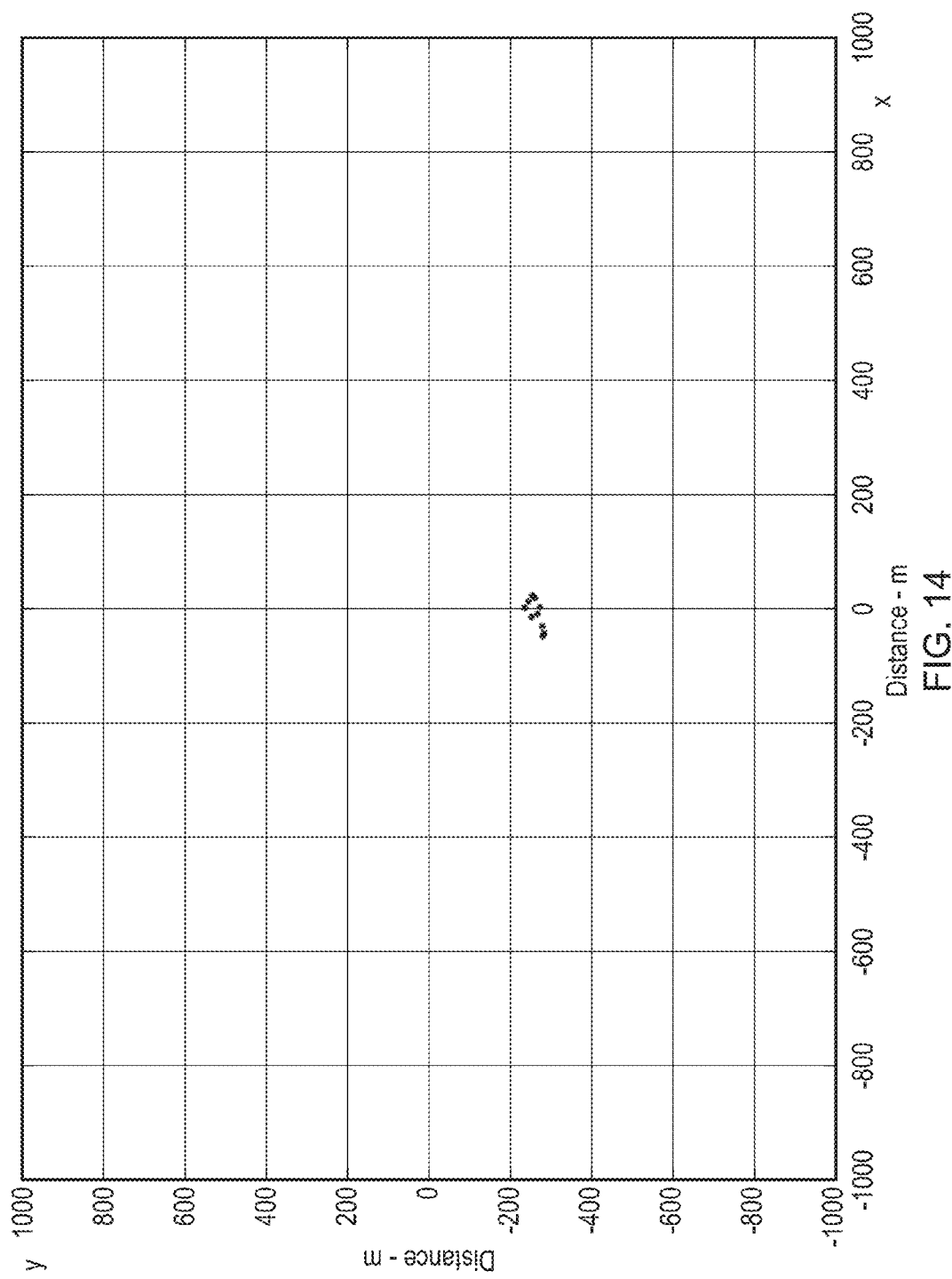
FIG. 14 shows the set of particles of FIG. 13 after simulating the usage of seven items of angle of arrival (bearing) information and two items of time difference of arrival in a particle filter algorithm.
Figure 15:
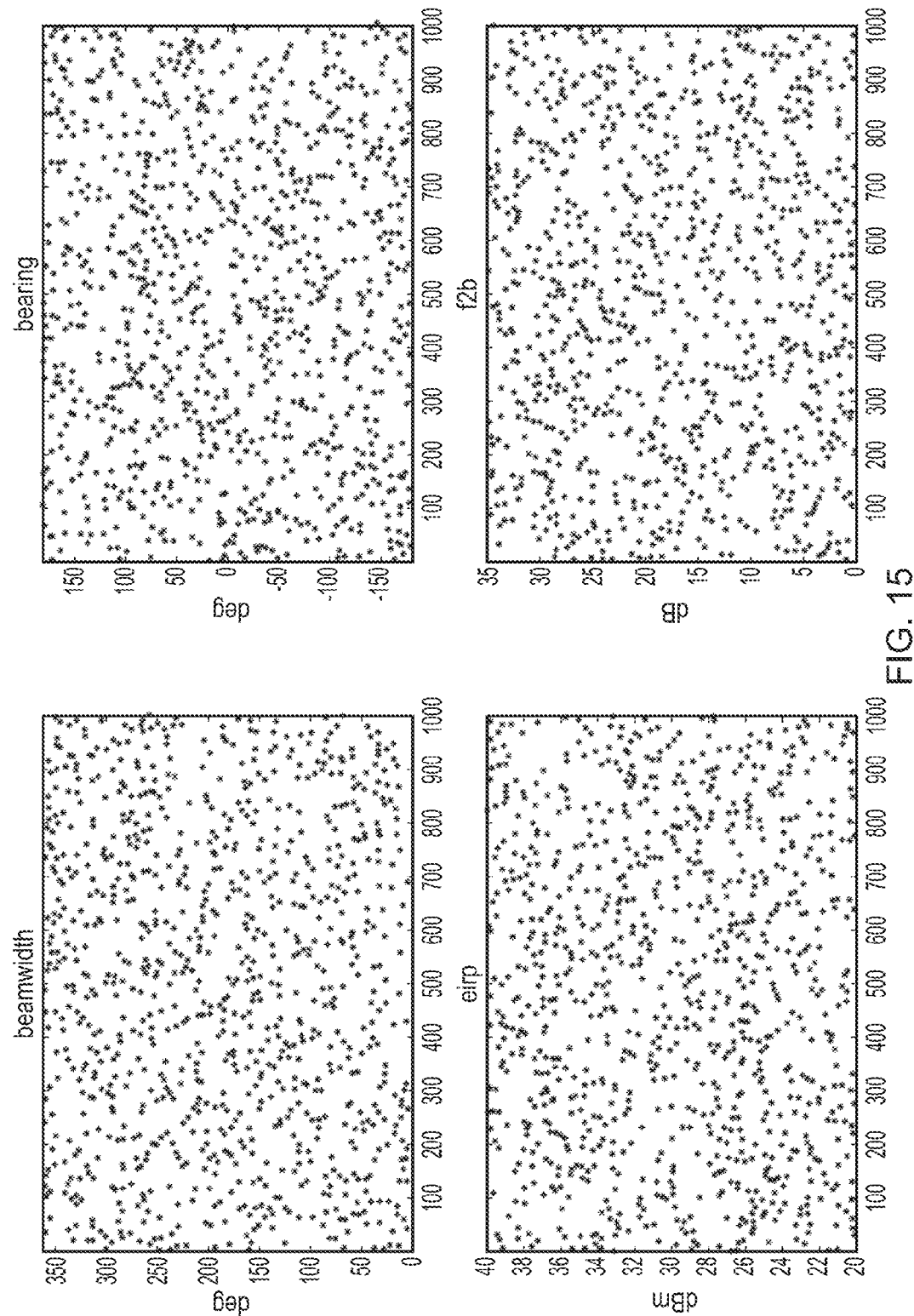
FIG. 15 shows the initial set of set of particles parameterised by beam width, antenna bearing, source power and front-to-back-transmission ratio in the simulation of FIGS. 12-14.
Figure 16:
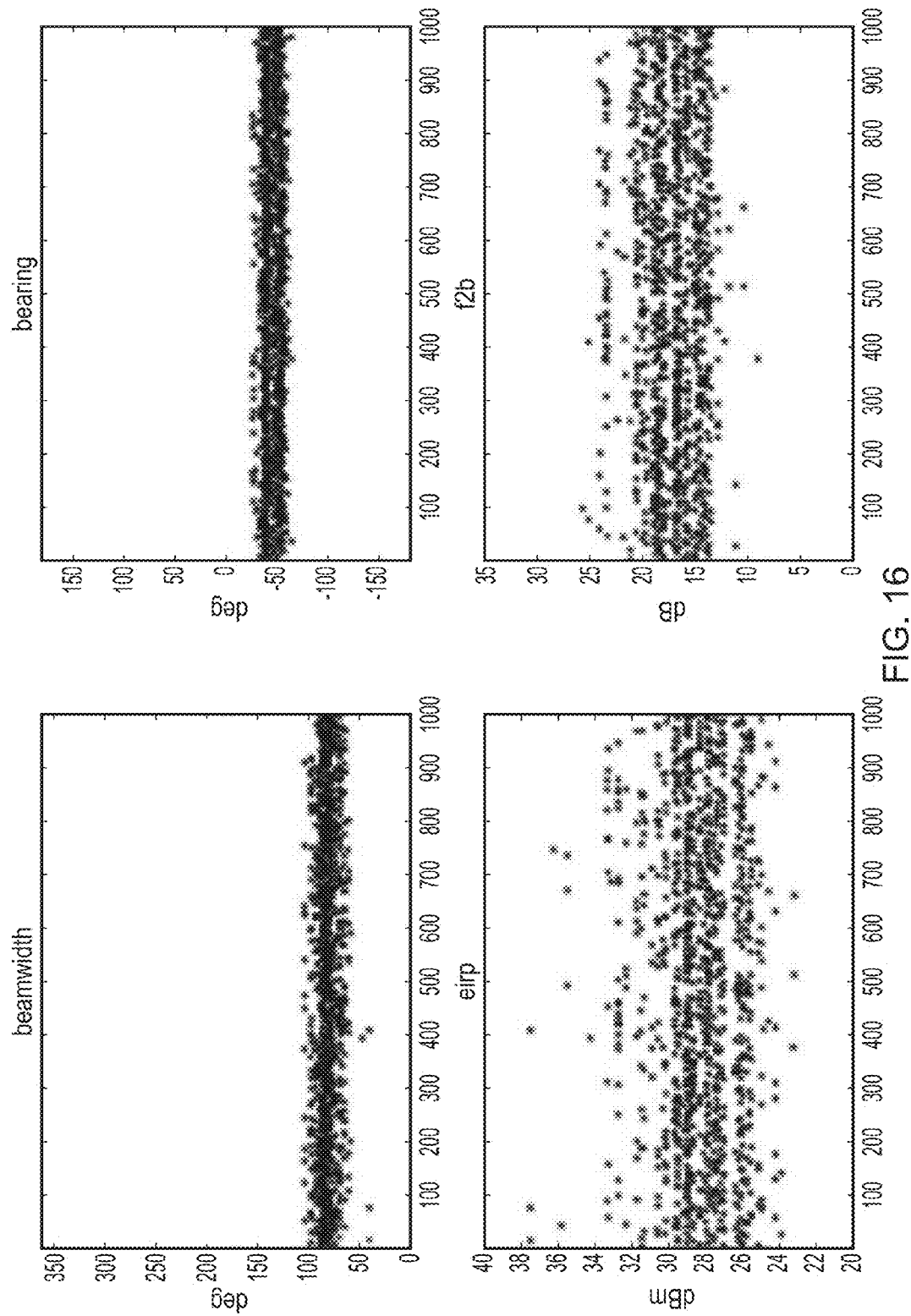
FIG. 16 shows the set of particles of FIG. 13 after a first iteration of a particle filter algorithm.
Figure 17:
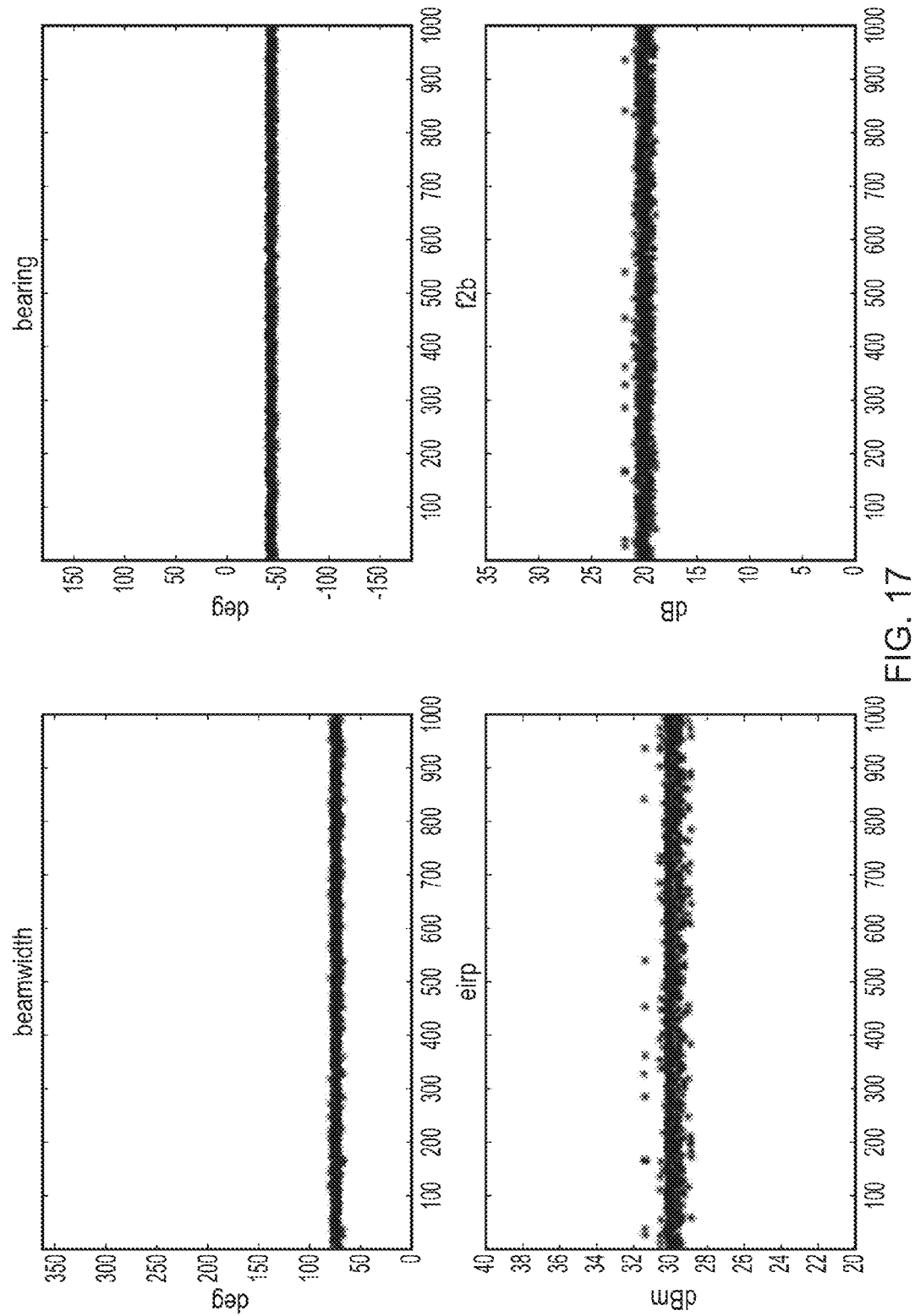
FIG. 17 shows the set of particles of FIG. 13 after ten iterations of the particle filter algorithm.
Figure 18:
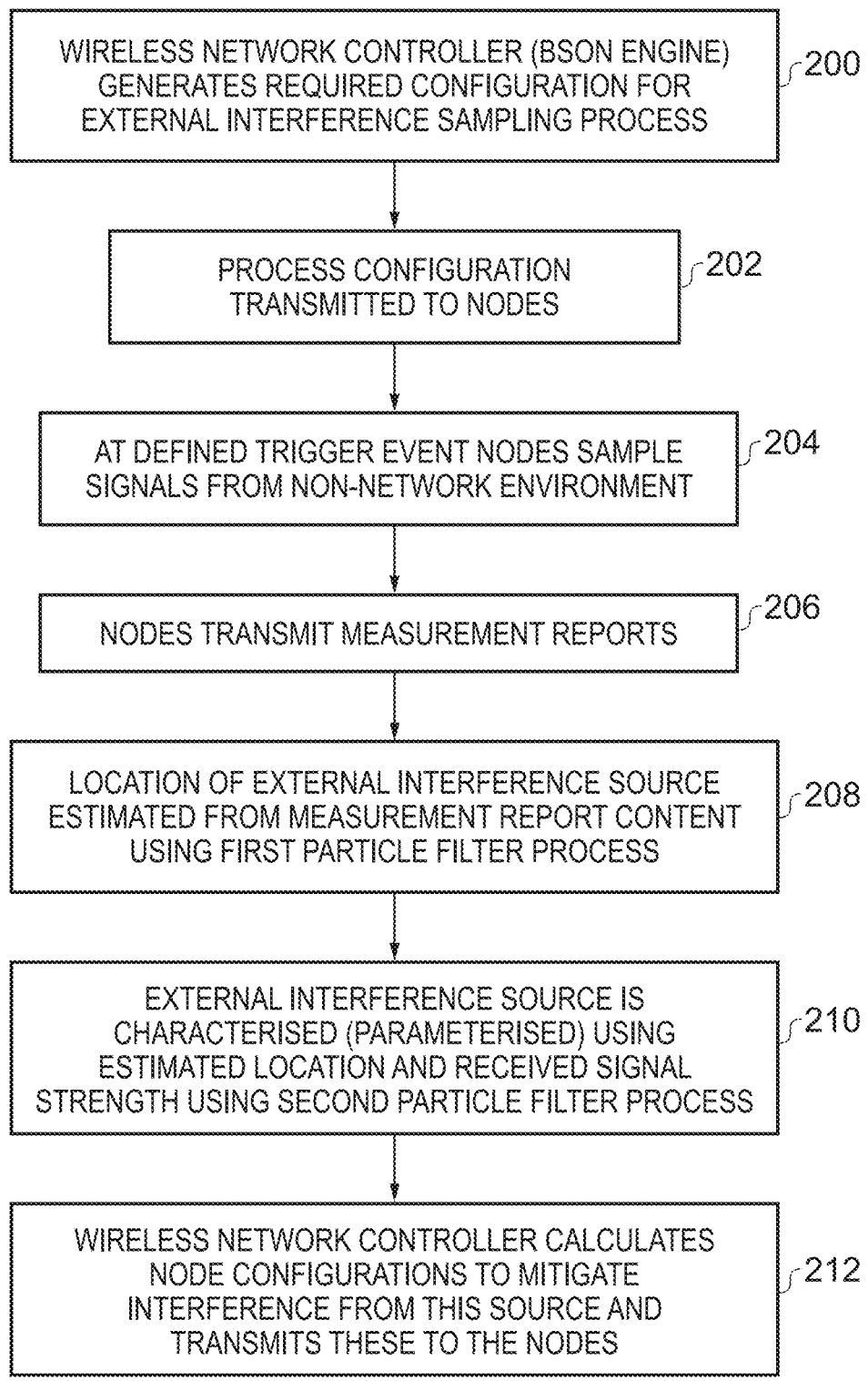
FIG. 18 shows a sequence of steps carried out in the method of one embodiment when performing passive sounding to assess the environment.

A simulation of the observation and characterisation of an external interference source X is now illustrated in FIGS. 12-17. FIG. 12 shows the interference source X, which has been set up with a bearing of −45 degrees, a 70 degree 3 dB beamwidth, an EIRP of 30 dB, and a front-to-back ratio of 20. Seven nodes of the wireless network (1-7) configured in omnidirectional reception mode are also shown. FIG. 13 shows the x, y locations of the set of initial particles in the first stage particle filter used for estimation of the interference source location. FIG. 14 shows the particles after using seven angle of arrival and two TDOA estimates. The interfering node (source) is located at (0,−250). Using these seven AOA and two TDOA estimates the location particle filter (after 10 iterations, i.e. T=8 referring to FIG. 10) computes the average interferer location as (−3.6, −256.2). FIG. 15 shows distributions of the bearing, beamwidth, EIRP, and front-to-back ratio for a the initial set of particles in the second stage particle filter, FIG. 16 shows the distributions at the first iteration, and FIG. 17 shows them at ten iterations. The resulting estimated parameters are:

Bearing: −45.196 degrees
Beamwidth: 72.066 degrees
EIRP: 29.724 dBm
F2B ratio: 19.714 dB FIG. 18 shows a sequence of steps which are taken in the method of one example embodiment when employing a passive (external interference sampling) process. At step 200 the wireless network controller (BSON engine) generates the required configuration for an external interference sampling process, in particular defining the nodes which should participate in that process. Then at step 202 this process configuration is transmitted to those nodes. At step 204, when the trigger event defined by the wireless network controller for the external interference sampling process to take place (e.g. a predetermined time) the nodes sample signals from non-network environment components and at step 206 transmit measurement reports based on the signal samples to the wireless network controller (possibly via one or more intermediate components such as a feeder base station as described above). Then at step 208 the wireless network controller estimates the location of the external interference source using the content of the measurement reports by means of a first particle filter process as described above. Then at step 210 the external interference sources characterised (parameterised) by the wireless network controller using the estimated location and the received signal strength (forming part of the measurement reports) this is done, as described above, using a second particle filter process. Thus, having parameterised the external interference source the wireless network controller calculates node configurations to mitigate the interference being caused from this source and transmits these configurations to the relevant nodes in the wireless network at step 212. The network configuration which mitigates the interference may be determined by the wireless network controller using an evolutionary algorithm as is described below with reference to FIGS. 28 to 36.

Returning now to a consideration of an active sounding process, as mentioned above the path loss is simply given by: TXpower-RSSI. Formally, the received RSSI is given by:

$$z_{r_m}[t] = P -$$

$$\left(\frac{p_a}{2}\log_{10}((x_m - x_0[t])^2 + (y_m - y_0[t])^2) + p_b + p_c\log_{10}(f/5000)\right) + v_r[t]$$

The second term above is the WINNER2 PL model, parameterised by $p_a$, $p_b$ and $p_c$. The parameters are given for an assumed path loss model, or may be estimated using a particle filter. Note that $(x_0, y_0)$ is the coordinates of the active sounding source. Again, it may be assumed that this location is known (i.e. can be specified by the BSON, which stores this information in the backhaul equipment database), or it may be chosen to estimate the location using the same technique as in the passive sounding case.

In context of the active sounding process, s[t] comprises five variables:

$$s[t] = \begin{bmatrix} x_0[t] \\ y_0[t] \\ p_a[t] \\ p_b[t] \\ p_c[t] \end{bmatrix}$$

where $x_0[t]$, $y_0[t]$, $p_a[t]$, $p_b[t]$, and $p_c[t]$ denote the location of the sounding source signal in x and y, and the three path loss parameters, respectively, at time index t. The time evolution of the state is modelled as a random walk, that is:

$$s[t+1] = s[t] + A[t]v[t]$$

where the process noise $v[t] \sim N(0_{5\times 1}, I_{5\times 5})$ are independent and identically distributed AWGN terms, with zero mean and variance given by the 5×5 identity matrix. The matrix A is given by:

$$A[t] = \begin{bmatrix} \sigma_x[t] & 0 & 0 & 0 & 0 \\ 0 & \sigma_y[t] & 0 & 0 & 0 \\ 0 & 0 & \sigma_a[t] & 0 & 0 \\ 0 & 0 & 0 & \sigma_b[t] & 0 \\ 0 & 0 & 0 & 0 & \sigma_c[t] \end{bmatrix}$$

where for example $\sigma_x[t]$ denotes the standard deviation of the position noise process at t. It should be appreciated that whilst here the model has been generalised to include time varying aspects of the sounding source location and the model parameters, in practice these quantities may remain static during the entire measurement process. Nevertheless, incorporating a time varying element into the process permits the use of the static Particle Filter algorithm as described in F. Gustafsson, and F. Gunnarsson, "Positioning using time-difference of arrival measurements", IEEE International Conference on Acoustics, Speech, and Signal Processing, 2003 (Proceedings, ICASSP '03).

Note also that z[t] is the measurement vector at t. In the present (active sounding) context the measurement may include the bearing $z_{\theta_m}[t]$ and RSSI measurements $z_{r_m}[t]$ at sensor m, or time difference of arrival $z_{r_{m,n}}[t]$ measured atm and n:

$$z_{\theta_m}[t] = \operatorname{atan}\left(\frac{y_0[t] - y_m}{x_0[t] - x_m}\right) + v_\theta[t]$$

$$z_{r_m}[t] = P - \left(\frac{p_a[t]}{2}\log_{10}((x_m - x_0[t])^2 + (y_m - y_0[t])^2) + p_b[t] + p_c[t]\log_{10}(f/5000)\right) + v_r[t]$$

$$z_{\tau_{m,n}}[t] = c^{-1}\sqrt{(x_m - x_0[t])^2 + (y_m - y_0[t])^2} - c^{-1}\sqrt{(x_n - x_0[t])^2 + (y_n - y_0[t])^2} + v_\tau[t]$$

Evaluation of the path loss model parameters may be performed by various algorithms. A first example algorithm is a single stage filter, which jointly estimates source location and path loss model parameters. A second example algorithm is a two stage filter. The first stage can be by-passed if the sounding (transmitting) node coordinates are known. Recall that they may be communicated to the receiver by the BSON. If the sounding locations are not known, then the first stage particle filter is utilised to extract the sounding source's x, y coordinates from bearing and time difference of arrival measurements. The RSSI measurements, together with the x, y sounding node location estimates, are input to the second stage particle filter that computes the WINNER2 path loss model parameters. A notable feature of this arrangement is the replacement of a 5-dimensional search space into two smaller sub-problems. In the first sub-problem location estimates ($\hat{x}_0$, $\hat{y}_0$) are computed. The location estimates are used in the path loss terms of the RSSI measurements instead of the unknown sounding location ($x_0$, $y_0$). Thus the RSSI measurement is approximated by $$z_{\hat{r}_m}[t] = P - \left(\frac{\hat{p}_a}{2}\log_{10}((x_m - \hat{x}_0)^2 + (y_m - \hat{y}_0)^2) + \hat{p}_b + \hat{p}_c\log_{10}(f/5000)\right) + v_r[t]$$

Importantly, as a by-product of either of the example first or second algorithms, the path loss between source node 0 and destination (receiver) node m is derived as follows:

$$PL_{0,m} = \frac{\hat{p}_a}{2}\log_{10}((x_m - \hat{x}_0)^2 + (y_m - \hat{y}_0)^2) + \hat{p}_b + \hat{p}_c\log_{10}(f/5000)$$

Despite the detailed mathematical background set out above, it should be appreciated that the essence of the active sounding process is to compute the node-to-node path losses, which may be simply derived by subtracting the RSSI from the transmission power. The two particle filter algorithms described are useful, but non-essential tools. Nevertheless, this usefulness is realised in two ways. Firstly, they may be used to verify the node locations. Secondly, and in practice more importantly, they help to determine whether there is a Line of Sight (LOS) link between two nodes and if not, to measure the deviation from the free space path loss model where $p_a$=20, $p_b$=46.4, $p_c$=20. A network configuration may then be determined by the BSON engine by running an algorithm to match possible backhaul throughput (which for each possible node-node link in the network is dependent on the path loss calculated for that node-node link) with the current network demand. An example evolutionary algorithm which may be used in this way is described below with reference to FIGS. 28 to 36.

Figure 19:
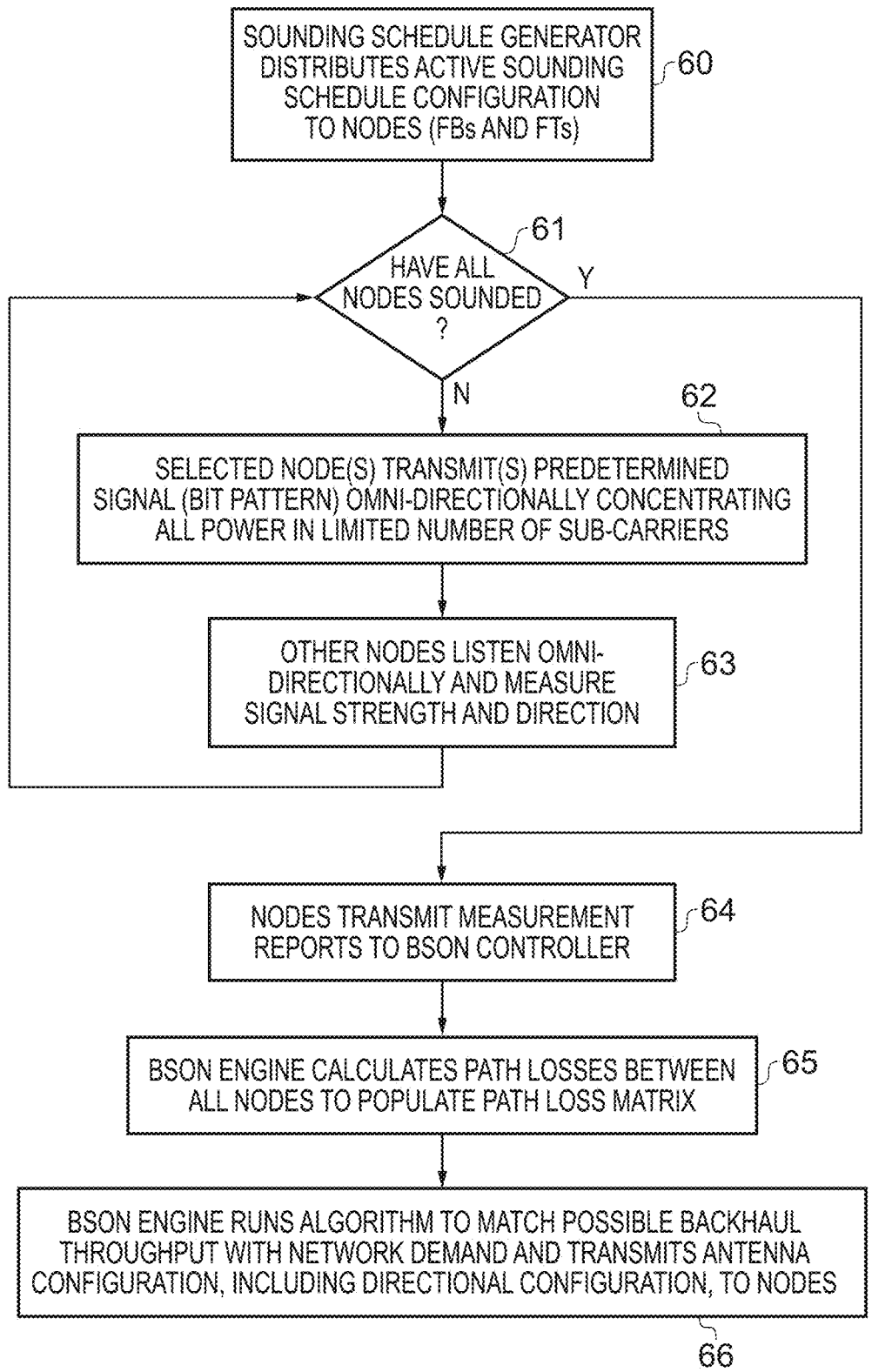
FIG. 19 shows a sequence of steps which are carried out in one embodiment when performing active sounding to assess the path loss between nodes.

FIG. 19 shows a sequence of steps which are taken when using an active sounding schedule to determine a set of path losses for the network and on that basis to configure to the antennas of the nodes in the network. The method begins at step 60, where the sounding schedule generator 47 (see FIG. 2) of the wireless network controller distributes an active sounding schedule configuration to the nodes (both feeder base stations and feeder terminals) of the wireless network. The nodes of the wireless network then cooperate to participate in the sounding schedule, and at step 61 it is determined if all nodes of the network have actively sounded. Of course at the first iteration this cannot be the case, and the flow proceeds to step 62. Here one or more selected nodes then transmits a predetermined signal (bit pattern) omni-directionally (using its omnidirectional (beacon) antenna). It should be noted that in some configurations only one node will transmit at any given time, but the predetermined signal, in particular the selection of subcarrier or subcarriers used for its transmission by each node, can be chosen such that more than one node can transmit at a time. The concentration of a transmitting node's transmission power into a specific, limited number of subcarriers, means that it is possible to allow simultaneous sounding from more than one node to take place, without significant interference between those transmitting nodes occurring. Step 63 shows all other nodes in the wireless network which are not transmitting at this iteration listening omni-directionally and measuring signal strength and direction. The flow then returns to step 61 for one or more further nodes to carry out their sounding, this iterative process around steps 61, 62 and 63 continuing until all nodes have sounded. The flow then proceeds to step 64 where the nodes of the wireless network which have participated in this active sounding procedure then transmits their measurement reports to the wireless network (BSON) controller. At step 65, the BSON engine within the wireless network controller and then calculates a set of path losses between all nodes which have participated in the active sounding procedure in order to populate a 2-D path loss matrix. Finally, at step 66, the BSON engine then runs an algorithm to match possible backhaul throughput (which for each possible node-node link in the network is dependent on the path loss calculated for that node-node link) with the current network demand. This algorithm can vary model parameters including, for each node, the antenna pattern, the antenna direction, and the antenna transmission power, as well as the choice of node-node pairing for data transmission. An optimised (or at least improved, where possible) network topology including antenna configurations for each node, is then communicated to all relevant nodes in the network.

Figure 20:
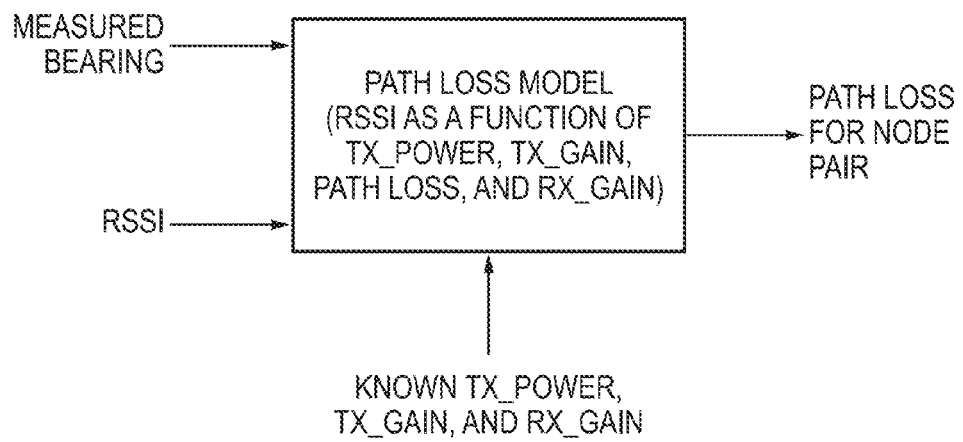
FIG. 20 schematically illustrates the calculation of a path loss for a node pair using a path loss model.

FIG. 20 schematically illustrates the use of a path loss model, as outlined above, to determine a path loss for a given node-node pair. The RSSI measurement made by the receiving node for the transmitting node, together with the measured bearing of the signal received by the receiving node from the transmitting node, are input into a the log-domain RSSI equation given above, i.e.:

$$RSSI = TX\text{power} + TX\text{antennaGain} - PL + RX\text{antennaGain}$$

where the path loss PL is the only unknown in the case of an active sounding transmission from the transmitting node to the receiving node.

Figure 21:
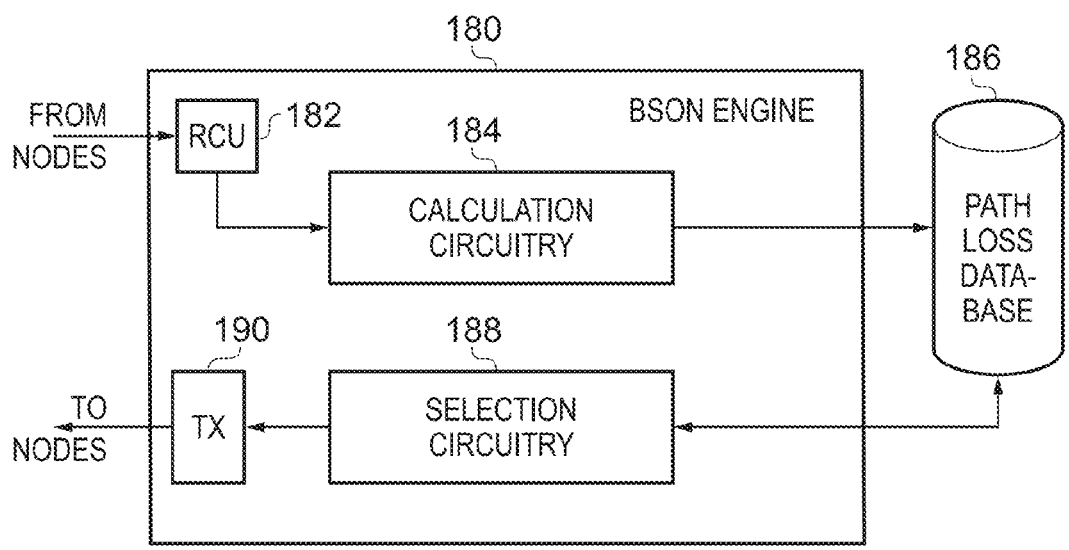
FIG. 21 schematically illustrates some components of a wireless network controller in one embodiment.

FIG. 21 schematically illustrates some components of a BSON engine 180 in one embodiment. Measurement reports are received by a report collection unit (RCU) 182 and passed to calculation circuitry 184 which, in the manner described above, determines a set of path losses for each node-node pair which participated in the active sounding process, and this set is stored in the path loss database 186. Selection circuitry 188, on the basis of the set of path losses stored in the path loss database 186, then determines a revised configurations for the network, both in terms of the selected node-node pairs for the data transmission, and the individual antenna configurations of each node. These revised configurations are then passed to the transmission circuitry 190 which communicates these to the nodes of the network.

Figure 22:
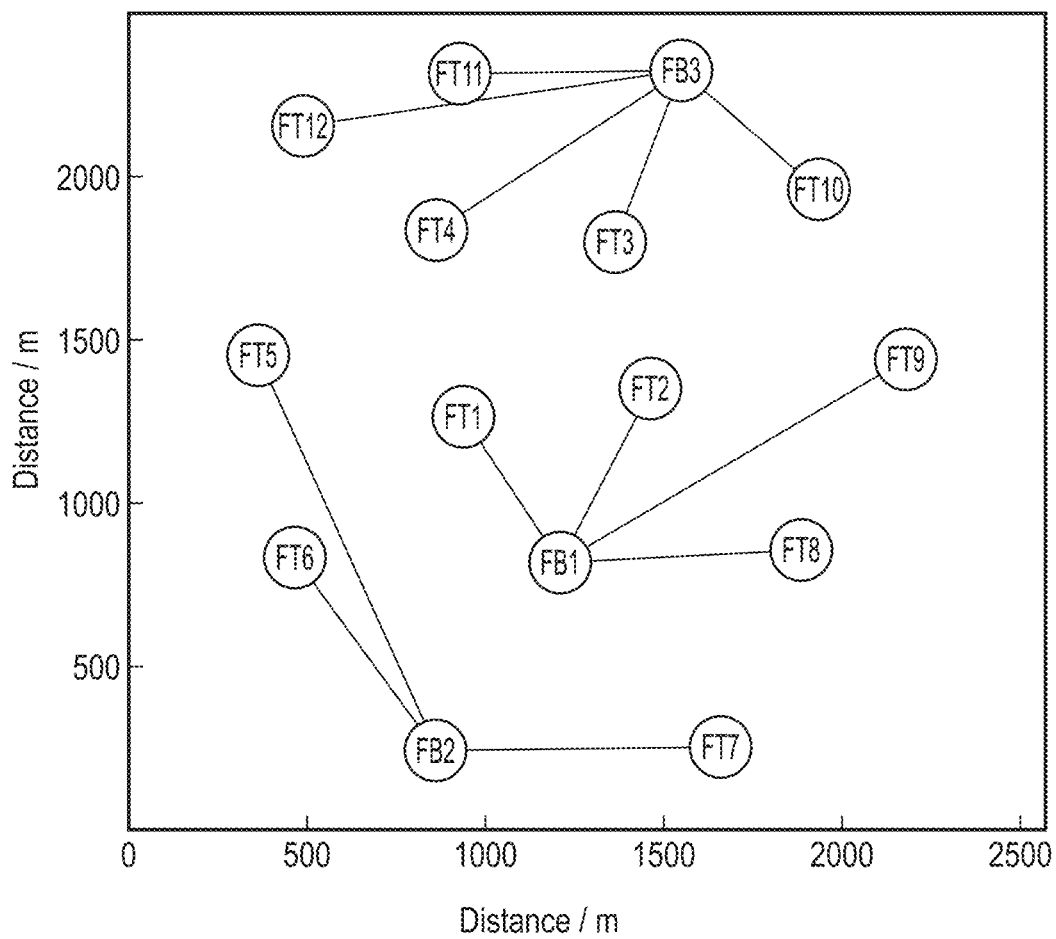
FIG. 22 shows an example set of selected node pairs for data transmission in a wireless network, selected on the basis of a set of path losses calculated for all node pairs.

FIG. 22 shows an example set of three feeder base stations and twelve feeder terminals which have participated in an active sounding process under the control of a wireless network controller, and following a determination of the path losses for each node-node pair, each feeder terminal has been paired with one of the three feeder base stations, as shown by the links in the figure.

Figure 23:
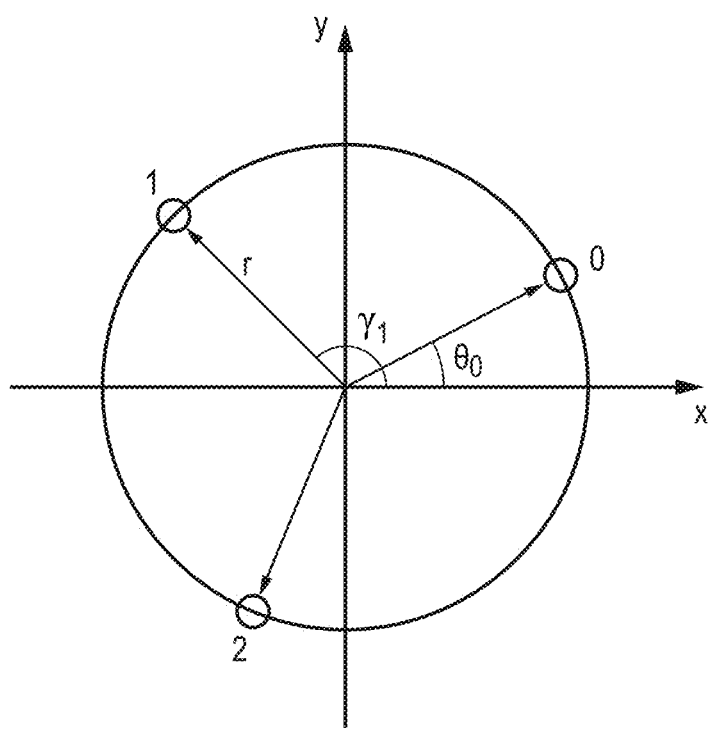
FIG. 23 schematically illustrates the geometry of a uniform circular array in one embodiment.

FIG. 23 schematically illustrates the geometry of a uniform circular array (UCA), i.e. beacon antenna, such as that shown as item 74 in FIG. 3 or item 86 FIG. 4. The schematic representation shows the three (omnidirectional) antenna elements 0-2 set out on a circle of radius r. The orientation of this array of antenna elements, e.g. the angular offset $\theta_0$ of the first element of the array relative to East shown, is known for example from deployment of this antenna apparatus. This permits angle of arrival estimates to be measured in global (absolute) coordinates, and angle $\gamma_1$ shows the (global coordinate) angle of antenna element 1 relative to East. This beacon antenna is used on the one hand for locating other nodes (antennas) belonging to the same (intra-system) network and to characterise the transmission paths from those other nodes to this antenna (in particular in terms of the path loss encountered). On the other hand this beacon antenna is also used to characterise the interference generated by inter-system nodes, i.e. coming from external sources.

Figure 24:
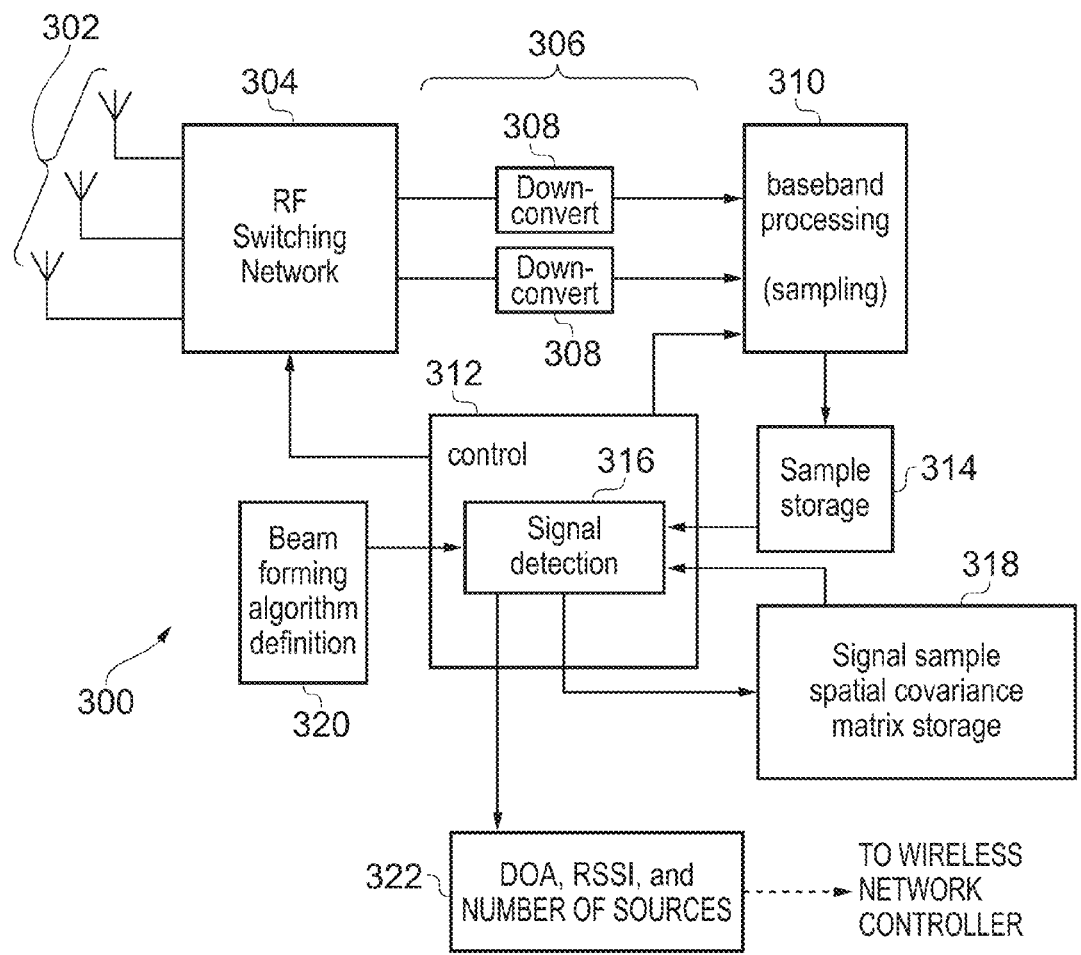
FIG. 24 schematically illustrates some components of an antenna apparatus in one embodiment.

FIG. 24 schematically illustrates some components of an antenna apparatus 300 in one embodiment. Nevertheless only those components of particular relevance to a discussion of sub-sampling the array of antenna elements are shown in the figure and other components of the antenna apparatus can be inferred from the other figures herein. The set of antenna elements 302 shown corresponds to the omnidirectional antenna elements of a beacon antenna of this antenna apparatus. Accordingly, these antenna elements 302 correspond to the beacon antenna 74 of FIG. 3 and the uniform circular antenna array 86 of FIG. 4. However, by comparison to FIG. 4 a notable feature of the arrangement shown in FIG. 24 is that fewer RF chains than antenna elements are provided. Specifically, in the example embodiment shown in FIG. 24, three antenna elements, but only two RF chains are present. This enables the antenna apparatus to be more cheaply and compactly provided, but a mechanism must then also be provided in order to appropriately connect the antenna elements. This mechanism is provided by the RF switching network 304 which couples the antenna elements 302 to the RF chains 306. The RF chains 306 each comprise respective down-conversion circuitry 308. Comparing to FIG. 4, the down conversion circuitry 308 comprises elements such as the gain circuitry 104 and the phase circuitry 108. Signals received by the antenna elements 302 and down-converted by the RF chains 306 are processed by the baseband processing circuitry (sampling circuitry) 310. Which of the antenna elements 302 are connected to the RF chains 306 is determined by the control circuitry 312. The control circuitry 203 replaces the control circuitry 90 of FIG. 4. Most importantly in the present context, the control circuitry 312 and administers an iterative process by which pairs of the antenna elements 302 are coupled to the two RF chains in order to sample the signals received. It should be noted that this may be part of a passive sounding procedure to assess external interference sources or may equally be part of an active sounding procedure to assess the influence of the environment in which this antenna apparatus and at least one other antenna apparatus are deployed on the ability of this antenna apparatus to receive data transmissions from that at least one other antenna apparatus. Both are referred to here as a "signal detection process". As a brief aside with regard to the type of sounding, note that there is no need to populate all subcarriers for active sounding, whilst this is needed for passive sounding, since there is no a priori knowledge of how what form of signal the external interference source will represent. Also, note that in principle active sounding can happen in parallel with data transmission, but is limited by the number of RF chains and by the allocation of OFDM frames. Whilst it would be desirable to continually maximise data transmission and reception, it is necessary to allocate one OFDM signal/subcarrier for this active sounding, which necessarily reduces the data throughput budget. Active sounding may therefore be scheduled for a period in the day when data transmission rates are likely to be low.

In performing such assessments the control circuitry 312 controls the antenna apparatus 300 such that the Direction of Arrival (DOA) (or Angle of Arrival (AoA)) and the Received Signal Strength Indicator (RSSI) of the co-channel signals impinging onto the antenna apparatus are estimated. Simultaneous sampling of more than one (in this example embodiment, two out of three of the) antenna elements facilitates the DOA measurements. The antenna apparatus 300 further comprises signal sample storage 314, into which the sampling circuitry 310 stores samples taken at each iteration of the signal detection process. Moreover, several iterations of the signal detection process may by run, each providing a "snapshot" of the signals sampled by all antenna elements, and stored in the sampling circuitry 310 before these samples are processed to generate a signal sample spatial covariance matrix. These signal samples are retrieved by the signal detection circuitry 316 which forms part of the control circuitry 312 and which, as will be described in more detail below, iteratively generates a signal sample spatial covariance matrix derived from the signal samples taken in the signal detection process and stored in the sample storage 314. The signal sample spatial covariance matrix storage 318 is provided for the storage and updating of this signal sample spatial covariance matrix. It should be appreciated that sample storage 314 and signal sample spatial covariance matrix storage 318 may for example be provided by a single memory device, to which the control circuitry 312 has access. Generating the signal sample spatial covariance matrix may be done afresh at each rerun of the signal detection process, or, depending on the control circuitry settings, may instead comprise retrieving a previously generated signal sample spatial covariance matrix from the signal sample spatial covariance matrix storage 318 and updating it with the measurements made at this run of the signal detection process. Once a complete signal sample special covariance matrix has been generated, the signal detection circuitry 316 makes use of a beamforming algorithm (which in this example is stored within the antenna apparatus as a beamforming algorithm definition 320, which itself may also be stored within the above-mentioned single memory) in order to generate specific parameterisations of the signal sources observed. In this example these are a DOA estimate, an RSSI estimate, and an indication (discrete estimate) of the number of sources, shown as item 322 in FIG. 24. These estimates may remain locally stored for a while, but will ultimately typically be communicated further to a wireless network controller, which receives such estimates from a number of antenna apparatuses in the wireless network, and which will then seek to improve the wireless network configuration in the light of these interference estimates where possible.

Figure 25:
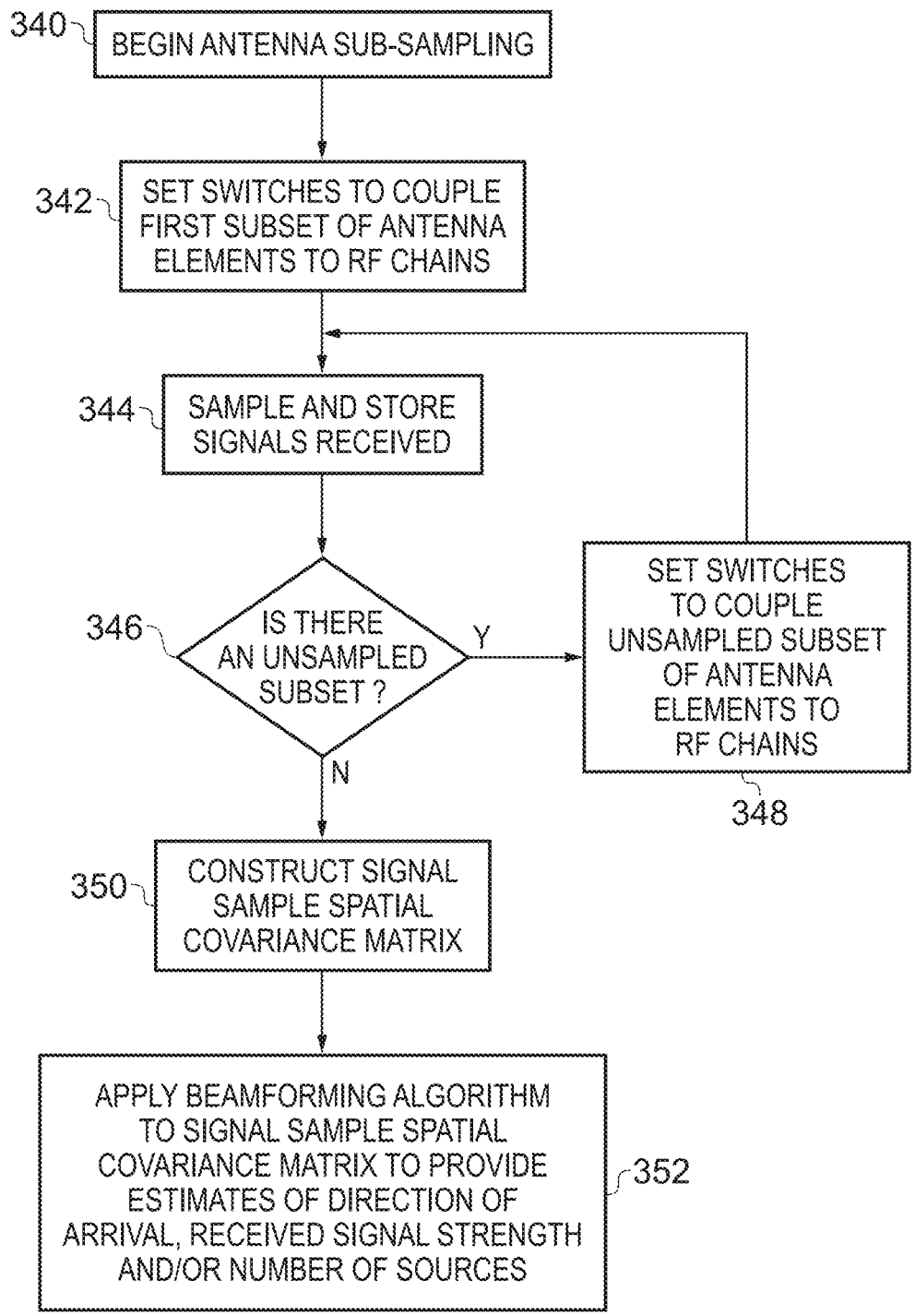
FIG. 25 shows a sequence of steps which are taken in operating an antenna apparatus in one example embodiment in order to perform signal detection process.

FIG. 25 shows a sequence of steps which are taken in operating an antenna apparatus in one example embodiment in order to perform the signal detection process. Reference is made to the example components of FIG. 24. The flow begins at step 342 and proceeds to step 340, where the control circuitry 312 sets the switches of the RF switching network 304 in order to couple a first subset of the antenna elements to the RF chains 306. Then at step 344 the control circuitry 312 controls the sampling circuitry 310 to sample the signals received by this subset of the antenna elements and to store the results in the sample storage 314. It is then determined at step 346 if there is a further subset (permutation of pairs) of the antenna elements which has not yet been sampled. When this is the case the flow proceeds to step 348, where the control circuitry 312 controls the RF switching network 304 to couple an identified unsampled subset of the antenna elements to the RF chains 306. The flow then returns to step 344. Once all such subsets (pair permutations) of the antenna elements have been sampled in this way then from step 346 the flow proceeds to step 350 where the signal detection circuitry 316 of the control circuitry 312 constructs a signal sample spatial covariance matrix using the samples stored in the sample storage 314. More detail of this construction is given below. It should be noted that, for clarity, only the sampling of one "snapshot", and the subsequent construction of a signal sample spatial covariance matrix, is shown in FIG. 25, but as mentioned, several snapshots may be taken and stored before the signal sample spatial covariance matrix is generated from the combination of those snapshots, and for this purpose a decision point (if further snapshots are required) and return path from the "No" exit of step 346 can be added to lead back to step 340. Finally the flow then proceeds to step 352, where the signal detection circuitry 316 applies the beamforming algorithm to the signal sample spatial covariance matrix to provide estimates of the direction of arrival, the received signal strength and/or the number of sources of the signals observed.

Some more detailed description of a (signal sample) spatial covariance matrix and a beamforming algorithm is now provided, in the context of the example antenna apparatus shown in FIG. 24, i.e. which has three antenna elements and thus the spatial covariance matrix is a 3×3 matrix in this example. The spatial covariance matrix R is not known in advanced and needs to be estimated from the received data. The sampled spatial covariance matrix $\hat{R}$ using T snapshots is given by $$\hat{R} = \frac{1}{T}\sum_{t=1}^{T} x(t)x^H(t)$$

The eigendecomposition of the 3×3 spatial covariance matrix R can be written as $$R = E_s \Lambda_s E_s^H + E_n \Lambda_n E_n^H$$

where $\Lambda_s$ and $\Lambda_n$ are diagonal matrices corresponding to the eigenvalues of the signal and the noise subspaces, respectively, whereas the columns of the matrices $E_s$ and $E_n$ comprise the eigenvectors of the signal and the noise subspaces of R, respectively. $E_s$ and $E_n$ are orthogonal, i.e. g $E_s^H E_n = 0$ and $E_n^H E_s = 0$. In this example, the DOA and signal power estimation is performed by using the Multiple Signal Classification (MUSIC) beamforming algorithm as described in R. Schmidt, "Multiple emitter location and signal parameter estimation," IEEE Transactions on Antennas and Propagation, vol. 34, no. 3, pp. 276-280, 1986. MUSIC is a subspace method that can provide asymptotically unbiased estimates of the number of incident wavefronts (i.e. sources) present, the directions of arrival (DOA), and the strengths and cross correlations among the incident waveforms. The MUSIC spectrum is given by $$P_{MU}(\phi) = \frac{1}{a^H(\phi) E_n E_n^H a(\phi)}$$

where $a(\varphi)$ is the steering vector (or spatial signature) of the array element corresponding to angle $\varphi$. Note that the peaks of $P_{MU}(\varphi)$ indicate a possible signal source. For an UCA the spatial signature is given by $$a(\phi) = \begin{bmatrix} e^{j\frac{2\pi r}{\lambda}\cos(\phi-\gamma_0)} \\ e^{j\frac{2\pi r}{\lambda}\cos(\phi-\gamma_1)} \\ \vdots \\ e^{j\frac{2\pi r}{\lambda}\cos(\phi-\gamma_{N-1})} \end{bmatrix}$$

where $\lambda$ denotes the wavelength of the radiated signal. N(=3 in this example) denotes the number of elements in the array. $a(\varphi)$ here implies that the antenna elements are omni-directional with unit gain. If the first element is located at an angle $\theta_0$ relative to the positive x-axis, the angular displacement $\gamma_n$ of the $n^{th}$ element is given by $$\gamma_n = \theta_0 + 2\pi\frac{n}{N}$$

for $n = 0, 1, \ldots, N-1$.

Now let K denote the number of impinging signals on the array at angles $\varphi_1, \varphi_2, \ldots, \varphi_K$. The signal received by the array at time instant t is given by $$y(t) = \sum_{k=1}^{K} a(\phi_k)s_k(t) + n(t) = As(t) + n(t)$$

where $s(t)=[s_1(t), s_2(t), \ldots, s_K(t)]^T$, $s_k(t)$ is the signal from the $k^{th}$ source, n(t) is the independent and identically distributed (i.i.d.), zero mean, Additive White Gaussian Noise (AWGN) term with covariance $\sigma^2 I$, and $A=[a(\varphi_1), a(\varphi_2), \ldots, a(\varphi_K)]$ is the observation matrix. The spatial covariance matrix is given by $$R = E\{y(t)y^H(t)\} = APA^H + \sigma^2 I$$

where the diagonal matrix P denotes the average received signal power as measured at a single antenna element. Taking into account the activity factor, the transmission (TX) power, the path loss and the processing gain, the received power matrix P is given by:

$$P = \begin{bmatrix} p_1 g_1 & 0 & \cdots & 0 \\ 0 & p_2 g_2 & 0 & \vdots \\ \vdots & \ddots & \ddots & 0 \\ 0 & \cdots & 0 & p_K g_K \end{bmatrix}$$

Figure 26:
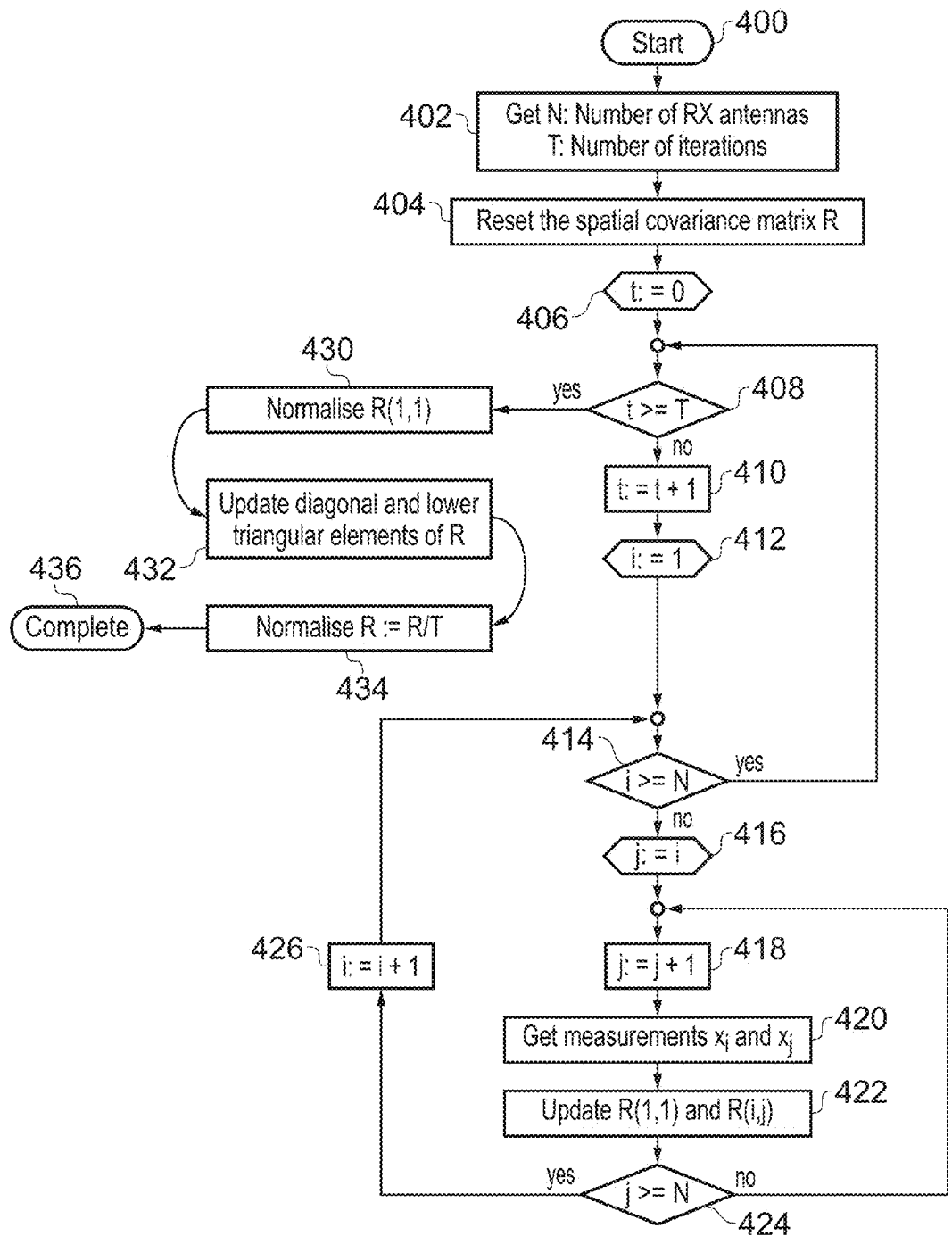
FIG. 26 shows a sequence of steps which are taken in the method of one embodiment to generate a signal sample spatial covariance matrix.

FIG. 26 shows a sequence of steps which are taken in the method of one embodiment to generate the signal sample spatial covariance matrix. The flow begins at step 400 and proceeds to step 402 where the number of (RX) antenna elements is set as a variable N and the required number of iterations of the signal detection process is set as variable T. Then at step 404 the spatial covariance matrix R is reset. At step 406 an iteration variable t is set to zero. Then at step 408 it is determined if t is equal to or exceeds T (and of course at the first iteration it will not). The flow then proceeds to step 410 where t is incremented and at the following step 412 an antenna element loop iteration variable i is set to zero. At step 414 it is determined if i is greater than or equal to N. This not being the case the flow proceeds to step 416 where a further antenna element loop iteration variable j is set to the value of i. Then, at step 418, j is incremented, such that now i and j represent the indices of two antenna elements which have not yet been paired for signal sample gathering. At step 420 measurements for antenna elements $x_i$ and $x_j$ are made, and at step 422 the spatial covariance matrix elements R(1,1) and R(i,j) are updated. More detail of this updating is given below. Then at step 424 it is determined if j is greater than or equal to N, and whilst this is not the case the flow iterates through steps 418, 420 and 422 again. Once j reaches N, i.e. antenna element i has been paired with all other antenna elements of higher index, then the flow proceeds to step 426 where i is incremented and then to step 414 to determine once more if i has reached N. Once this is the case the flow returns to step 408. Further iterations of the signal detection process, iteratively taking measurements from all antenna element pairs, are then carried out until t becomes equal to or exceeds T and the flow branches to step 430. There the value accumulated in the matrix element R(1,1) is normalised on the basis of the number of antenna elements (N) and at step 432 the diagonal and lower triangle elements of matrix R are updated (more detail below). At step 434 all elements of the matrix normalised on the basis of the number of iterations (T) of the signal detection process carried out. The procedure is complete at step 436. It will be appreciated from a consideration of FIG. 26 that a "batch" process is therefore described in this example embodiment in which T iterations of the signal detection process are carried out and one resulting spatial covariance matrix is generated.

Referring back to the "Update R(1,1) & R(i,j)" step 422 of FIG. 26, this comprises the following accumulations:

$R(1,1):=R(1,1)+x_i x_i^*+x_j x_j^*$ $R(i,j):=R(i,j)+x_i x_j^*$

It should therefore be noted that the matrix element R(1,1) (essentially a power measurement) is updated with zero lag autocorrelation measurements from all antenna elements (i.e. not just from antenna element 1) being added to the existing value of that element, whilst matrix element R(i,j) is updated with zero lag cross-correlation measurements (from antenna element pair (i,j) being added to the existing value of that element.

The "Normalise R(1,1) step 430 of FIG. 26 comprises the following calculation:

$$R(1,1) := \frac{R(1,1)}{N(N-1)}$$

Note that R(1,1) is therefore normalised by a value which is double the number of antenna element pair combinations (N(N−1)/2), since at each accumulation step for R(1,1) both the $x_i x_i^*$ and the $x_j x_j^*$ terms are added, and double the power is thus accumulated. The "Update diagonal and lower triangular elements of R" step 432 of FIG. 26 comprises the following allocations:

$R(n,n):=R(1,1)$, for $n=2:N$ $R(n,m):=R^*(m,n)$, for $n=2:N, m=1:n-1$

Thus the now-normalised power value for antenna element 1 is reproduced for the other antenna elements, and cross-correlation values in the upper triangle of the matrix are conjugated and index-swopped to populate the lower triangle of the matrix.

Figure 27:
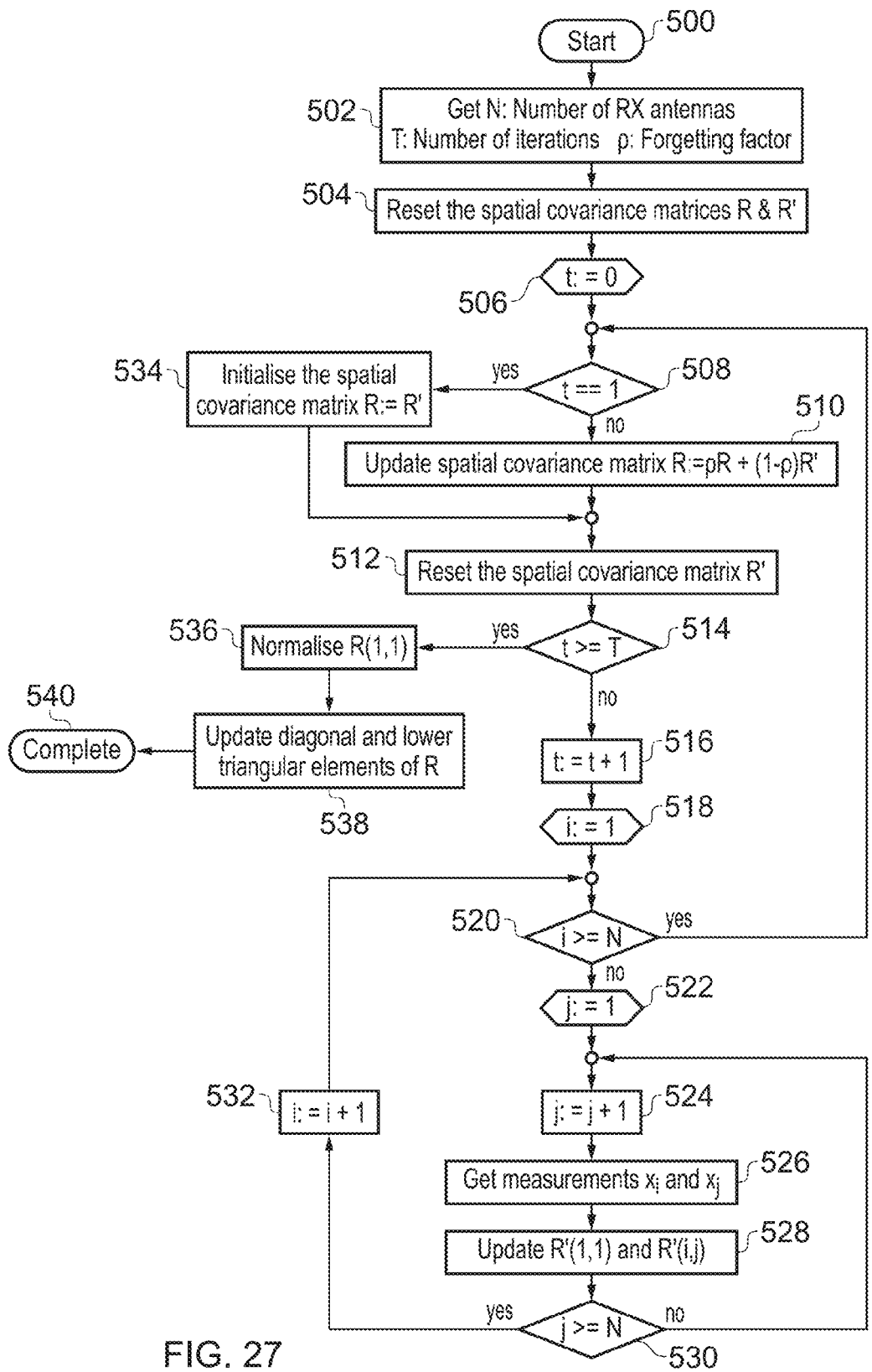
FIG. 27 shows a sequence of steps which are taken in the method of one embodiment to generate a signal sample spatial covariance matrix.

FIG. 27 shows a variant on the method shown in FIG. 26, in which a modified sequence of steps are taken in the method of one embodiment to generate the (signal sample) spatial covariance matrix, where the accumulation of R further makes use of a time-evolution factor ρ (also referred to as a "forgetting factor"), such that respective weightings may be applied to the current sample matrix R' and the previously accumulated sample matrix R as follows:

$R:=\rho R+(1-\rho)R'$

Note that the respective weightings applied to the current measurements and the previous measurements thus sum to one, and the ρ may be freely set in the range (0,1) in dependence on the desired influence that the current measurements and the previous measurements should have on the resulting matrix. For example, for parametrising the results of an active sounding procedure, ρ may be chosen to be close to 0, thus permitting rapid adaptation of R since the sounding signal is known. On the other hand, for parametrising the results of a passive sounding procedure ρ may be set to a value close to 1 (typically ρ=0.95) to permit long term averaging and at the same time allow R to adapt to time varying signals.

The flow of FIG. 27 begins at step 500 and proceeds to step 502 where the number of (RX) antenna elements is set as a variable N, the required number of iterations of the signal detection process is set as variable T, and the "forgetting factor" ρ is set. Then at step 404 the spatial covariance matrices R and R' are reset. At step 506 an iteration variable t is set to zero. Then at step 508 it is determined if t is equal to one (and of course at the first iteration it will not). The flow then proceeds to step 510, where the spatial covariance matrix R is updated as a linear combination of R and R', using the "forgetting factor" ρ as a weighting for R and (1−ρ) as a weighting for R'. The matrix R' is then reset at step 512. Then at step 514 it is determined if t is equal to or exceeds T (and of course at the first iteration it will not). The flow then proceeds to step 516 where t is incremented and at the following step 518 an antenna element loop iteration variable i is set to zero. At step 520 it is determined if i is greater than or equal to N. This not being the case the flow proceeds to step 522 where a further antenna element loop iteration variable j is set to the value of i. Then, at step 524, j is incremented, such that now i and j represent the indices of two antenna elements which have not yet been paired for signal sample gathering. At step 526 measurements for antenna elements $x_i$ and $x_j$ are made, and at step 528 the spatial covariance matrix R' is updated, for elements R'(1,1) and R('i,j). This is as described above. Then at step 530 it is determined if j is greater than or equal to N, and whilst this is not the case the flow iterates through steps 524, 526, and 528 again. Once j reaches N, i.e. antenna element i has been paired with all other antenna elements of higher index, then the flow proceeds to step 532 where i is incremented and then to step 520 to determine once more if i has reached N. Once this is the case the flow returns to step 508. On returning to this step for the first time, t will indeed be equal to one, and the flow branches for this iteration to step 534, where the spatial covariance matrix R is initialised using the values of the spatial covariance matrix R' which have just been calculated at the very first iteration. The flow then proceeds to step 512, and spatial covariance matrix R' is reset.

Further iterations of the signal detection process, iteratively taking measurements from all antenna element pairs, are then carried out until t becomes equal to or exceeds T and the flow branches to step 536. There the value accumulated in the matrix element R(1,1) is normalised and at step 538 the diagonal and lower triangle elements of matrix R are updated (as described above). The procedure is complete at step 540. It will be appreciated from a consideration of FIG. 27 that an "adaptive" process is therefore described in this example embodiment in which T iterations of the signal measuring process are carried out, allowing the resulting spatial covariance matrix to evolve over each iteration.

Whatever the source of the revised parameterisation of the environment, the optimisation of the network is then performed in one example embodiment by the BSON controller using an Evolutionary Algorithm (EA), as for example described in the articles T. Back, "Evolutionary Algorithms in Theory and Practice: Evolution Strategies, Evolutionary Programming, Genetic Algorithms", Oxford University, 1996, T. Bäck, U. Hammel, and H. P. Schwefel, "Evolutionary computation: comments on the history and current state", *IEEE Transactions on Evolutionary Computation*, vol. 1, pp. 3-17, April 1997. Online available at citeseerx.ist.psu(dot)edu/viewdoc/summary?doi=10.1.1.6.5943, and Weise T., "Global Optimization Algorithms, Theory and Application", it-weise.de/projects/book(dot)pdf.

Figure 28:
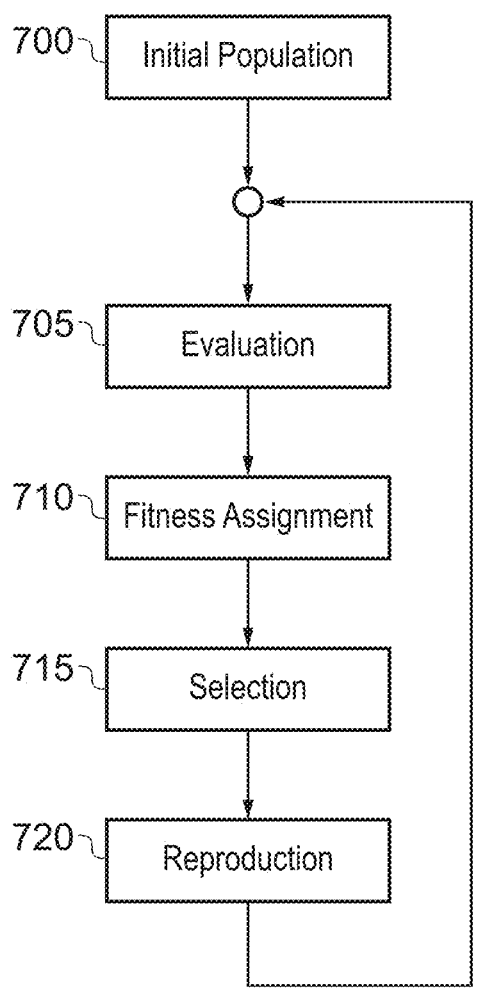
FIG. 28 is a flow diagram illustrating the basic steps of an evolutionary algorithm.

EAs are generic, population based, metaheuristic optimisation algorithms, largely inspired by biological mechanisms, such as mutation, crossover (reproduction) and selection (see page 95 of the above-mentioned "Global Optimization Algorithms, Theory and Application" document). The basic cycle of EAs is illustrated in FIG. 28 and it comprises five blocks (as discussed on page 96 of the above-mentioned "Global Optimization Algorithms, Theory and Application" document):

Initial Population (step 700)
Evaluation (step 705)
Fitness Assignment (step 710)
Selection (step 715)
Reproduction (step 720)

The reader is referred to the document "Global Optimization Algorithms, Theory and Application" for a general discussion on the functionalities of the above mentioned blocks. The following discussion will describe how the basic evolutionary algorithm approach illustrated in FIG. 28 is adapted to enable its use in the current situation to provide rapid updates of the network based on changing conditions. However, in general terms, the initial population stage 700 involves creating a set of individual entries, each individual entry in this case being an hypothesised optimised network. During the evaluation stage 705, each of the individuals in the population are evaluated, and hence in the current context the channel capacity for every feeder link in the network is computed for each hypothesised optimised network. Then, during fitness assignment step 710, for each link the channel capacity is converted to throughput. This throughput is compared against the target throughput and an associated reward is allocated to each link. A reward can then be calculated for each hypothesised optimised network.

The selection stage then involves applying a process to select the individuals (i.e. the hypothesised optimised networks) with high rewards more often than those with low rewards so that the individual entries with low fitness values will eventually be discarded and those with high values will enter the mating pool then used for the reproduction stage 720. At the reproduction stage, pairs in the mating pool are selected and for each pair offspring are created by combining or modifying the attributes of their parents. This results in a revised set of hypothesised optimised networks which can then be subjected to another iteration of the evolutionary algorithm.

Figure 29:
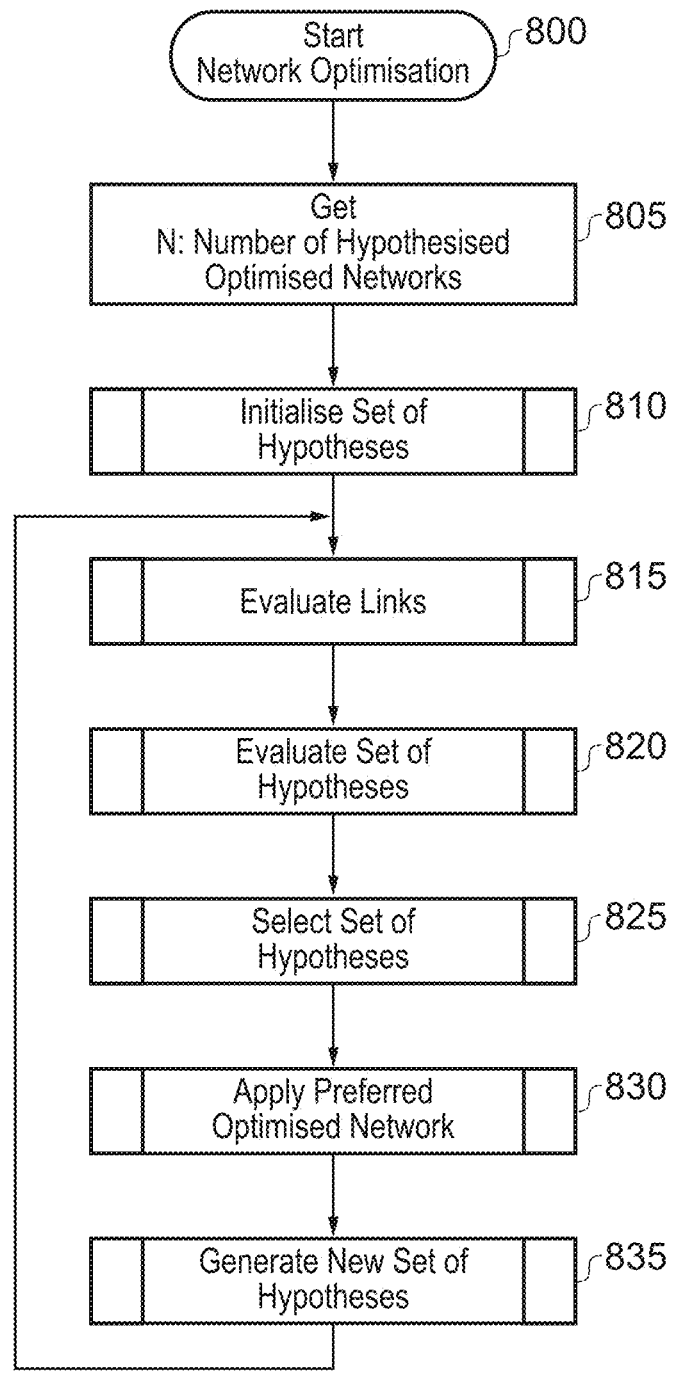
FIG. 29 is a flow diagram illustrating how an evolutionary algorithm is used in one embodiment to determine a revised network configuration.

FIG. 29 is a flow diagram illustrating the steps performed to compute and apply an optimised network configuration. At step 800, the process is started, whereafter at step 805 a variable N is set equal to the number of hypothesised optimised networks that are to be considered by the evolutionary algorithm. Thereafter, at step 810, a set of hypotheses are initialised. This process will be described in more detail later with reference to FIG. 30. Thereafter, a process of evaluating the various links between feeder terminals and feeder base stations is performed at step 815, this process being described later with reference to FIG. 31. Then, at step 820, the current set of hypotheses are evaluated based on the output of the link evaluation process, in order to associate a reward with each hypothesis in the set. This process will be described in more detail later with reference to FIG. 33. Thereafter, a selection process is performed at step 825 to select a modified set of hypotheses, this process being described in more detail later with reference to FIG. 34.

Then, at step 830, a process is performed to determine and apply a preferred optimised network configuration based on the modified set of hypotheses determined at step 825. For a system including a BSON, this process will be described in more detail later with reference to FIG. 36. It should be noted that whilst in FIG. 29 step 830 is shown as being performed on each iteration of the evolutionary algorithm, it does not need to be performed on each iteration, and instead can be performed merely as and when a predetermined trigger condition occurs. This trigger condition may be completion of the current iteration of the evolutionary algorithm, or may instead be a less frequently occurring trigger condition, such as an update to a certain traffic report, the receipt of updated sounding data, etc.

At step 835, a reproduction process is performed in order to produce a replacement set of hypotheses, after which the process returns to step 815. The process at step 835 will be discussed in more detail later with reference to FIG. 35.

A more detailed discussion of the steps 810 to 835 of FIG. 29 will now be provided with reference to the further flow diagrams.

Initialise Hypotheses

In this stage, multiple optimised network hypotheses are generated. Each hypothesis corresponds to a candidate optimised network. In one embodiment, an entry in the hypothesis consists of an uplink (UL) or downlink (DL) transmission and:

1. Feeder Base (FB) and a Feeder Terminal (FT) association.

2. Antenna Bearing (AB), specifying the azimuth orientation of the main directional antenna.
3. Transmit Antenna Pattern (TX AP), instructing the beam pattern to be used during transmission.
4. Relative Throughput Weight Coefficient (W), defining the relative throughput between the FTs connected to the same FB.
5. Link Quality Indicator (LQI); a measure of the quality of the data stream.

With reference to FIG. 22, an example hypothesis is given in Table 1 below. For clarity of discussion, first consider the third row in Table 1. In this example, $FB_1$ is linked to $FT_2$ in the DL transmitting at a bearing of 45 degrees. In addition, antenna pattern 1 and a relative throughput weight of 2 are specified. The LQI of 10 is also derived. To further clarify the significance of W, and based on Table 1, the DL throughput from $FB_1$ to $FT_2$ should be twice as high as the throughput to $FT_1$ and $FT_8$. The weights W are specified using the traffic demand information stored in the backhaul network configuration database 41 of FIG. 2. In the absence of traffic demand, the Ws are set to unity.

TABLE 1

Example hypothesised optimised network.

| FB | FT | UL/DL | AB | TX AP | W | LQI |
|----|----|-------|------|-------|---|-----|
| 1  | 1  | DL    | 145  | 1     | 1 | 8   |
| 1  | 2  | DL    | 45   | 1     | 2 | 7   |
| 1  | 8  | DL    | 45   | 1     | 1 | 10  |
| .  | .  | .     | .    | .     | . | .   |
| .  | .  | .     | .    | .     | . | .   |
| .  | .  | .     | .    | .     | . | .   |
| 3  | 3  | DL    | −135 | 1     | 1 | 9   |
| 3  | 4  | DL    | −135 | 1     | 1 | 7   |
| 1  | 1  | UL    | −45  | 3     | 2 | 8   |
| 1  | 2  | UL    | −120 | 3     | 1 | 10  |
| 1  | 8  | UL    | −180 | 3     | 1 | 7   |
| .  | .  | .     | .    | .     | . | .   |
| .  | .  | .     | .    | .     | . | .   |
| .  | .  | .     | .    | .     | . | .   |
| 3  | 3  | UL    | 60   | 3     | 1 | 8   |
| 3  | 4  | UL    | 45   | 3     | 2 | 9   |

Figure 30:
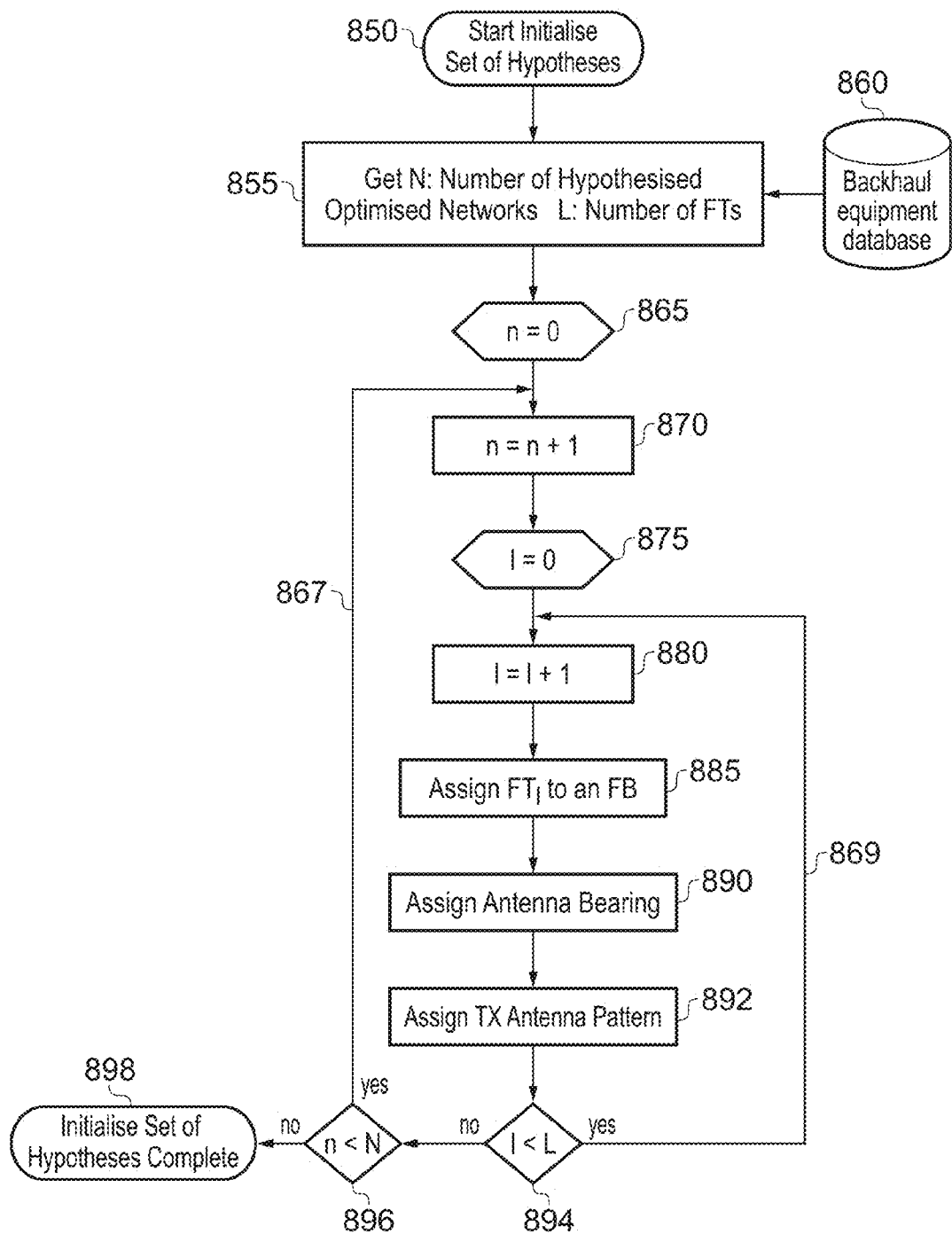
FIG. 30 is a flow diagram illustrating the process performed at step 810 of FIG. 29 in accordance with one embodiment.

FIG. 30 illustrates the steps for generating multiple optimised network hypotheses. Following start of the process at step 850 the number of FTs (L) is obtained at step 855 from the backhaul equipment database 860. In FIG. 30, two iterations take place—the outer loop 867 generates N hypotheses, whereas the inner loop 869 will, for each hypothesis $H_n$, assign an FT to a FB and assign an antenna bearing and a TX antenna pattern. Notice that the derivation of the LQIs has been omitted here. Their entries in the hypotheses are left empty, to be computed during the evaluation phase of the algorithm. In addition, the entries of the Ws have also been omitted here. Their entries are computed based on the FB to FT associations and the traffic demand. The entries are recomputed if there is a change in the FB-FT association or a change in the traffic demand.

Accordingly, considering FIG. 30 in more detail, a variable n is set equal to 0 at step 865, and it then incremented at step 870. Thereafter, a variable I is set equal to 0 at step 875, and then incremented at step 880. At step 885, feeder terminal I for hypothesised optimised network n is assigned to a FB. The association may be random, or based on distance. Thereafter, at step 890, an antenna bearing is assigned for feeder terminal I of the hypothesised optimised network n. The bearing is set equal to the direction towards the associated FB, or may be random. At step 892 an antenna pattern is assigned for feeder terminal I of hypothesised optimised network n. Recall that the backhaul equipment database 860 stores the geolocation of FT and FB nodes, and thus deriving the FT-FB relative bearing is straightforward. For example, the FB antenna bearing may point generally in the direction of its associated FTs using a wide (sector covering) antenna pattern, or alternatively, FB antenna bearing and antenna pattern may be assigned randomly.

At step 894, it is determined whether I is less than L, where (as discussed earlier) L denotes the number of feeder terminals. If it does, then the inner loop is repeated, beginning at step 880. However, if at step 894 it is determined that I is not less than L, then the process proceeds to step 896, where it is determined whether n is less than N (as discussed earlier N being the number of hypothesised optimised networks to be used by the evolutionary algorithm). If it is, then the outer loop is reiterated by returning to step 870. If it is not, then this indicates that all of the hypothesised optimised networks have been produced, and accordingly the process proceeds to step 898 where the initialisation of the set of hypotheses is considered to be completed. Note that the antenna bearings and beam patterns for the FBs can for example be assigned randomly at step 898.

Evaluate Links

In accordance with step 815 of FIG. 29, every FT/FB link within each hypothesis is evaluated. This phase is highly parallelised and may be implemented in a distributed fashion. During this phase, while considering the co-channel interference, the channel capacity for every link in the network is computed. The co-channel interference may originate from nodes in the wireless network itself (reuse one is the preferred multiple access technique), or originate from uncoordinated unsolicited nodes. The capacity is measured in bits per second per Hz and takes into account all implementation losses. The implementation losses are calculated at the FTs and communicated at the associated FBs and forwarded to the backhaul equipment database.

Figure 31:
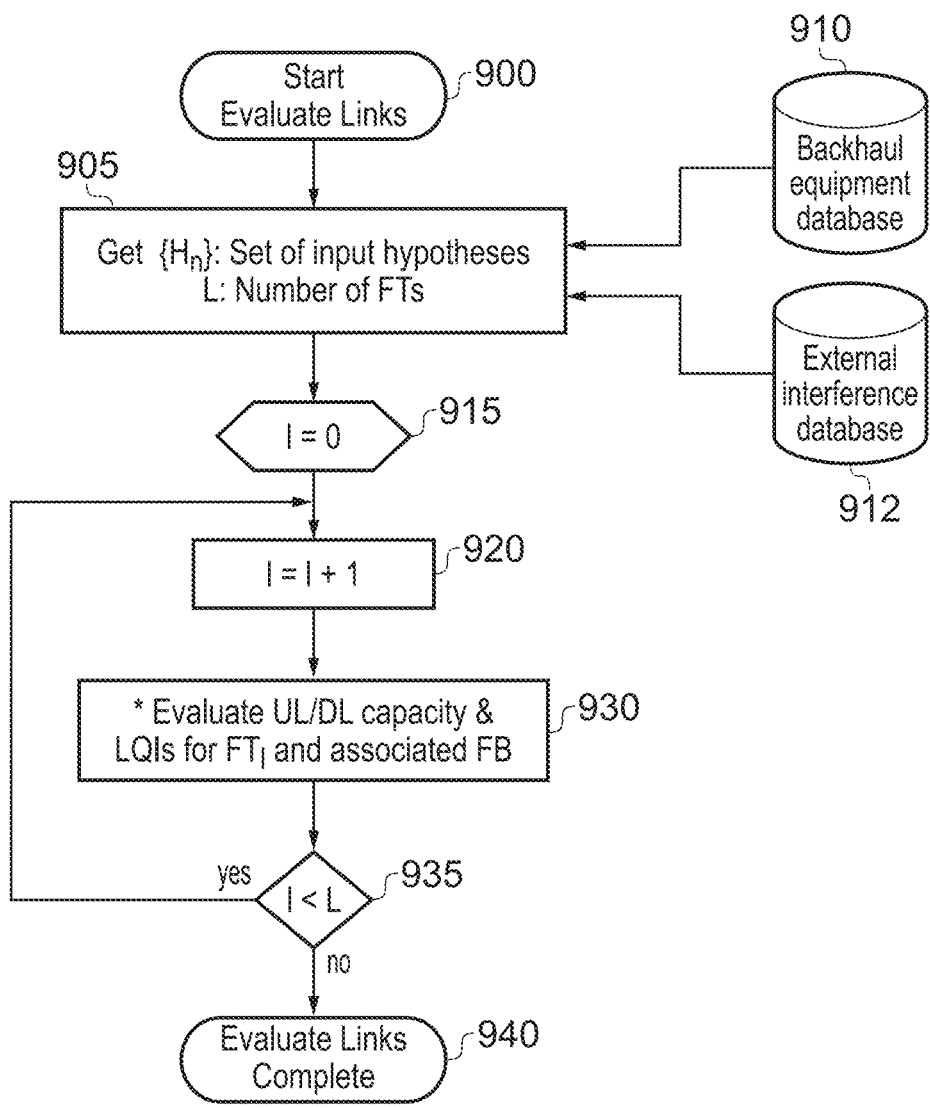
FIG. 31 is a flow diagram illustrating the process performed at step 815 of FIG. 29 in accordance with one embodiment.

FIG. 31 illustrates the steps for evaluating the links, i.e. corresponding to step 815 of FIG. 29. In summary, for each FT, the UL and DL capacities are evaluated. Parallelisation is indicated by the asterisk in the figure. Considering FIG. 31 in more detail, at step 900, the process starts, whereafter at step 905 the set of input hypotheses and the number of feeder terminals in the system are obtained from the network parameters of backhaul equipment database 910. Thereafter, at step 915, a variable I is set equal to 0, and is then incremented at step 920. At step 930, the uplink and downlink capacities and LQIs are evaluated for feeder terminal I, again across all hypotheses. This process can be highly parallelised, given the separate nature of the individual hypotheses. During step 930, the computed LQIs take into account the unsolicited and uncoordinated transmissions characterised by the external interference database of 912. At step 935 it is determined whether the variable I is less than the total number of FTs, and if so the process loops back to step 920. However, when it is determined at step 935 that the variable I is no longer less than the number of FTs, and accordingly all FTs have been analysed, then the process proceeds to step 940, where the evaluate links process is considered complete.

Evaluate Hypotheses

Figure 32:
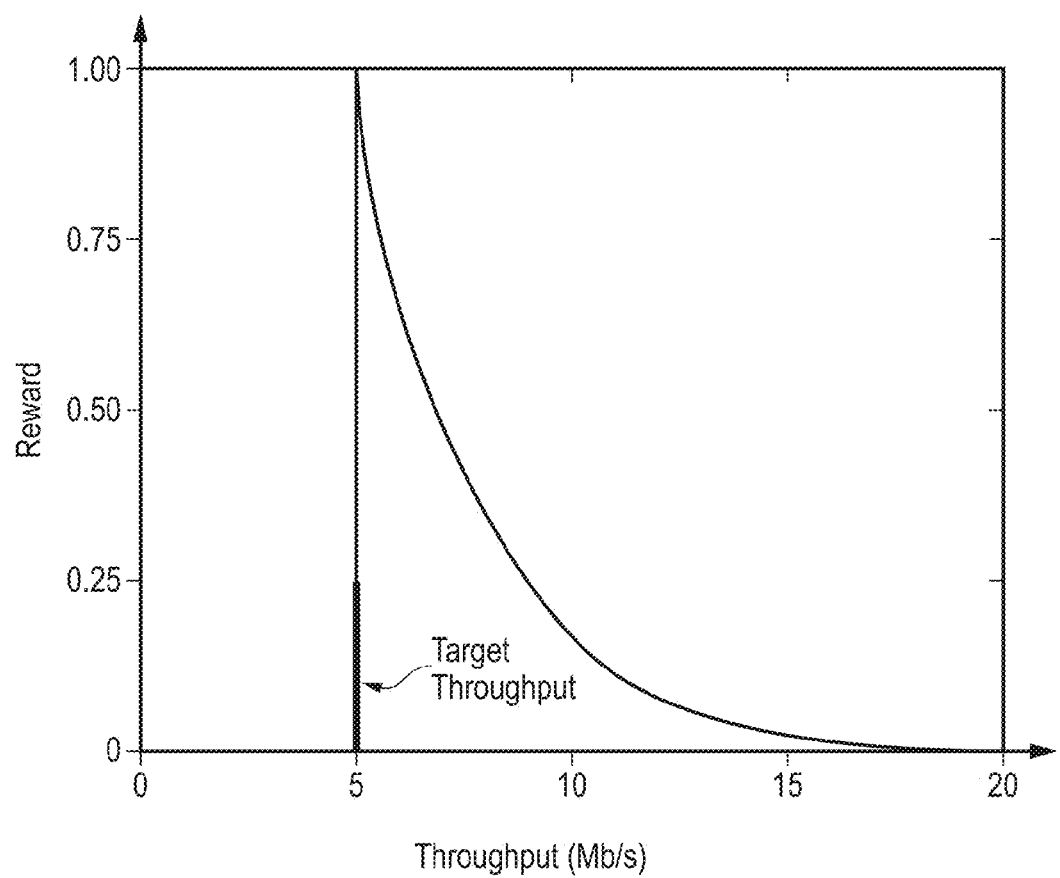
FIG. 32 shows an example reward function for evaluating a hypothesis in one embodiment.

Here each hypothesis $H_n$ is awarded a score $r_n$. As a rule, the higher the score the better the hypothesis. For each link, the channel capacity per link is converted to throughput (bits per second). The throughput per link is checked against the target throughput. A reward is then allocated to each link. The reward, which is a positive value, is a function of the offered throughput and the desired throughput. An example reward function is given in FIG. 32. In FIG. 32, no reward is allocated if the offered traffic in a link is less than the desired throughput. A maximum reward is allocated to a link if the target is met. A diminishing reward is applied if the offered traffic far exceeds the target throughput. Throughput targets are time and location dependent, that is, a certain link may demand different amounts of traffic depending on the time of day. Furthermore, it may also be expected that business districts will be heavily loaded during the day and lightly loaded during the night or during public holidays; the reverse may be true in suburban areas.

For each hypothesis, the vector of (total) rewards is mapped to a single scalar that determines the overall fitness value of the hypothesis. There are a number of mapping functions, for example:

Mean (arithmetic or harmonic): this yield an average fitness value;

$x^{th}$ percentile: (for example the $5^{th}$ percentile) that ensures (100-x) percent of links have the same or better fitness value;

min: returns the fitness value of the worst link.

Figure 33:
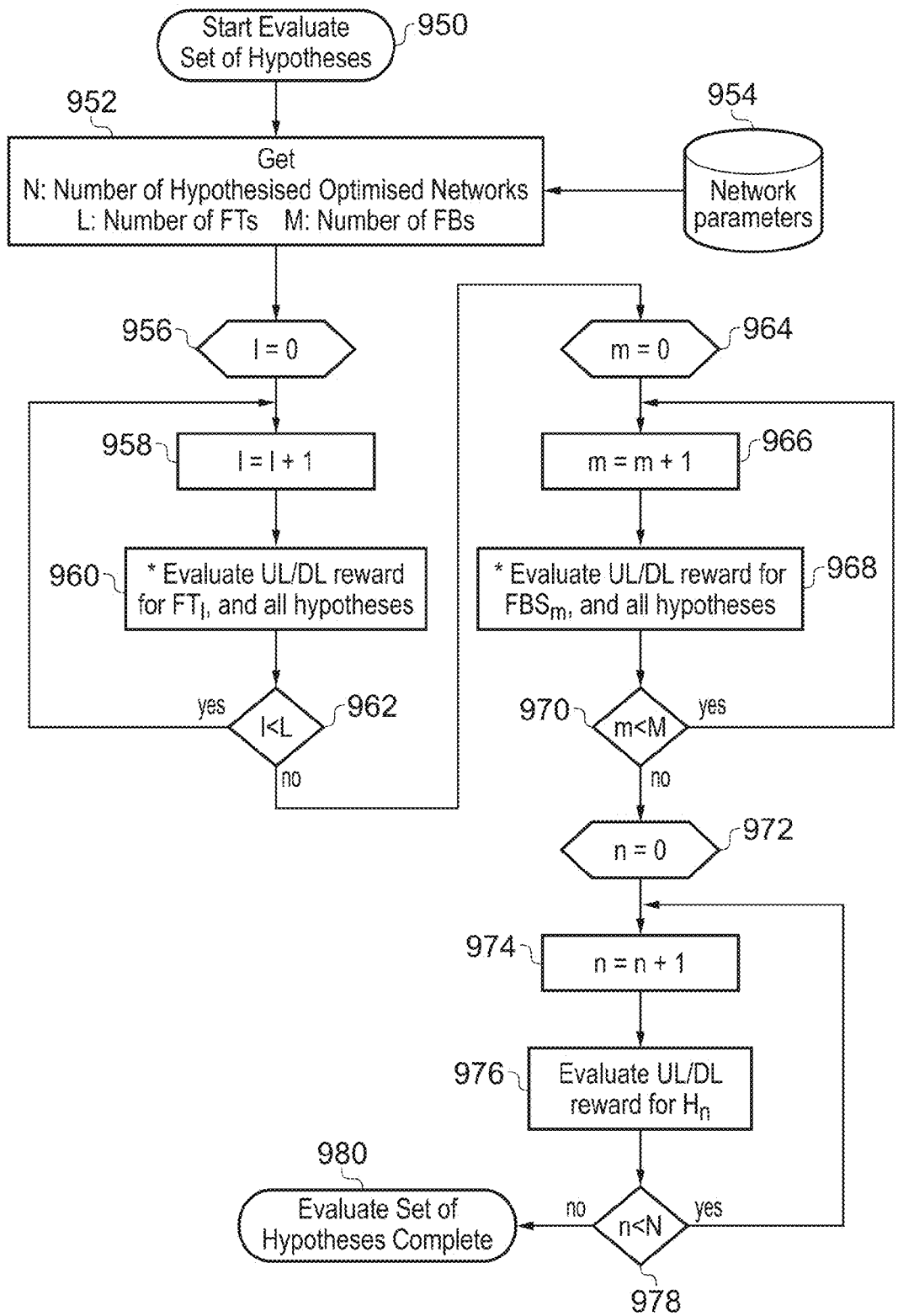
FIG. 33 is a flow diagram illustrating the process performed at step 820 of FIG. 29 in accordance with one embodiment.

FIG. 33 is a flow diagram illustrating how the above evaluation process is performed in one embodiment. At step 950, the evaluation process begins, whereafter at step 952 the number of hypothesised optimised networks, the number of FTs and the number of FBs are obtained from the network parameters database 954.

At step 956, the variable I is set equal to 0, whereafter at step 958 I is incremented. Then, at step 960 the uplink and downlink reward for feeder terminal I is evaluated across all hypotheses. This process is performed in parallel, due to the discrete nature of the different hypotheses. Thereafter, at step 962, it is determined whether the variable I is less than the number of FTs, and if so the process returns to step 958. However, when it is determined at step 962 that the variable I is no longer less than the number of FTs, then at this point the uplink and downlink rewards for all feeder terminals across all hypotheses is complete, and the process proceeds to step 964. Steps 964, 966, 968 and 970 perform the same process as steps 956, 958, 960, 962, but in respect of each FB rather than each FT. Again, step 968 can be performed in parallel for all hypotheses. Once it is determined at step 970 that all FBs have been considered, then the process proceeds to step 972.

At step 972 a variable n is set equal to 0 and then at step 974 n is incremented. Thereafter, at step 976 the various uplink and downlink rewards for hypothesis n are evaluated in order to produce a reward value for the hypothesis. At step 978, it is determined whether all hypotheses have been considered, and if not the process returns to step 974. However, once it is determined at step 978 that all hypotheses have been considered, then the process proceeds to step 980 where the evaluation process is considered complete.

Select Hypothesis

The selection performed at step 825 of FIG. 29 is done in a random fashion, selecting the hypotheses with high rewards more often. As a consequence, hypotheses with low rewards will eventually be discarded and those with high values will proceed to the next stage. If N denotes the number of (input) hypotheses that enter the selection process, then N will also be the number of (output) hypotheses that will be generated by the selection process. It should be clear that some output hypotheses will be in duplicate.

Figure 34:
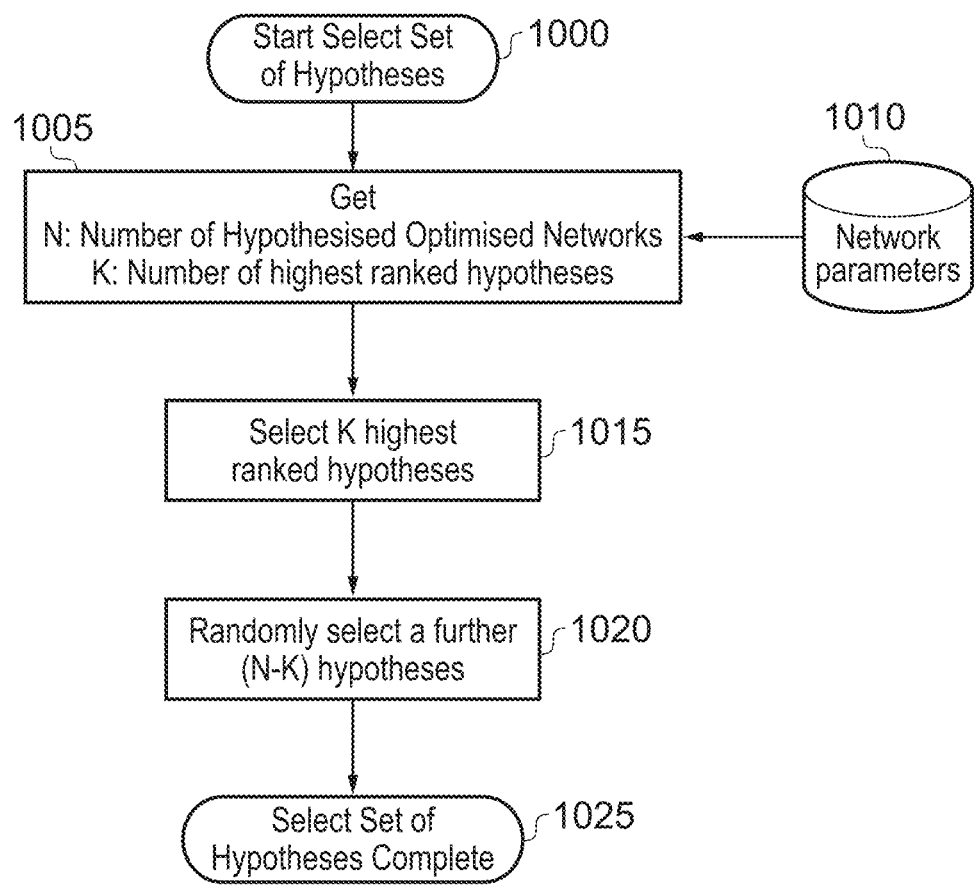
FIG. 34 is a flow diagram illustrating the process performed at step 825 of FIG. 29 in accordance with one embodiment.

FIG. 34 illustrates the steps performed in one embodiment in order to select a modified set of hypotheses. At step 1000, the process begins, whereafter at step 1005 the number of hypothesised optimised networks N is obtained, and then the number of highest ranked hypotheses K is determined with reference to the results of the evaluation process described with reference to FIG. 33, this information being stored as network parameters 1010. At step 1015, the K highest ranked hypotheses are selected, whereafter at step 1020 a further N-K hypotheses are selected randomly. Thereafter, at step 1025, the selection process is considered complete, and the resultant modified set of hypotheses are output. In practice, the value K is typically equal to one or two. The selection of the K highest ranked hypotheses guarantees the survival of the best solution.

Generate a New Set of Hypotheses

After the modified set of hypotheses has been produced by step 825 of FIG. 29, a replacement set of hypotheses is created by the reproduction step 835 of FIG. 29. If N denotes the number of (input) hypotheses that enter this process, then N will also be the number of new (output) hypotheses that will be generated. This phase contains the following four operations, described for example in the publication Weise T., "Global Optimization Algorithms, Theory and Application", available at it-weise.de/projects/book(dot)pdf.

Creation: One or more hypotheses are generated with random attributes.

Duplication: One or more input hypotheses with the highest score are copied without any modifications.

Mutation: A minor attribute of an input hypothesis is randomly modified to generate a new hypothesis. The selected input hypotheses for this stage are selected in a random fashion.

Recombination (or Crossover): Attributes from pairs of input hypotheses are randomly swapped to create pairs of new hypotheses. The selected input hypotheses for this stage are selected by random.

In one embodiment, a fifth new operation is also added:

Reincarnation: Reinstate one or more optimised networks (stored in a database). For example, reinstate an optimised network that was applied 24 h and/or 7 days ago. The assumption here is that traffic demand is cyclostationary.

Let $N_C$, $N_D$, $N_M$, $N_R$, and $N_I$, denote the number of creations, duplications, mutations, recombinations and reincarnations, respectively. It will be clear that $N=N_C+N_D+N_M+N_R N_I$. In one example embodiment, $N_C$ is typically set to 1; random starting points are generally a good idea to avoid local minima during optimisation. $N_D$ is typically set to 2 ensuring the survival of the fittest. The number of recombination $N_R$ is by design an even number and usually does not exceed the number of mutations $N_M$. During a mutation or a recombination one or more attributes of the hypotheses are modified. This is carried out by modifying or appending one of the following:

1. FT to FB association;
2. Antenna bearing;
3. TX antenna pattern.

Figure 35:
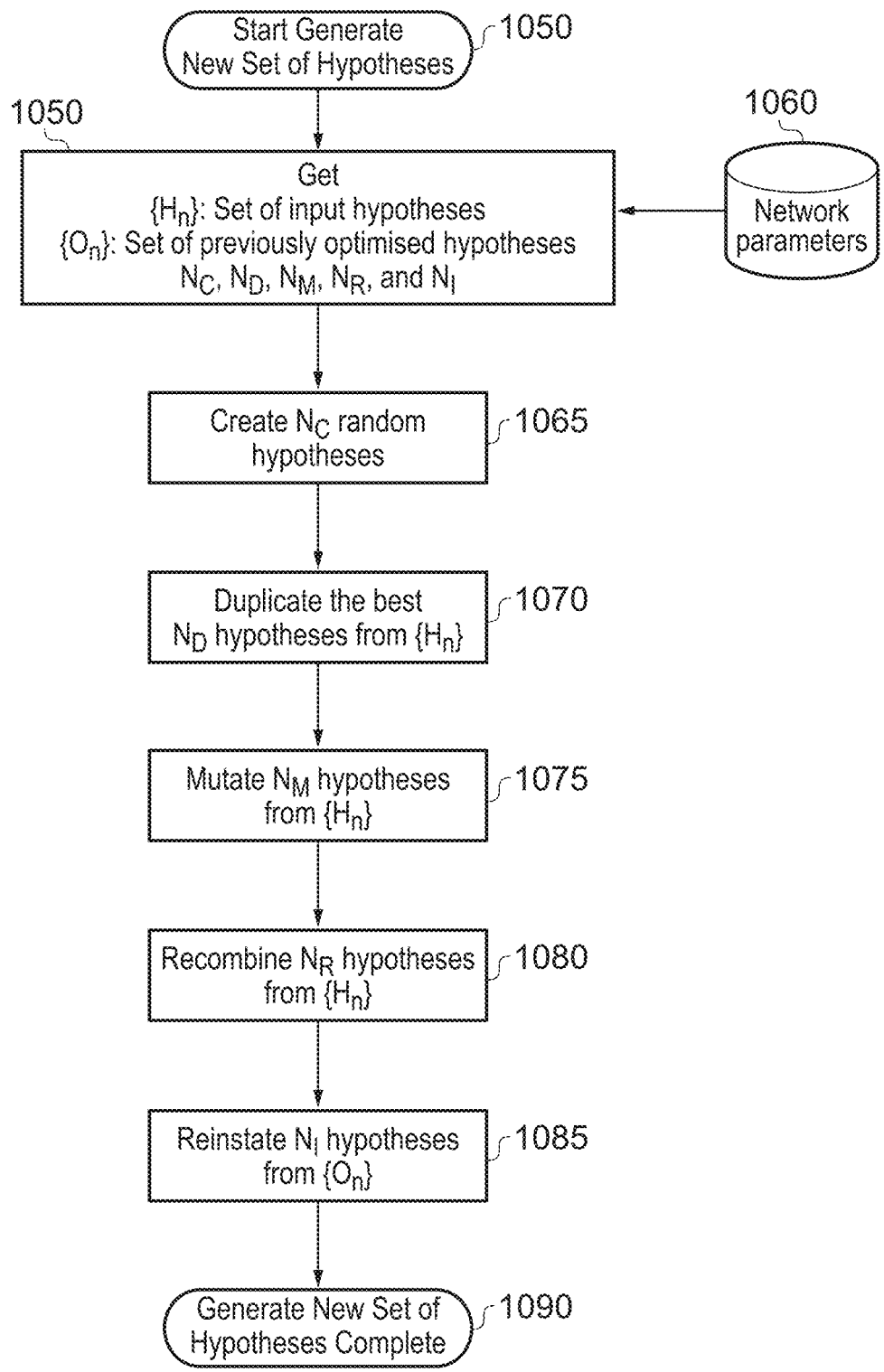
FIG. 35 is a flow diagram illustrating the process performed at step 835 of FIG. 29 in accordance with one embodiment.

FIG. 35 illustrates the steps for generating a new set of hypotheses. At step 1050, the generation step begins, whereafter at step 1055 the set of input hypotheses are obtained from the network parameters 1060 along with a set of previously optimised hypotheses, for example hypotheses that are considered to provide particularly good solutions having regard to a particular time of day, day of the week, etc. The variables $N_C$, $N_D$, $N_M$, $N_R$, and $N_I$ are also obtained, these values typically having been set in advance. Thereafter, at step 1065, $N_C$ random hypotheses are created, and at step 1070 the best $N_D$ hypotheses from the set of input hypotheses are duplicated. At step 1075, $N_M$ hypotheses from the set of input hypotheses are mutated, with the hypotheses selected for this process typically being random. At step 1080, $N_R$ hypotheses from the set of input hypotheses are subjected to the recombination process. Again, the hypotheses chosen for this process are typically random, other than the requirement for an even number of hypotheses to be chosen. At step 1085, $N_I$ hypotheses are reinstated from the set of previously optimised hypotheses, whereafter the generation process is considered complete at step 1090.

It will be appreciated that the various parameters $N_C$, $N_D$, $N_M$, $N_R$, and $N_I$ can be varied if desired. For example, whilst at some times of the day it may be appropriate to reinstate a hypothesis from a set of previously optimised hypotheses at step 1085, there may be other times of day when this is not appropriate, and accordingly it would be appropriate to set the variable $N_I$ to 0 and to adjust the other variables accordingly.

Apply Preferred Optimised Network

This procedure (step 830 of FIG. 29) is responsible for selecting the optimised network and disseminating the information to the various nodes of the network. Specifically, the BSON searches through the current set of hypotheses and selects the one yielding the highest score. The selected hypothesis will thus be the next optimised network to be applied to the network. The BSON is also responsible for communicating the optimised network to the FBs and FTs. In order to minimise the amount of information sent to each node in the network, the BSON will communicate portions of the optimised network pertinent to each FB and associated FTs.

Figure 36:
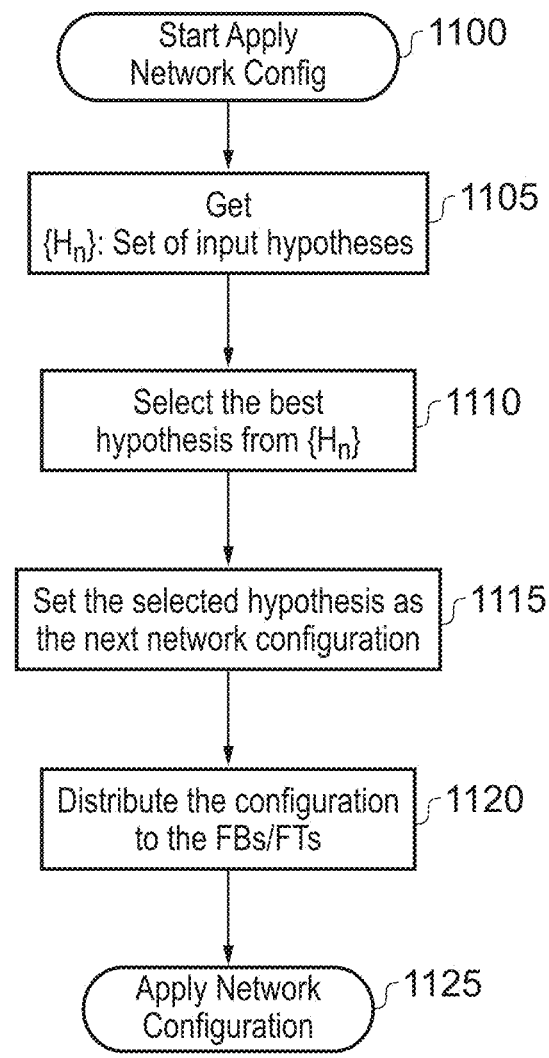
FIG. 36 is a flow diagram illustrating the process performed at step 830 of FIG. 29 in accordance with one embodiment.

FIG. 36 is a flow diagram illustrating the above process. At step 1100, the process starts, whereafter at step 1105 the set of input hypotheses is obtained. At step 1110, the best hypothesis from the set, based on its current reward value, is selected, and then at step 1115 the selected hypothesis is set as the next optimised network. Thereafter, at step 1120, the optimised network is distributed to the FBs and FTs, whereafter the process is considered completed at step 1125.

By way of brief overall summary a method and corresponding apparatus are provided for network configuration selection in a wireless network comprising a plurality of nodes. A subset of nodes of the plurality of nodes are configured to simultaneously participate in a sounding process, in which a node of the subset omni-directionally transmits a predetermined signal and in which other nodes of the subset of nodes sample the predetermined signal as received by an omni-directional antenna array of that node. Measurement reports are received from the subset of nodes, each measurement report comprising a signal source angle and a received signal strength. A path loss is determined in dependence on each measurement report to generate a set of path losses covering a plurality of transmitter node receiver node pairs. Then a directional configuration is selected for a directional antenna of each node of the subset of nodes to use in data transmission in dependence on the set of path losses.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. A method of network configuration selection in a wireless network comprising a plurality of nodes, the method comprising the steps of:
    configuring a subset of nodes of the plurality of nodes to simultaneously participate in a sounding process, in which a node of the subset omni-directionally transmits a predetermined signal and in which other nodes of the subset of nodes sample the predetermined signal as received by an omni-directional antenna array of that node;
    receiving measurement reports from the subset of nodes, wherein each measurement report comprises a signal source angle and a received signal strength;
    determining a path loss in dependence on each measurement report to generate a set of path losses covering a plurality of transmitter node receiver node pairs; and
    selecting a directional configuration for a directional antenna of each node of the subset of nodes to use in data transmission in dependence on the set of path losses.

2. The method as claimed in claim 1, wherein the sounding process is a multiple step sounding process, wherein at each step of the multiple step sounding process only one node of the subset of nodes transmits the predetermined signal.

3. The method as claimed in claim 1, wherein in the sounding process the predetermined signal transmitted by each node of the subset of nodes is unique to that node and the subset of nodes transmit their unique predetermined signals concurrently.

4. The method as claimed in claim 1, wherein the directional antenna is configured to be rotationally positioned, and the directional configuration comprises a rotational position for the directional antenna.

5. The method as claimed in claim 1, further comprising selecting at least one transmitter node receiver node pair to use in data transmission in dependence on the set of path losses.

6. The method as claimed in claim 1, wherein the directional configuration comprises a beam pattern for the directional antenna.

7. The method as claimed in claim 1, further comprising calculating a predicted received signal strength at a receiver node when using a first beam pattern for the directional antenna of a transmitter node and a second beam pattern for the directional antenna of the receiver node,
    and selecting the directional configuration for the directional antenna of each node of the subset of nodes to use in data transmission is performed in further dependence the predicted received signal strength.

8. The method as claimed in claim 1, wherein generating the set of path losses generates an estimated path loss between all pairs of nodes in the subset of nodes.

9. The method as claimed in claim 1, wherein determining the path loss is performed in dependence on a transmission power and antenna gain of the transmitting node and a reception antenna gain of the receiving node.

10. The method as claimed in claim 1, wherein configuring the subset of nodes to simultaneously participate in the sounding process comprises defining a trigger type for initiation of the sounding process.

11. The method as claimed in claim 10, wherein the trigger type is arrival of a predetermined start time.

12. Apparatus for configuration selection in a wireless network comprising a plurality of nodes, the apparatus comprising:

transmission circuitry to transmit a sounding configuration to a subset of nodes of the plurality of nodes to cause the subset to simultaneously participate in a sounding process, in which a node of the subset omni-directionally transmits a predetermined signal and in which other nodes of the subset of nodes sample the predetermined signal as received by an omnidirectional antenna array of that node; reception circuitry to receive measurement reports from the subset of nodes, wherein each measurement report comprises a signal source angle and a received signal strength;

calculation circuitry to calculate an path loss in dependence on each measurement report to generate a set of path losses covering a plurality of transmitter node receiver node pairs; and selection circuitry to select a directional configuration for a directional antenna of each node of the subset of nodes to use in data transmission in dependence on the set of path losses.

13. Apparatus for configuration selection in a wireless network comprising a plurality of nodes, the apparatus comprising:

sounding schedule generation circuitry arranged to transmit a sounding configuration to a subset of nodes of the plurality of nodes to cause the subset to simultaneously participate in a sounding process, in which a node of the subset omni-directionally transmits a predetermined signal and in which other nodes of the subset of nodes sample the predetermined signal as received by an omni-directional antenna array of that node;

backhaul self-organising network engine circuitry arranged to receive measurement reports from the subset of nodes, wherein each measurement report comprises a signal source angle and a received signal strength;

the backhaul self-organising network engine circuitry further arranged to calculate a path loss in dependence on each measurement report to generate a set of path losses covering a plurality of transmitter node receiver node pairs; and the backhaul self-organising network engine circuitry further arranged to select; a directional configuration for a directional antenna of each node of the subset of nodes to use in data transmission in dependence on the set of path losses.

* * * * *